(12) United States Patent
Kosaka et al.

(10) Patent No.: US 6,207,268 B1
(45) Date of Patent: Mar. 27, 2001

(54) TRANSFER SHEET, AND PATTERN-FORMING METHOD

(75) Inventors: Yozo Kosaka; Katsuhiko Mizuno; Takeshi Nakamura; Kounosuke Tanaka; Toshihiko Takeda, all of Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 0 days.

(21) Appl. No.: 08/967,122

(22) Filed: Nov. 12, 1997

(30) Foreign Application Priority Data

| Nov. 12, 1996 | (JP) | 8-300412 |
| Nov. 15, 1996 | (JP) | 8-304723 |
| Nov. 18, 1996 | (JP) | 8-306557 |
| Dec. 18, 1996 | (JP) | 8-337971 |
| Dec. 20, 1996 | (JP) | 8-341333 |
| Jan. 31, 1997 | (JP) | 9-018587 |
| Feb. 17, 1997 | (JP) | 9-031737 |

(51) Int. Cl.$^7$ ................................................ B32B 18/00
(52) U.S. Cl. ........................ 428/325; 428/195; 428/206; 428/210; 428/913; 428/914
(58) Field of Search .................. 428/210, 402, 428/195, 913, 206, 914, 201, 212, 220, 323, 325, 327; 156/154, 235; 347/217, 172

(56) References Cited

U.S. PATENT DOCUMENTS

| 4,105,483 | * | 8/1978 | Lin | 156/154 |
| 5,665,472 | * | 9/1997 | Tanaka et al. | 428/402 |
| 5,712,673 | * | 1/1998 | Hayashi et al. | 347/217 |
| 5,909,083 | * | 6/1999 | Asano et al. | 313/584 |
| 5,992,320 | * | 11/1999 | Kosaka et al. | 101/401.1 |

* cited by examiner

Primary Examiner—Bruce H. Hess
Assistant Examiner—B. Shewareged
(74) Attorney, Agent, or Firm—Dellett and Walters

(57) ABSTRACT

A transfer sheet and a pattern-forming method suitable for forming high-precision patterns for layers such as electrode layers, dielectric layers and barrier layers in the process of producing plasma display panels, image display devices, thermal heads, integrated circuits, etc., and capable of forming patterns having superior surface smoothness, a uniform thickness and high profile precision in a reduced period of time and in high yields. The transfer sheet has an ink layer over a base film. The ink layer consists essentially of an inorganic component containing at least a glass frit, and a thermoplastic resin. The ink layer contains from 3 parts to 50 parts by weight of the thermoplastic resin with respect to 100 parts by weight of the inorganic component. According to the pattern-forming method, a pattern is transferred onto a substrate by using the transfer sheet, and then firing is carried out, thereby forming a high-precision pattern, e.g. an electrode layer, a dielectric layer, a barrier layer, etc.

10 Claims, 14 Drawing Sheets

TRANSFER SHEET, AND PATTERN-FORMING METHOD

BACKGROUND OF THE INVENTION

The present invention relates to a transfer sheet suitable for forming high-precision patterns for layers such as electrode layers, dielectric layers and barrier layers in plasma display panels (hereinafter referred to as "PDPs"), field emission displays (FEDs), liquid crystal display devices (LCDs), vacuum fluorescent displays, hybrid integrated circuits, etc. The present invention also relates to a pattern-forming method using the transfer sheet.

As well known so far in the art, patterns of the type described above are formed by coating an ink for conductors or insulators in the form of a desired pattern on a substrate, e.g. a glass or ceramic substrate, by screen printing, and then carrying out firing, thereby forming a thick pattern in close contact with the substrate. According to this method, for instance, fine lines having a line width of 100 micrometers and a height of 100 micrometers are formed by repeating superposition printing a plurality of times.

However, the method of forming a pattern by repeating screen printing a multiplicity of times has several problems.

First, expansion and contraction of the screen used for printing are unavoidable, and various patterns are superimposed one upon another in most of the actual printing processes for forming patterns. Therefore, misalignment between patterns is likely to occur.

Second, because a screen is used as a printing plate, pattern distortion is likely to occur, and it is difficult to form micro patterns.

Third, wiping is necessary for each printing because of the migration of the pattern-forming material to the back of the screen plate; therefore, automation is difficult.

Fourth, a pattern size achievable by screen printing is at most about 100 micrometers for width, and pattern shape is about 0.5 as expressed by a half width-to-bottom width ratio (the half width is the width of a pattern-forming layer at a position half the height thereof). For a barrier layer in a PDP which should be coated to an as-dried thickness of from about 150 micrometers to about 200 micrometers, for instance, it is necessary to increase its bottom area, and hence it is impossible to form any fine pattern.

Fifth, for a multilayer pattern, layers are stacked one upon another while alignment is carried out per layer because it cannot be formed in one operation. In this regard, there is a problem that it is difficult to improve alignment accuracy.

Sixth, it is impossible to form a thick pattern having a high aspect ratio because the ink tails due to its fluidity. Furthermore, it is difficult to effect condition controls for preventing contamination with foreign matters or the like because operations must be carried out in an open system, and a great deal of time is needed for pattern fabrication in the present state of art.

There is also known a so-called sand blasting technique wherein a pattern-forming layer is solid coated on a substrate by repeating screen printing a multiplicity of times, then forming a sand blasting mask on the pattern-forming layer by using a photosensitive resist, and finally jetting an abrasive to perform patterning of the pattern-forming layer ("Electronic Materials", 1983, No. 1, p. 138). The use of this subtractive processing method enables a barrier layer to be formed into a desired shape in which the wall surface steeply rises vertically, and the barrier layer is narrow in width and high in height. Adoption of the photolithography technique for patterning of the resist enables the pattern accuracy to increase and also permits the panel size to increase.

Recently, a barrier layer forming method that uses a transfer sheet having a glass paste provided on a base film has been proposed [Japanese Patent Application Unexamined Publication (KOKAI) No. 8-273536]. This method uses a transfer sheet provided with a glass paste layer and is advantageous in that the process of producing barriers for a PDP panel can be simplified. However, it has been found that in the proposed method a volatile substance in a barrier-forming layer is removed after a resist pattern has been formed on the top surface of the transferred barrier-forming layer as the second step in the process; therefore, the resist pattern is likely to separate owing to bleeding of the volatile substance, and this may cause a problem in the shape of the thick pattern formed.

A first object of the present invention is to provide a transfer sheet suitable for forming micro patterns for electrodes, resisters, barriers, etc. in image display devices such as PDPs and liquid crystal displays, thermal heads, integrated circuits, and so forth.

A second object of the present invention is to provide a pattern-forming method of forming a pattern having superior surface smoothness, a uniform thickness and high profile precision in a reduced period of time and in high yields.

A third object of the present invention is to improve the conventional thick pattern-forming method using the sand blasting technique and to provide a thick pattern-forming method capable of forming a thick pattern in a desired shape with high accuracy.

A fourth object of the present invention is to provide a thick pattern-forming method capable of forming a thick pattern without separation or cracking of a thick pattern-forming layer when the transfer sheet is bent or taken up.

A fifth object of the present invention is to provide a pattern-forming method suitable for transfer-forming a PDP constituent layer, particularly an electrode-forming layer, in a predetermined pattern shape on a PDP glass substrate.

A sixth object of the present invention is to provide a pattern-forming method which enables a PDP constituent layer, particularly an electrode-forming layer, to be formed in a pattern shape on a PDP glass substrate at low costs and in high yields in a reduced period of time, and which also makes it possible to form a laminated structure having superior surface smoothness, a uniform thickness and high profile precision.

A seventh object of the present invention is to provide a pattern-forming method capable of forming a dielectric layer over a substrate, including a raised electrode pattern, without a transfer failure in the fabrication of a PDP or a multilayer electrode panel, and thus providing high yields.

SUMMARY OF THE INVENTION

A first transfer sheet according to the present invention is a transfer sheet having an ink layer provided over a base film. The ink layer consists essentially of an inorganic component containing at least a glass frit, and a thermoplastic resin. The transfer sheet is characterized in that the ink layer contains from 3 parts to 50 parts by weight of the thermoplastic resin with respect to 100 parts by weight of the inorganic component.

The first transfer sheet is further characterized in that a protective film is releasably stacked over the ink layer.

The first transfer sheet is further characterized in that the base film and the ink layer are stacked with a release layer interposed therebetween.

The first transfer sheet is further characterized in that the ink layer and the protective film are stacked with an adhesive layer interposed therebetween, and the protective film is releasable.

The first transfer sheet is further characterized in that a heat-resistant layer is provided on a side of the base film that is reverse to the side where the ink layer is provided.

The first transfer sheet according to the present invention is further characterized by being a transfer sheet for forming one of a primer layer and a dielectric layer of a plasma display panel.

The first transfer sheet according to the present invention is suitable for producing a primer layer, a dielectric layer, etc. of a PDP and capable of being bent and taken up without separation or cracking of the ink layer. Moreover, the first transfer sheet enables the production time to be shortened and permits the yield to be improved. Because pattern formation is effected by transfer, patterns formed by the first transfer sheet have superior surface smoothness, a uniform thickness and high profile precision.

A second transfer sheet according to the present invention is a transfer sheet having an ink layer provided over a base film. The ink layer consists essentially of inorganic particles containing at least a glass frit, and a resin that is removed afterward by firing. The second transfer sheet is characterized in that the ink layer contains from 2 parts to 70 parts by weight of the resin with respect to 100 parts by weight of the inorganic particles, and that the inorganic particles contain inorganic particles having a particle diameter greater than the as-dried thickness of the ink layer in the proportion of not more than 30% by weight of all the inorganic particles.

The second transfer sheet according to the present invention is further characterized by being a transfer sheet for fabricating a plasma display panel.

The second transfer sheet according to the present invention is suitable for producing a primer layer, a dielectric layer, an electrode layer, etc. of a PDP. The ink layer of the second transfer sheet has a smooth surface and enables transfer without trapping air bubbles or the like. Therefore, the transfer sheet involves no transfer failure or other similar problem and provides superior transferability. In addition, the production time can be shortened, and the yield can be improved. Because the surface of a PDP constituent layer formed by transfer corresponds to the surface of the base film, the resulting layer has superior surface smoothness, a uniform thickness and high profile precision.

A third transfer sheet according to the present invention is characterized in that an ink layer is provided over a base film with a pattern-wise release layer interposed therebetween, and that the ink layer consists essentially of an inorganic component containing at least a glass frit, and a resinous component that is removed afterward by firing.

According to another aspect of the present invention, the third transfer sheet is characterized in that an ink layer consisting essentially of an inorganic component containing at least a glass frit and a resinous component that is removed afterward by firing is provided over a base film, and a pattern-wise adhesive layer is provided on the ink layer.

According to another aspect of the present invention, the third transfer sheet is characterized in that an ink layer consisting essentially of an inorganic component containing at least a glass frit and a resinous component that is removed afterward by firing is provided over a base film with a pattern-wise release layer interposed therebetween, and an adhesive layer is provided on the ink layer in the same pattern as that of the release layer.

The pattern in the third transfer sheet may be a primer-forming layer pattern, a dielectric layer-forming layer pattern, an electrode-forming layer pattern, or a barrier-forming layer pattern in a plasma display panel.

The third transfer sheet according to the present invention is suitable for transfer-forming a primer-forming layer, a dielectric layer-forming layer, an electrode-forming layer, or a barrier-forming layer in a pattern shape on a PDP glass substrate, for example. The third transfer sheet makes it possible to shorten the production time and to improve the yield. Moreover, because the surface of a PDP constituent layer formed by transfer corresponds to the surface of the base film, the resulting layer has superior surface smoothness, a uniform thickness and high profile precision.

A fourth transfer sheet according to the present invention is characterized by having a base film, a dielectric layer-forming layer stacked over the base film, and a pattern-wise electrode-forming layer stacked over the dielectric layer-forming layer. The dielectric layer-forming layer and the pattern-wise electrode-forming layer each consist essentially of an inorganic component containing at least a glass frit, and a resinous component that is removed afterward by firing.

A fifth transfer sheet according to the present invention is characterized by having a base film, a pattern-wise electrode-forming layer stacked over the base film, and a primer-forming layer stacked over the pattern-wise electrode-forming layer. The pattern-wise electrode-forming layer and the primer-forming layer each consist essentially of an inorganic component containing at least a glass frit, and a resinous component that is removed afterward by firing.

A sixth transfer sheet according to the present invention is characterized by having a base film, a barrier-forming layer stacked over the base film, and a dielectric layer-forming layer stacked over the barrier-forming layer. The barrier-forming layer and the dielectric layer-forming layer each consist essentially of an inorganic component containing at least a glass frit, and a resinous component that is removed afterward by firing.

A seventh transfer sheet according to the present invention is characterized by having a base film, a dielectric layer-forming layer stacked over the base film, a pattern-wise electrode-forming layer stacked over the dielectric layer-forming layer, and a primer-forming layer stacked over the pattern-wise electrode-forming layer. The dielectric layer-forming layer, the pattern-wise electrode-forming layer and the primer-forming layer each consist essentially of an inorganic component containing at least a glass frit, and a resinous component that is removed afterward by firing.

An eighth transfer sheet according to the present invention is characterized by having a base film, a barrier-forming layer stacked over the base film, a dielectric layer-forming layer stacked over the barrier-forming layer, and a pattern-wise electrode-forming layer stacked over the dielectric layer-forming layer. The barrier-forming layer, the dielectric layer-forming layer and the pattern-wise electrode-forming layer each consist essentially of an inorganic component containing at least a glass frit, and a resinous component that is removed afterward by firing.

A ninth transfer sheet according to the present invention is characterized by having a base film, a barrier-forming layer stacked over the base film, a dielectric layer-forming layer stacked over the barrier-forming layer, a pattern-wise electrode-forming layer stacked over the dielectric layer-forming layer, and a primer-forming layer stacked over the pattern-wise electrode-forming layer. The barrier-forming layer, the dielectric layer-forming layer and the pattern-wise electrode-forming layer and the primer-forming layer each consist essentially of an inorganic component containing at least a glass frit, and a resinous component that is removed afterward by firing.

A tenth transfer sheet according to the present invention is characterized by having a base film, an anti-sand blasting photosensitive layer stacked over the base film, a barrier-forming layer stacked over the anti-sand blasting photosensitive layer, a dielectric layer-forming layer stacked over the barrier-forming layer, and a pattern-wise electrode-forming layer stacked over the dielectric layer-forming layer. The barrier-forming layer, the dielectric layer-forming layer and the pattern-wise electrode-forming layer each consist essentially of an inorganic component containing at least a glass frit, and a resinous component that is removed afterward by firing.

An eleventh transfer sheet according to the present invention is characterized by having a base film, a mask layer for sand blasting stacked over the base film, a barrier-forming layer stacked over the mask layer, a dielectric layer-forming layer stacked over the barrier-forming layer, and a pattern-wise electrode-forming layer stacked over the dielectric layer-forming layer. The barrier-forming layer, the dielectric layer-forming layer and the pattern-wise electrode-forming layer each consist essentially of an inorganic component containing at least a glass frit, and a resinous component that is removed afterward by firing.

A twelfth transfer sheet according to the present invention is characterized by having a base film, an anti-sand blasting photosensitive layer stacked over the base film, a barrier-forming layer stacked over the anti-sand blasting photosensitive layer, a dielectric layer-forming layer stacked over the barrier-forming layer, a pattern-wise electrode-forming layer stacked over the dielectric layer-forming layer, and a primer-forming layer stacked over the pattern-wise electrode-forming layer. The barrier-forming layer, the dielectric layer-forming layer, the pattern-wise electrode-forming layer and the primer-forming layer each consist essentially of an inorganic component containing at least a glass frit, and a resinous component that is removed afterward by firing.

A thirteenth transfer sheet according to the present invention is characterized by having a base film, a mask layer for sand blasting stacked over the base film, a barrier-forming layer stacked over the mask layer, a dielectric layer-forming layer stacked over the barrier-forming layer, a pattern-wise electrode-forming layer stacked over the dielectric layer-forming layer, and a primer-forming layer stacked over the pattern-wise electrode-forming layer. The barrier-forming layer, the dielectric layer-forming layer, the pattern-wise electrode-forming layer and the primer-forming layer each consist essentially of an inorganic component containing at least a glass frit, and a resinous component that is removed afterward by firing.

The fourth to thirteenth transfer sheets according to the present invention are suitable for use in a system which forms a primer layer, a pattern-wise electrode layer, a dielectric layer and a barrier layer of a PDP by using transfer sheets prepared separately, and enable these layers to be formed at low costs in a reduced period of time. Moreover, the yield can be improved. Because the layers are formed by transfer, it is possible to obtain a PDP member having layers formed thereon, each having superior surface smoothness, a uniform thickness and high profile precision.

A first pattern-forming method according to the present invention includes:

(a) the first step of preparing a transfer sheet having a thick pattern-forming layer provided over a base film, the thick pattern-forming layer consisting essentially of an inorganic component containing at least a glass frit, a thermoplastic resin, and a high-boiling solvent having a boiling point of from 150° C. to 400° C.; transferring the thick pattern-forming layer onto a substrate; and removing the base film from the thick pattern-forming layer transferred onto the substrate;

(b) the second step of removing the high-boiling solvent from the transferred thick pattern-forming layer by volatilization;

(c) the third step of forming a resist pattern on the thick pattern-forming layer having the high-boiling solvent removed therefrom by volatilization;

(d) the fourth step of removing the thick pattern-forming layer from an opening in the resist pattern by sand blasting;

(e) the fifth step of removing the resist pattern from the thick pattern-forming layer; and (f) the sixth step of sintering the thick pattern-forming layer by firing.

The first pattern-forming method is further characterized in that the thick pattern-forming layer provided over the base film contains from 3 parts to 30 parts by weight of the thermoplastic resin and from 2 parts to 30 parts by weight of the high-boiling solvent with respect to 100 parts by weight of the inorganic component.

The first pattern-forming method is further characterized in that the thick pattern is one of a barrier-forming layer and an electrode-forming layer in a plasma display panel.

The transfer sheet used in the first pattern-forming method according to the present invention is excellent in the retention of the thick pattern-forming layer and exhibits superior handleability and shelf stability in the state of being taken up. Moreover, the transfer sheet is excellent in transferability to a glass substrate. In addition, when the transfer sheet is slit to an appropriate shape, the inorganic component will not become dust. Thus, it is possible to form a thick pattern having superior surface smoothness, a uniform thickness and high profile precision. Further, because no volatile substance remains in the barrier-forming layer during resist working process, it is possible to avoid adverse effect of a volatile substance on the resist pattern, and separation of the resist pattern will not occur. Accordingly, a thick pattern can be formed in high yields.

A second pattern-forming method according to the present invention is characterized by preparing a transfer sheet having an ink layer provided over a base film, the ink layer containing at least an inorganic component and a hot-melt organic substance; laminating the transfer sheet at the ink layer side thereof onto a plasma display panel member; and heating the transfer sheet with a thermal head or applying laser light to the transfer sheet from the back thereof in the same pattern as that of a plasma display panel constituent layer, thereby transferring the ink layer in the heated region onto the plasma display panel member.

The second pattern-forming method is further characterized in that the pattern of the plasma display panel constituent layer is an electrode pattern.

The second pattern-forming method according to the present invention is suitable for forming a thick pattern on a substrate, particularly suitable for forming an electrode-forming layer requiring high-definition patterning. Because a thick pattern is formed by using a transfer sheet, the production time can be shortened, and the yield can be improved. Moreover, it is possible to form a thick pattern having superior surface smoothness, a uniform thickness and high profile precision.

A third pattern-forming method according to the present invention is a method of forming an ink layer on a raised pattern, which is characterized by preparing a transfer sheet having an ink layer provided over a base film, the ink layer consisting essentially of inorganic particles containing at least a glass frit and a resin that is removed afterward by firing, and laminating the transfer sheet at the ink layer side thereof onto a substrate having a stripe-shaped raised pattern in a direction parallel to the lengthwise direction of the stripes of the raised pattern, thereby transferring the ink layer onto the substrate.

The third pattern-forming method is further characterized in that the raised pattern is an electrode pattern in a plasma display panel, and that the ink layer is an ink layer for forming a dielectric layer, and the ink layer is transferred onto a substrate having the electrode pattern.

The third pattern-forming method is further characterized in that the substrate is a glass substrate having an electrode pattern on a primer layer provided thereon, and that the ink layer is transferred onto the primer layer having the electrode pattern.

The third pattern-forming method according to the present invention enables a dielectric layer to be formed over the substrate, including the raised electrode pattern, without a transfer failure, and makes it possible to improve the yield and to shorten the production time. Moreover, because the surface of the dielectric layer formed by transfer corresponds to the surface of the base film, the dielectric layer has superior surface smoothness, a uniform thickness and high profile precision.

DESCRIPTION OF THE PREFERRED EMBODIMENTS

Micro patterns, e.g. electrode, dielectric and barrier patterns, to which the transfer sheets and pattern-forming methods according to the present invention are applied will be described below with regard to PDP fabrication by way of example.

Figure 31:
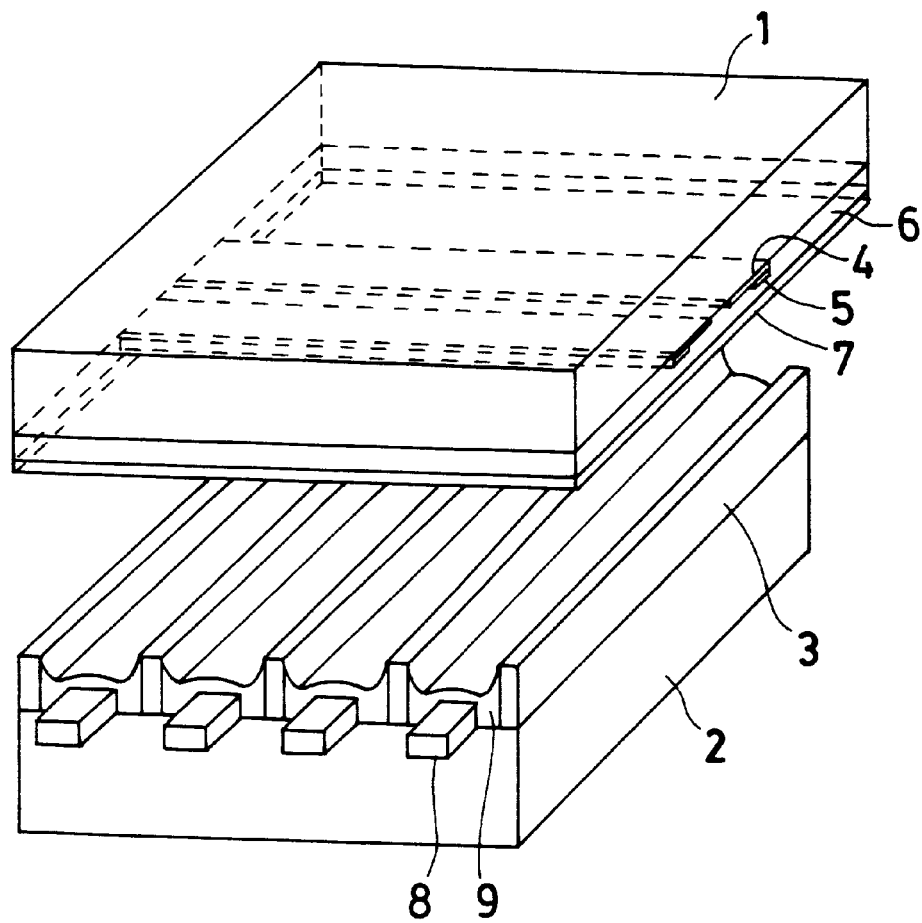
FIG. 31 is a diagram illustrating an AC type plasma display panel.

As shown for example in FIG. 31, an AC type PDP comprises two glass substrates 1 and 2 disposed parallel with and in opposition to each other. The two substrates are held at a constant spacing by cell barriers 3 provided on the glass substrate or back plate 2 in parallel relation to each other. On the back side of the glass substrate or front plate 1 there are located parallel composite electrodes, each formed of a transparent electrode 4 that is a sustained discharge electrode and a metal electrode 5 that is a bus electrode. The composite electrodes are covered with a dielectric layer 6, which is in turn covered with a protective (MgO) layer. On the front side of the glass substrate or back plate 2 there are located parallel address electrodes 8. The address electrodes 8 are positioned between the cell barriers 3 so as to perpendicularly intersect the composite electrodes.

The sides and bottoms of the cell barriers 3 are covered with a fluorescent surface 9.

Figure 32:
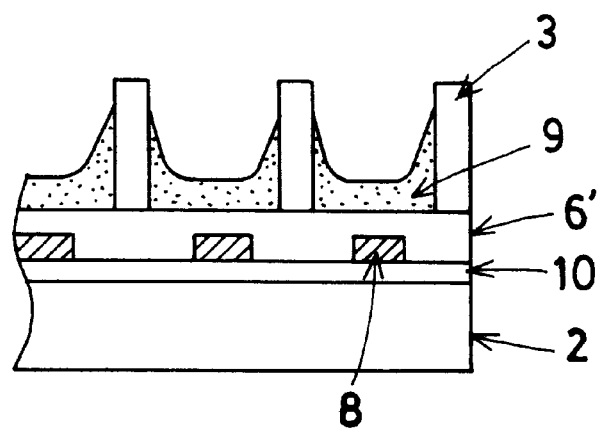
FIG. 32 is a diagram Illustrating another example of an AC type plasma display panel.

Alternatively, a primer layer 10 may be formed, as shown in FIG. 32, on a glass substrate or back plate 2 so that address electrodes 8, a dielectric layer 6', cell barriers 3 and a fluorescent surface 9 are successively stacked over the glass substrate or back plate 2 through the primer layer 10.

This AC type PDP has a surface discharge structure wherein an AC voltage is applied across the composite electrodes on the front plate to cause discharge by an electric field leaking out in the spaces. In this case, the direction of the electric field changes depending on frequency because the AC voltage is applied to the electrodes. Ultraviolet rays resulting from this discharge allow the fluorescent surface 9 to emit light, so that the observer can view the light passing through the front plate.

It should be noted that a DC type PDP is different from the AC type PDP in that electrodes are not covered with a dielectric layer, but is similar thereto in terms of the resulting discharge phenomenon.

A first transfer sheet according to the present invention will be described in detail with reference to FIGS. 1 to 5.

FIGS. 1 to 5 are sectional views of a first transfer sheet according to the present invention. In the figures, reference numeral 11 denotes a base film, 12 an ink layer, 13 a protective film, 14 a release layer, 15 an adhesive layer, and 16 a heat-resistant layer.

Figure 1:
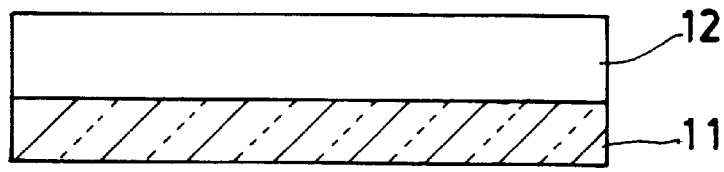
FIG. 1 is a sectional view illustrating a first transfer sheet according to the present invention.

The first transfer sheet according to the present invention will be described with reference to FIG. 1. It should be noted that the transfer sheet according to the present invention may be in a roll form as well as a flat sheet form as shown in FIG. 1.

The base film 11 should neither be attacked by a solvent in the ink layer 12 nor be contracted or elongated by heat treatments in the process. To this end, it is preferable to use films or sheets of polymer materials such as polyethylene terephthalate, 1,4-polycyclohexylene-dimethylene terephthalate, polyethylene naphthalate, polyphenylene sulfide, polystyrene, polypropylene, polysulfone, Aramid, polycarbonate, polyvinyl alcohol, cellophane, cellulose derivatives represented by cellulose acetate, polyethylene, polyvinyl chloride, nylon, polyimide, and ionomer; sheets of metals such as aluminum, and copper; sheets of alloys such as Invar alloys (36Ni—Fe alloy, and 42Ni—Fe alloy); and ceramic sheets of glass and inorganic materials; and composite sheets obtained from these sheets. In particular, it is preferable to use a multilayer sheet consisting essentially of a polymer film and a ceramic sheet or a metal sheet having high heat distortion resistance as a composite sheet because it is possible to obtain a flexible sheet that has high mechanical strength and high heat distortion resistance. The base film 11 may be subjected to a treatment for changing the wettability of the surface thereof by silicone treatment, melamine treatment, corona treatment, etc. The base film 11 has a thickness of 4 micrometers to 400 micrometers, preferably 4.5 micrometers to 200 micrometers.

The ink layer 12, when used as a dielectric layer such as a primer- or dielectric-forming layer in a PDP, consists essentially of an inorganic component containing at least a glass frit, and a resinous component that is removed afterward by firing.

The glass frit used herein should preferably have a softening point of 350° C. to 650° C. and a coefficient of thermal expansion, $\alpha_{300}$, of $60\times10^{-7}/°C$. to $100\times10^{-7}/°C$. A softening point exceeding 650° C. is undesirable because firing would have to be carried out at elevated temperatures at which thermal deformation may occur depending on the kind of object onto which the ink layer 12 is laminated. A softening point not higher than 350° C. is also undesirable because the glass frit would be fused together before the decomposition and volatilization of the resin, resulting in voids or other defects in the layer. Any deviation of the coefficient of thermal expansion from the range of $60\times10^{-7}/°C$. to $100\times10^{-7}/°C$. is not preferable because there would be a large difference in the coefficient of thermal expansion between the ink layer and the glass substrate, resulting in distortion or other defects.

In addition to the glass frit, the inorganic component may contain a mixture of two or more inorganic powders and a mixture of two or more inorganic pigments.

The inorganic powder is an aggregate that is added according to need. The inorganic powder is added to the inorganic component for the purpose of preventing casting and improving denseness upon firing, and has a softening point higher than that of the glass frit. For instance, it is possible to use inorganic powders such as aluminum oxide, boron oxide, silica, titanium oxide, magnesium oxide, calcium oxide, strontium oxide, barium oxide, and calcium carbonate powders, which have an average particle diameter of 0.1 micrometer to 20 micrometers. The inorganic powder is preferably used in the proportion of from 0 to 30 parts by weight with respect to 100 parts by weight of the glass frit.

The inorganic pigment is added to the inorganic component according to need for the purpose of preventing reflection of extraneous light and improving practical contrast. For a dark color, it is preferable to use refractory dark pigments such as Co—Cr—Fe, Co—Mn—fe, Co—Fe—Mn—Al, bCo—Ni—Cr—Fe, Co—Ni—Mn—Cr—Fe, Co—Ni—Al—Cr—Fe, and Co—Mn—Al—Cr—Fe—Si. For a refractory white pigment it is preferable to use titanium oxide, aluminum oxide, silica, calcium carbonate or the like. The inorganic pigment is preferably used in the proportion of from 0 to 30 parts by weight with respect to 100 parts by weight of the glass frit.

The thermoplastic resin is a component that is removed by firing during the fabrication of a PDP or a multilayer electrode panel, and should be volatilized and decomposed upon firing, leaving no carbide in the pattern. The thermoplastic resin is added to the ink layer as a binder for the inorganic component and for the purpose of improving the transferability of the ink layer. Examples of the thermoplastic resin used herein are polymers or copolymers comprising at least one of methyl acrylate, methyl methacrylate, ethyl acrylate, ethyl methacrylate, n-propyl acrylate, n-propyl methacrylate, isopropyl acrylate, isopropyl methacrylate, n-butyl acrylate, n-butyl methacrylate, isobutyl acrylate, isobutyl methacrylate, tert-butyl acrylate, tert-butyl methacrylate, n-pentyl acrylate, n-pentyl methacrylate, n-hexyl acrylate, n-hexyl methacrylate, 2-ethylhexyl acrylate, 2-ethylhexyl methacrylate, n-octyl acrylate, n-octyl methacrylate, n-decyl acrylate, n-decyl methacrylate, 2-hydroxyethyl acrylate, 2-hydroxyethyl methacrylate, 2-hydroxypropyl acrylate, 2-hydroxypropyl methacrylate, styrene, α-methylstyrene, and N-vinyl-2-pyrrolidone, and cellulose derivatives, e.g. ethyl cellulose.

The thermoplastic resin is used in the proportion of from 3 parts to 50 parts by weight, preferably from 5 parts to 30 parts by weight, with respect to 100 parts by weight of the inorganic component. If the proportion of the thermoplastic resin in the ink layer is less than 3 parts by weight, the retention of the ink layer becomes unfavorably low, giving rise to problems, particularly in terms of the handleability and shelf stability of the transfer sheet in the state of being taken up. Moreover, when the transfer sheet is slit to an appropriate shape, the inorganic component will become dust, causing hindrance to the fabrication of a PDP. If the proportion of the thermoplastic resin exceeds 50 parts by weight, carbon will undesirably remain in the film after firing, causing the quality to be degraded.

If required, a plasticizer, a dispersant, a suspending agent, a defoaming agent, a release agent, a leveling agent, etc. may be added to the ink layer 12.

The plasticizer is added for the purpose of improving the transferability and fluidity of the ink. Examples of the plasticizer include n-alkyl phthalates such as dimethyl phthalate, dibutyl phthalate, and di-n-octyl phthalate; phthalic acid esters such as di-2-ethylhexyl phthalate, diisodecyl phthalate, butylbenzyl phthalate, diisononyl phthalate, ethyl phthal ethyl glycolate, and butyl phthalyl butyl glycolate; trimellitic acid esters such as tri-2-ethylhexyl trimellitate, tri-n-alkyl trimellitate, triisononyl trimellitate, and triisodecyl trimellitate; aliphatic dibasic acid esters such as dimethyl adipate, dibutyl adipate, di-2-ethylhexyl adipate, diisodecyl adipate, dibutyl diglycol adipate, di-2-ethylhexyl azelate, dimethyl sebacate, dibutyl sebacate, di-2-ethylhexyl sebacate, di-2-ethylhexyl maleate, acetyl-tri-(2-ethyl-hexyl)citrate, acetyl-tri-n-butyl citrate, and acetyl tributyl citrate; glycol derivatives such as polyethylene glycol benzoate, triethylene glycol-di-(2-ethylhexoate), and polyglycol ether; glycerin derivatives such as glycerol triacetate, and glycerol diacetyl monolaurate; polyesters comprising sebatic acid, adipic acid, azelaic acid, and phthalic acid; low-molecular-weight polyethers having a molecular weight of 300 to 3,000; low-molecular-weight poly-$\alpha$-styrenes having the same molecular weight as mentioned above; low-molecular-weight polystyrenes having the same molecular weight as mentioned above; orthophosphates such as trimethyl phosphate, triethyl phosphate, tributyl phosphate, tri-2-ethylhexyl phosphate, tributoxyethyl phosphate, triphenyl phosphate, tricresyl phosphate, trixylenyl phosphate, cresyl diphenyl phosphate, xylenyl diphenyl phosphate, and 2-ethylhexyl diphenyl phosphate; ricinoleic acid esters such as methyl acetyl ricinoleate; polyester epoxidized esters such as poly-1,3-butanediol adipate, and epoxidized soybean oil; and acetic acid esters such as glycerin triacetate, and 2-ethylhexyl acetate.

The dispersant and suspending agent are used for the purpose of improving the dispersibility and suspending property of the inorganic component. Examples of these agents include phosphoric ester base agents, silicone base agents, castor oil ester base agents, and various surfactants. Examples of the defoaming agent used herein include silicone base agents, acryl base agents, and various surfactants. Examples of the release agent used herein include silicone base agents, fluorinated oil base agents, paraffin base agents, fatty acid base agents, fatty ester base agents, castor oil base agents, wax base agents, and compound base agents. Examples of the leveling agent used herein include fluorine base agents, silicone base agents, and various surfactants. These agents are each added in an appropriate amount.

The above-described materials may be dissolved or dispersed in methanol, ethanol, isopropanol, acetone, methyl ethyl ketone, toluene, xylene, anones such as cyclohexanone, methylene chloride, 3-methoxybutyl acetate, ethylene glycol monoalkyl ethers, ethylene glycol alkyl ether acetates, diethylene glycol monoalkyl ethers, diethylene glycol monoalkyl ether acetates, propylene glycol monoalkyl ethers, propylene glycol monoalkyl ether acetates, dipropylene glycol monoalkyl ethers, dipropylene glycol monoalkyl ether acetates, terpenes such as $\alpha$- or $\beta$-terpineol, and N-methyl-2-pyrrolidone. The resulting solution is coated on the base film by die coating, blade coating, comma coating, roll coating, gravure reverse coating, gravure direct coating, slit reverse coating, etc., and then dried with a predetermined thickness.

Figure 2:
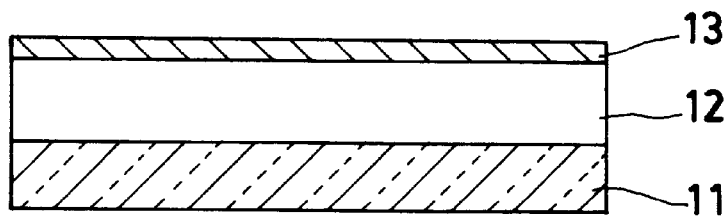
FIG. 2 is a sectional view illustrating another embodiment of the first transfer sheet according to the present invention.

Another embodiment of the first transfer sheet according to the present invention has, as shown in FIG. 2, a protective film 13 stacked on the ink layer 12 according to need.

The protective film 13 is stuck onto the surface of the ink layer 12 according to need for the purpose of preventing damage to the ink layer surface and preventing dust from getting mixed in the ink layer 12 and further preventing blocking. Examples of films usable as the protective film 13 include films or polymer materials such as polyethylene terephthalate, 1,4-polycyclohexylenedimethylene terephthalate, polyethylene naphthalate, polyphenylene sulfide, polystyrene, polypropylene, polysulfone, Aramid, polycarbonate, polyvinyl alcohol, cellophane, cellulose derivatives represented by cellulose acetate, polyethylene, polyvinyl chloride, nylon, polyimide, and monomer. The lamination surface of the protective film 13, which is to be laminated, has previously been treated to be releasable by silicone treatment, acryl melamine treatment, wax treatment, etc. The protective film 13 has a thickness of 1 micrometer to 400 micrometers, preferably 4.5 micrometers to 200 micrometers.

Figure 3:
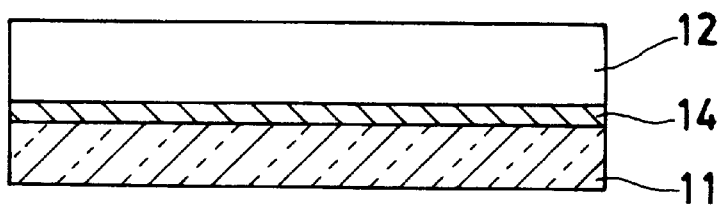
FIG. 3 is a sectional view illustrating another embodiment of the first transfer sheet according to the present invention.

Another embodiment of the first transfer sheet according to the present invention has, as shown in FIG. 3, a release layer 14 provided between the base film 11 and the ink layer 12 according to need.

The release layer 14 is provided according to need for the purpose of improving the transferability of the ink layer 12 upon transfer. Examples of release agents usable as the release layer 14 include waxes such as polyethylene wax, amide wax, Teflon powder, silicone wax, carnauba wax, acryl wax, and paraffin wax, fluorocarbon resins, melamine resins, polyolefin resins, ionizing radiation-curable type polyfunctional acrylate resins, polyester resins, epoxy resins, catalyst-, light- and heat-curable silicone oils modified with amino, epoxy, OH, and COOH, and silicone resins such as polydimethyl silicone rubber, phenyl-modified silicone rubber, epoxy-modified silicone rubber, and urethane-modified silicone rubber.

Figure 4:
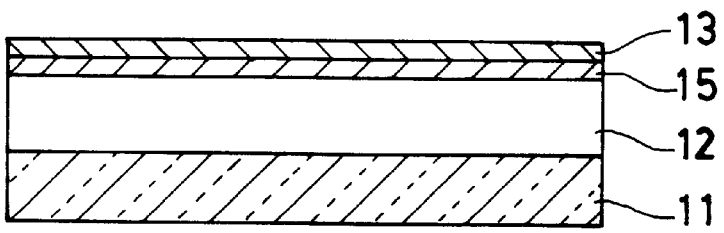
FIG. 4 is a sectional view illustrating another embodiment of the first transfer sheet according to the present invention.

Another embodiment of the first transfer sheet according to the present invention has, as shown in FIG. 4, a protective film 13 releasably stacked over the ink layer 12 with an adhesive layer 15 interposed therebetween.

The adhesive layer 15 is provided according to need for the purpose of improving the transferability of the ink layer 12 onto an object to which it is to be transferred. The adhesive layer 15 may be formed by coating a solution containing an organic component, e.g. a thermoplastic resin that forms the ink layer 12. Alternatively, the adhesive layer 15 may be a pressure-sensitive adhesive layer.

Figure 5:
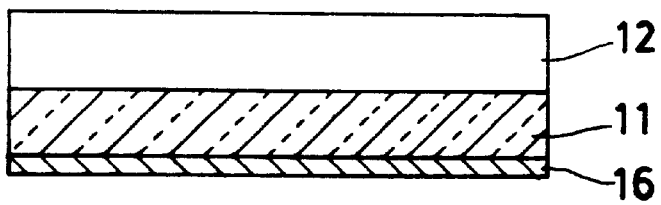
FIG. 5 is a sectional view illustrating another embodiment of the first transfer sheet according to the present invention.

Another embodiment of the first transfer sheet according to the present invention has, as shown in FIG. 5, a heat-resistant layer 16 provided, according to need, on a side of the base film 11 that is reverse to the side where the ink layer 12 is provided.

The heat-resistant layer 16 is provided according to need for the purpose of imparting heat-resistant lubricating properties to the transfer sheet, which are required upon thermal transfer. This embodiment is suitable for a transfer process using a thermal head, for example. The heat-resistant layer 16 consists essentially of one or more of such substances as silicone resins, epoxy resins, melamine resins, phenol resins, fluorocarbon resins, polyimide resins, and hydroxy cellulose. If necessary, the heat-resistant layer 16 may be thermoset by using isocyanate.

It should be noted that, although not illustrated, the heat-resistant layer 16 may also be provided in the transfer sheets shown in FIGS. 2 to 4, and that the first transfer sheet according to the present invention may be constructed by combining together all the layers shown in FIGS. 1 to 5.

The first transfer sheet according to the present invention enables the ink layer thereof to be transferred by a heated roll, laser light, a thermal head, or a hot press in the process of laminating a layer structure of a PDP, for example. The transferred ink layer is fired at a temperature of 350° C. to 650° C. to gasify, decompose and volatilize the organic component in the ink layer, thereby enabling the inorganic powder to be bonded together densely by the fused glass frit.

Next, a second transfer sheet according to the present invention will be described.

Figure 6:
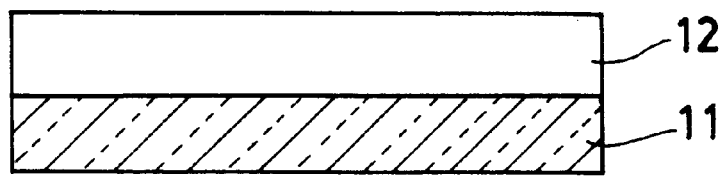
FIG. 6 is a sectional view illustrating a second transfer sheet according to the present invention.

FIG. 6 is a sectional view of a second transfer sheet according to the present invention. In the figure, reference numeral 11 denotes a base film, and 12 an ink layer.

First, the second transfer sheet will be described with regard to a case where the ink layer 12 is a primer-forming layer or a dielectric layer-forming layer in a PDP, for example.

The base film 11 is similar to that of the first transfer sheet. The ink layer 12 consists essentially of inorganic particles containing at least a glass frit, and a resin that is removed afterward by firing. Examples of the glass frit and the inorganic particles are similar to those in the first transfer sheet.

The resin is removed by firing upon fabrication of a PDP or a multilayer electrode panel. A thermoplastic resin, a curable resin, etc. may be used as the resin that is removed afterward by firing. Examples of the thermoplastic resin are similar to those in the first transfer sheet.

It is possible to use curable resins which are decomposed and removed upon firing after being set, i.e. known ionizing radiation-curable resins and thermosetting resins. For the ionizing radiation-curable resins, ultraviolet or electron beam-curable resins may be used. More specifically, it is possible to use compositions obtained by mixing together prepolymers, oligomers and/monomers having a polymerizable unsaturated bond or an epoxy group in their molecule. Examples of prepolymers and oligomers used herein include condensates of unsaturated dicarboxylic acids and polyhydric alcohols, epoxy resins, methacrylates such as polyester methacrylate, polyether methacrylate, and polyol methacrylate, and acrylates such as polyester acrylate, polyether acrylate, and polyol acrylate.

Monomers used herein include compounds having at least one polymerizable carbon-carbon unsaturated bond. Examples of such compounds are acrylates such as allyl acrylate, benzyl acrylate, butoxyethyl acrylate, butoxyethylene glycol acrylate, cyclohexyl acrylate, dicyclopentanyl acrylate, dicyclopentenyl acrylate, 2-ethylhexyl acrylate, glycerol acrylate, glycidyl acrylate, 2-hydroxyethyl acrylate, 2-hydroxypropyl acrylate, isobornyl acrylate, isodecyl acrylate, isooctyl acrylate, lauryl acrylate, 2-methoxyethyl acrylate, methoxyethylene glycol acrylate, phenoxyethyl acrylate, stearyl acrylate, ethylene glycol diacrylate, diethylene glycol diacrylate, 1,4-butanediol diacrylate, 1,5-pentanediol diacrylate, 1,6-hexanediol diacrylate, 1,3-propanediol diacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, polyoxyethylated trimethylolpropane triacrylate, pentaerythritol triacrylate, pentaerythritol tetraacrylate, triethylene glycol diacrylate, polyoxypropyltrimethylolpropane triacrylate, butylene glycol diacrylate, 1,2,4-butanetriol triacrylate, 2,2,4-trimethyl-1,3-pentanediol diacrylate, diallyl fumarate, 1,10-decanedioldimethyl diacrylate, and dipentaerythritol hexaacrylate; methacrylate analogues of the above-mentioned acrylates; γ-methacryloxypropyl trimethoxysilane; and 1-vinyl-2-pyrrolidone. These monomers may be used along or in combination of two or more.

In particular, for the ultraviolet curable resins, the above-mentioned compositions may be used in combination with photo-initiators such as photo-reducible dyes, e.g. benzophenone, methyl o-benzoyl benzoate, 4,4-bis (dimethyl-amino)benzophenone, 4,4-bis(diethylamino) benzophenone, α-aminoacetophenone, 4,4-dichlorophenone, 4-benzoyl-4-methyl diphenyl ketone, dibenzyl ketone, fluorenone, 2,2-diethoxy-acetophenone, 2,2-dimethoxy-2-phenylacetophenone, 2-hydroxy-2-methylpropiophenone, p-tert-butyldichloroacetophenone, thioxanthone, 2-methylthioxanthone, 2-chlorothioxanthone, 2-isopropylthioxanthone, diethylthioxanthone, benzyl dimethyl ketal, benzyl methoxyethyl acetal, benzoin methyl ether, benzoin butyl ether, anthraquinone, 2-tert-butylanthraquinone, 2-amylanthraquinone, β-chloroanthraquinone, anthrone, benzanthrone, dibenzsuberone, methyleneanthrone, 4-azidobenzyl-acetophenone, 2,6-bis(p-azidobenzylidene)-cyclohexane, 2,6-bis(p-azidobenzilidene)-4-methyl-cyclohexanone, 2-phenyl-1,2-butadion-2-(o-methoxy-carbonyl)oxime, 1-phenyl-propanedion-2-(o-ethoxycarbonyl)-oxime, 1,3-diphenyl-propanetrion-2-(o-ethoxycarbonyl)oxime, 1-phenyl-3-ethoxy-propanetrion-2-(o-benzoyl)oxime, Michler's ketone, 2-methyl-[4-(methylthio) phenyl]-2-morpholino-1-propane, 2-benzyl-2-dimethylamino-1-(4-morpholinophenyl)-butane-1, naphthalenesulfonyl chloride, quinolinesulfonyl chloride, n-phenylthioacridone, 4,4-azobisisobutyronitrile, diphenyl disulfide, benzothiazole disulfide, triphenylphosphine, camphorquinone, carbon tetrabromide, tribromophenylsulfone, benzoyl peroxide, eosine,, and methylene blue, and reducing agents, e.g. ascorbic acid, and triethanolamine. These photo-initiators may be used alone or in combination of two or more. In a case where a photo-sensitive resin is used as a curable rein, patterning of an electrode-forming layer or the like can be performed through a mask.

The thermoplastic resin or the curable resin is used in the proportion of from 2 parts to 70 parts by weight, preferably from 5 parts to 50 parts by weight, with respect to 100 parts by weight of the inorganic particles. If the proportion of the resin in the ink layer is less than 2 parts by weight, the retention of the ink layer becomes unfavorably low, giving rise to problems, particularly in terms of the shelf stability and handleability of the transfer sheet in the state of being taken up. If the proportion of the resin exceeds 70 parts by weight, carbon will undesirably remain in the film after firing, causing the quality to be degraded.

If required, a plasticizer, a dispersant, a suspending agent, a defoaming agent, a release agent, a leveling agent, etc. may be added to the ink layer as in the case of the first transfer sheet. The ink layer is formed by coating as in the case of the first transfer sheet.

Next, the second transfer sheet will be described with regard to a case where the ink layer 12 is an electrode-forming layer in a PDP, for example. The electrode-forming layer consists essentially of inorganic particles containing at least a glass frit, a resin that is removed afterward by firing, electrically conductive particles, and a thickening agent, if required.

In a case where the resin that is removed by firing is a thermoplastic resin, it is possible to use inorganic particles similar to the above-described glass frits, inorganic aggregates and inorganic pigments. The inorganic aggregate should preferably be used in the proportion of from 0 to 10 parts by weight with respect to 100 parts by weight of the glass frit. Examples of thermoplastic resins usable for the second transfer sheet are the same as those for the first transfer sheet. The content of the resinous component in the coating solution for forming an electrode-forming layer is in the range of from 2% to 70% by weight, preferably 5% to 50% by weight.

Examples of the electrically conductive particles include spherical particles of a metal such as gold, silver, copper, aluminum, etc. It is preferable to use from 2 parts to 20 parts by weight of a glass frit with respect to 100 parts by weight of electrically conductive particles.

The thickening agent is added for the purpose of increasing the viscosity of the ink. Known thickening agents may be used for this purpose. Examples of thickening agents used herein include hydroxyethyl cellulose, methyl cellulose, carboxymethyl cellulose, soda alginate, casein, soda caseinate, xanthane gum, polyvinyl alcohol, urethane-modified polyether, polacrylic acid ester, polymethacrylic acid ester, montmorillonite, aluminum stearate, zinc stearate, aluminum octylic acid ester, hydrogenated castor oil, castor oil ester, fatty amide, polyethylene oxide, dextrin fatty acid ester, dibenzylidene sorbitol, vegetable oil base polymerized oil, and finely-divided powders of surface treated calcium carbonate, organic bentonite, silica, titania, zirconia, and alumina. The thickening agent content is in the range of from 0.1 part to 20 parts by weight, preferably from 0.1 part to 10 parts by weight, with respect to 100 parts by weight of the electrically conductive particles. If the thickening agent content is less than 0.1 part by weight, no thickening effect is obtained. A thickening agent content exceeding 20 parts by weight produces adverse effects on the characteristics of electrodes, e.g. occurrence of disconnection.

To improve the coatability and other properties of the electrode-forming layer, a plasticizer, a dispersant, a suspending agent, a defoaming agent, a release agent, a leveling agent, etc. may be added to the electrode-forming layer. For these ingredients, substances similar to those mentioned above with respect to the first transfer sheet are usable. The ingredients may be mixed with solvents similar to those in the case of the first transfer sheet and kneaded by a roll mill to form a paste-like coating solution. Alternatively, the mixture is kneaded by a ball mill or the like to form a slurry-like coating solution.

In a case where the resin that is removed by firing is a curable resin, a curable paste for forming an electrode-forming layer consists essentially of inorganic particles containing at least a glass frit, a curable resin, and electrically conductive particles.

As the inorganic particles, it is possible to use glass frits, inorganic aggregates and inorganic pigments as in the case of the first transfer sheet. Examples of curable resins usable for the second transfer sheet are the same as those for the first transfer sheet. The content of the curable resin in the paste for forming an electrode-forming layer is in the range of from 5% to 95% by weight, preferably 10% to 50% by weight. The electrically conductive particles are the same as stated above. The content of the electrically conductive particles in the paste for forming an electrode-forming layer is in the range of from 30% to 95% by weight, preferably from 60% to 95% by weight.

To the coating solution for forming an electrode-forming layer, it is possible to add a plasticizer, a dispersant, a suspending agent, a defoaming agent, a release agent, a leveling agent, etc. according to need as in the case of the first transfer sheet. These ingredients may be mixed with solvents similar to those in the case of the first transfer sheet and kneaded by a roll mill to form a paste-like coating solution. Alternatively, the mixture is kneaded by a ball mill or the like to form a slurry-like coating solution.

Figure 22:
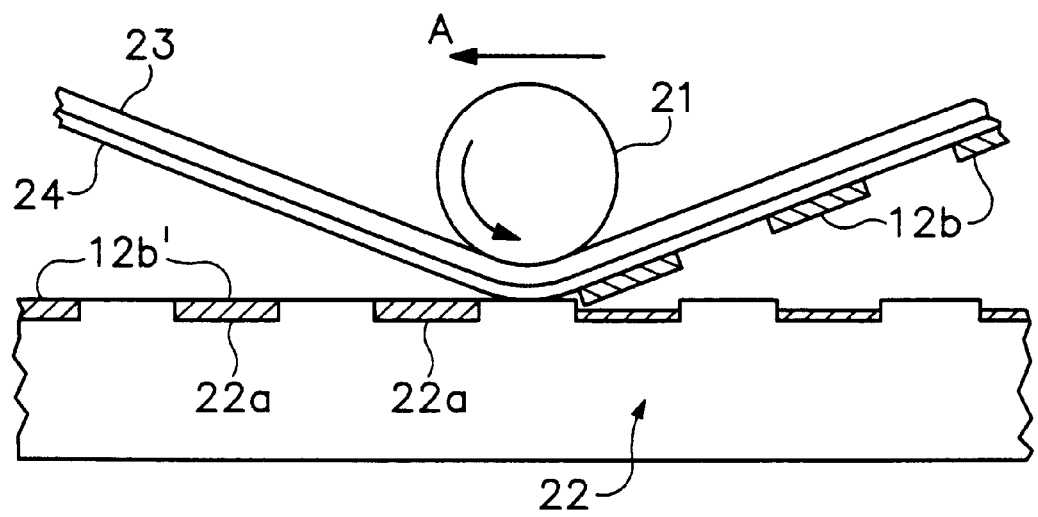
FIG. 22 is a diagram illustrating a method of forming a pattern-wise electrode-forming layer using intaglio printing.
Figure 23:
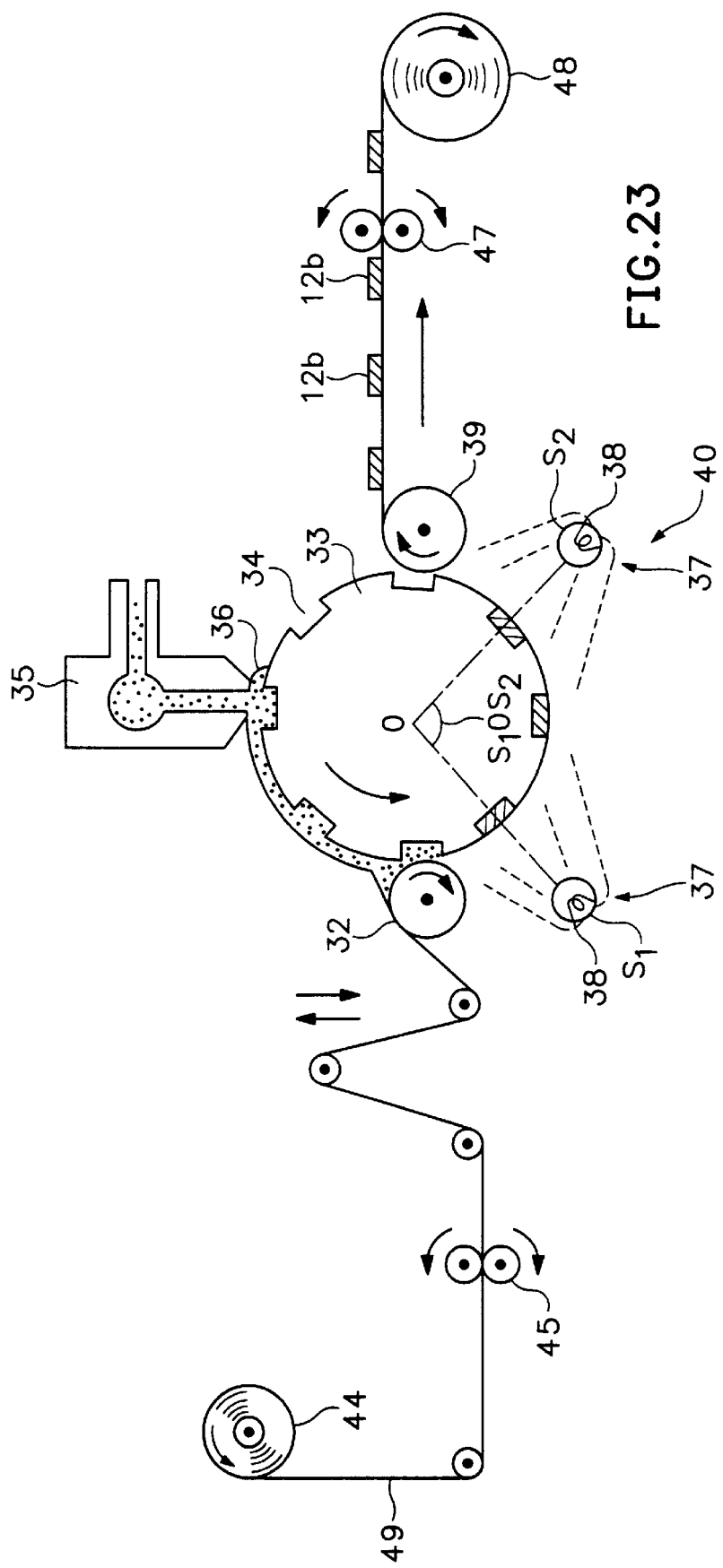
FIG. 23 is a diagram illustrating a method of forming a pattern-wise electrode-forming layer using a roll intaglio.

The coating solution for forming an electrode-forming layer may be coated by an intaglio offset printing method as shown in FIG. 22. Alternatively, the coating solution may be coated by a method using a roll intaglio as shown in FIG. 23. Thus, a pattern-wise electrode-forming layer can be formed on the base film. In the method using a roll intaglio, a photosensitive curable resin should preferably be used as a resin that is removed by firing.

In a case where the resin that is removed by firing is a thermoplastic resin, the coating solution may be solid coated and then patterned by a photolithography method to form an electrode pattern. In a case where the resin that is removed by firing is a photosensitive resin, pattern exposure may be carried out through a mask to form an electrode pattern. It is also possible to transfer a photosensitive resin coating solution solid coated on the base film onto a substrate and then form the electrode-forming layer into an electrode pattern by a photolithography method.

In a case where the ink layer 12 is a primer-forming layer, the as-dried thickness is 10 micrometers to 50 micrometers, preferably 15 micrometers to 30 micrometers. In a case where the ink layer 12 is a dielectric layer-forming layer, the as-dried thickness Is 10 micrometers to 50 micrometers, preferably 15 micrometers to 40 micrometers. In a case where the ink layer 12 is an electrode-forming layer, the as-dried thickness is 3 micrometers to 30 micrometers, preferably 7 micrometers to 25 micrometers.

The second transfer sheet according to the present invention is characterized in that the ink layer component contains inorganic particles, i.e. a glass frit, together with an inorganic aggregate, an inorganic pigment, etc., which are added according to need, and the content of inorganic particles having a particle diameter greater than the desired as-dried thickness of the ink layer 12 is not higher than 30% by weight, preferably 0% by weight, with respect to the whole inorganic particle content.

If the content of inorganic particles having a particle diameter greater than the as-dried thickness of the ink layer 12 exceeds 30% by weight with respect to the whole inorganic particle content, the surface of the transferred layer is undesirably matted, which gives rise to problems. That is, it becomes difficult for the ink layer 12 to transfer, and air bubbles are likely to get mixed in during transfer, resulting in a transfer failure. Therefore, it is preferable to use inorganic particles by selecting a glass frit, an inorganic aggregate and/or an inorganic pigment such that the proportion of particles having a particle diameter greater than the desired as-dried thickness of the ink layer 12 is less than 30% by weight in the particle diameter distribution of each of the inorganic materials. It is also preferable to remove inorganic particles having a particle diameter greater than the desired as-dried thickness by sifting using a mesh sieve or the like.

In the second transfer sheet according to the present invention also, a protective film may be stacked on the ink layer 12, if necessary, as in the case of the first transfer sheet. The protective film may be stacked over the ink layer 12 with an adhesive layer interposed therebetween, if necessary. A release layer may be provided between the ink layer 12 and the base film 11, according to need, for the purpose of improving transferability. Further, a heat-resistant layer may be provided, according to need, on a side of the base film 11 that is reverse to the side where the ink layer 12 is provided.

The second transfer sheet according to the present invention is used to transfer the ink layer 12 onto a PDP substrate by a heated roll, laser light, a thermal head, or a hot press in the process of laminating a layer structure of a PDP. The ink layer 12 has a smooth surface and provides excellent transferability. Moreover, it is possible to prevent air bubbles or other foreign matter from being trapped.

Each ink layer transferred onto the PDP substrate is fired at a temperature of 350° C. to 650° C. to gasify, decompose and volatilize the organic component, e.g. the resin, in the ink layer, thereby enabling the inorganic aggregate to be bonded together densely by the fused glass frit. The surface of the transferred ink layer is also a smooth surface corresponding to the smoothness of the base film.

Figure 7:
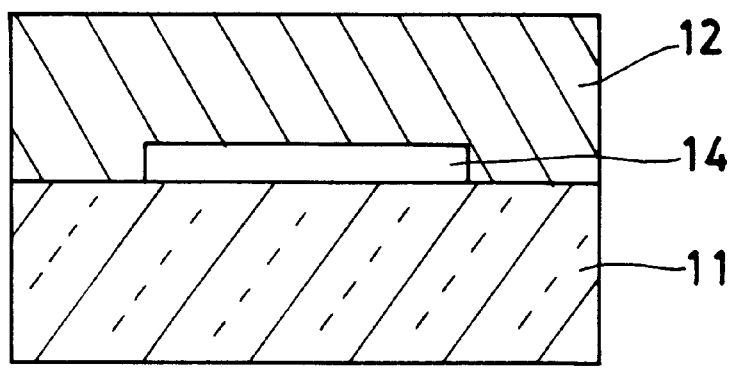
FIG. 7 is a sectional view illustrating a third transfer sheet according to the present invention.

Next, a third transfer sheet according to the present invention will be described with reference to FIGS. 7 to 9, which are sectional views of the third transfer sheet according to the present invention. In the figures, reference numeral 11 denotes a base film, 14 a release layer, 12 an ink layer, and 15 an adhesive layer.

The base film 11 is similar to that of the first transfer sheet. The release layer 14 is provided on the base film 11 in conformity to a primer-forming layer pattern, a dielectric layer-forming layer pattern, an electrode-forming layer pattern, or a barrier-forming layer pattern in a PDP, for example. The ink layer 12 is stacked over the release layer 14. In the third transfer sheet according to the present invention, when thermal laminating is carried out by overlaying the transfer sheet on a PDP substrate, for example, only the ink layer 12 in the portions where the pattern-wise release layer 14 is provided is transferred onto the PDP substrate by making use of the difference in adhesion to the base film 11 between the ink layer 12 in the portions where the pattern-wise release layer 14 is provided and the ink layer 12 in the portions where no release layer 14 is provided.

It is preferable to form the pattern-wise release layer 14 on the base film 11 by offset printing, e.g. intaglio offset printing, roll intaglio, gravure printing, die coating, etc.

Figure 10:
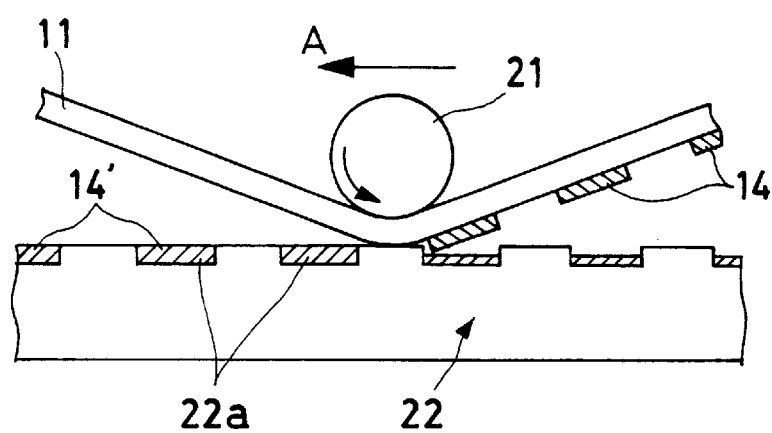
FIG. 10 is a diagram illustrating a method of forming a pattern-wise release layer using intaglio printing.

A method of forming the pattern-wise release layer 14 by intaglio offset printing will be described with reference to FIG. 10. In the figure, reference numeral 21 denotes a back-up roller, 22 an intaglio plate, 22a depressions, and 11 a base film. Although in this method a flat intaglio plate is used, it is also possible to use a flat intaglio offset plate, a letterpress offset plate, or a cylinder-shaped intaglio offset plate. Printing should preferably be carried out as follows: As shown in FIG. 10, the base film 11 is pressed by the back-up roller 21 onto the intaglio plate 22 having depressions 22a formed in the same pattern as the release layer pattern, and the back-up roller 21 is moved in the direction of the arrow A, thereby allowing a release layer-forming material 14' held in the depressions 22a of the intaglio plate 22 to transfer onto the base film 11 to form a pattern-wise release layer 14. The depth (intaglio depth) of the depressions 22a in the intaglio plate 22 should preferably be in the range of from 3 micrometers to 50 micrometers, although it depends on the thickness of the pattern-wise release layer 14.

The release layer-forming material 14' may be the same as that used in the first transfer sheet. Regarding the ink layer 12 provided over the pattern-wise release layer 14, when it is a primer-forming layer, a dielectric layer forming-layer, or a barrier-forming layer, the ink layer 12 consists essentially of an inorganic component containing at least a glass frit, and a thermoplastic resin. The details of the ink layer 12 are the same as those in the first transfer sheet.

If required, a plasticizer, a dispersant, a suspending agent, a defoaming agent, a release agent, a leveling agent, etc. may be added to the ink layer 12. The details of these ingredients are the same as those in the first transfer sheet. The ink layer 12 may be formed over the pattern-wise release layer 14 by coating as in the case of the first transfer sheet.

In a case where the ink layer 12 is an electrode-forming layer, it consists essentially of an inorganic component containing at least a glass frit, a thermoplastic resin, and an electrically conductive powder. For the inorganic component containing at least a glass frit, it is possible to use materials similar to those usable for the electrode-forming layer in the second transfer sheet. A glass frit as used herein should preferably have an average particle diameter in the range of from 0.3 micrometers to 5 micrometers. If an inorganic powder is added, it should preferably be used in the proportion of from 0 to 10 parts by weight with respect to 100 parts by weight of the glass frit.

As the thermoplastic resin, it is possible to use resins similar to those usable for the electrode-forming layer in the second transfer sheet. The content of the thermoplastic resin in the ink layer for forming an electrode layer is in the range of from 3% to 50% by weight, preferably from 5% to 30% by weight.

As the electrically conductive powder, it is possible to use powders similar to those usable for the electrode-forming layer in the second transfer sheet. It is preferable to use a spherical metal powder having an average particle diameter of 0.1 micrometer to 5 micrometers. The glass frit is used in the proportion of from 2 parts to 20 parts by weight with respect to 100 parts by weight of the electrically conductive powder.

To improve the coatability and other properties of the electrode-forming layer, a plasticizer, a dispersant, a suspending agent, a defoaming agent, a release agent, a leveling agent, etc. may be added to the electrode-forming layer. For these ingredients, it is possible to use substances similar to those usable for the electrode-forming layer in the second transfer sheet. The ingredients may be mixed with solvents similar to those in the case of the second transfer sheet and kneaded by a roll mill to form a paste-like coating solution. Alternatively, the mixture is kneaded by a ball mill or the like to form a slurry-like coating solution. The coating solution should preferably be coated and dried by the same method as in the case of the second transfer sheet to form an electrode-forming layer.

Another embodiment of the third transfer sheet according to the present invention will be described with reference to FIG. 8. According to the illustrated embodiment, an ink layer 12 and a pattern-wise adhesive layer 15 are successively provided on a base film 11.

For the base film 11, materials similar to those in the case of the first transfer sheet may be used. In the embodiment of the third transfer sheet according to the present invention, the ink layer 12 is coated directly on the base film 11. The adhesive layer 15 is provided on the ink layer 12 in conformity to the shape of a primer-forming layer pattern, a dielectric layer-forming layer pattern, an electrode-forming layer pattern, or a barrier-forming layer pattern in a PDP, for example. When thermal laminating is carried out by overlaying the transfer sheet on a PDP substrate, for example, only the ink layer 12 in the portions where the pattern-wise adhesive layer 15 is provided is transferred onto the PDP substrate by making use of the difference in adhesion to the PDP substrate between the ink layer 12 in the portions where the pattern-wise adhesive layer 15 is provided and the ink layer 12 in the portions where no adhesive layer 15 is provided.

Figure 11:
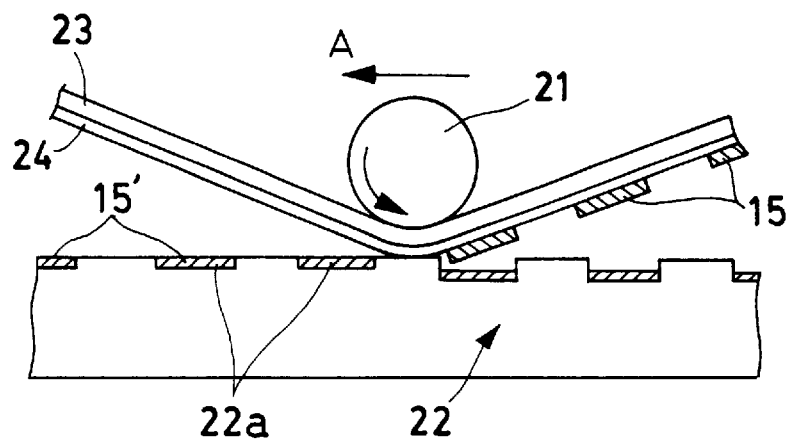
FIG. 11 is a diagram illustrating a method of forming a pattern-wise adhesive layer using intaglio printing.

To provide the pattern-wise adhesive layer 15 on the ink layer 12, it is preferable to first form a pattern-wise adhesive layer on a substrate 23 prepared separately for transfer, as shown in FIG. 11, and then transfer the pattern-wise adhesive layer onto the ink layer 12. It should be noted that the pattern-wise adhesive layer 15 may be provided directly on the ink layer 12. As a method of forming the pattern-wise adhesive layer 15 on the transfer substrate 23 or the ink layer 12, it is preferable to use offset printing, e.g. intaglio offset printing, roll intaglio, gravure printing, die coating, etc.

A method of forming the pattern-wise adhesive layer 15 on the transfer substrate 23 by intaglio offset printing will be described with reference to FIG. 11. In the figure, reference numeral 21 denotes a back-up roller, 22 an intaglio plate, 22a depressions, 23 a transfer substrate, and 24 a release layer.

Examples of the transfer substrate 23 include a resin film having a small coefficient of thermal expansion and contraction, which is similar to the above-described base film, and metal foils of aluminum, iron, etc. The thickness of the transfer substrate 23 is in the range of from 10 micrometers to 500 micrometers, preferably from 10 micrometers to 300 micrometers. The transfer substrate 23 is provided thereon with a release layer 24. The release layer 24 is formed by using polydimethyl silicone rubber, phenyl-modified silicone rubber, epoxy-modified silicone rubber, urethane-modified silicone rubber, etc. with a thickness of 0.1 micrometer to 30 micrometers. The transfer substrate 23 may be treated so as to be releasable by using silicone or the like.

As shown in FIG. 11, a film comprising the transfer substrate 23 having the release layer 24 provided on one side thereof is pressed by the back-up roller 21 onto the intaglio plate 22 from the substrate side, and the back-up roller 21 is moved in the direction of the arrow A, thereby allowing an adhesive layer-forming material 15' held in the depressions 22a of the intaglio plate 22 to transfer onto the transfer substrate 23. The depth (intaglio depth) of the depressions 22a in the intaglio plate 22 corresponds to the thickness of the pattern-wise adhesive layer 15 and should preferably be in the range of from 3 micrometers to 100 micrometers.

As the adhesive layer-forming material 15', it is preferable to use a material formed by dissolving in a solvent a thermoplastic resin as stated above with respect to the first transfer sheet and adding a plasticizer, a leveling agent and a defoaming agent to the resulting solution according to need.

To form the pattern-wise adhesive layer 15 on the ink layer 12, it is preferable to transfer the pattern-wise adhesive layer 15 onto the ink layer 12 by pressing the transfer substrate 23 onto the ink layer 12 using a back-up roller or the like.

Figure 9:
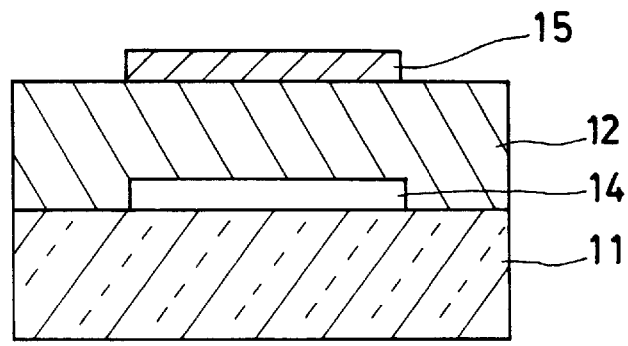
FIG. 9 is a sectional view illustrating another embodiment of the third transfer sheet according to the present invention.

The third transfer sheet according to the present invention may be provided with both a pattern-wise release layer 14 and a pattern-wise adhesive layer 15, as shown in FIG. 9. If the release layer 14 and the adhesive layer 15 have the same pattern and are provided at corresponding positions, the ink layer 12 can be transferred even more surely. The pattern-wise release layer 14 and the pattern-wise adhesive layer 15 are formed by methods similar to those stated above.

In the third transfer sheet, it is preferable to provide a releasable protective film according to need as in the case of the first transfer sheet and to store the transfer sheet in a roll form or a sheet form.

Figure 8:
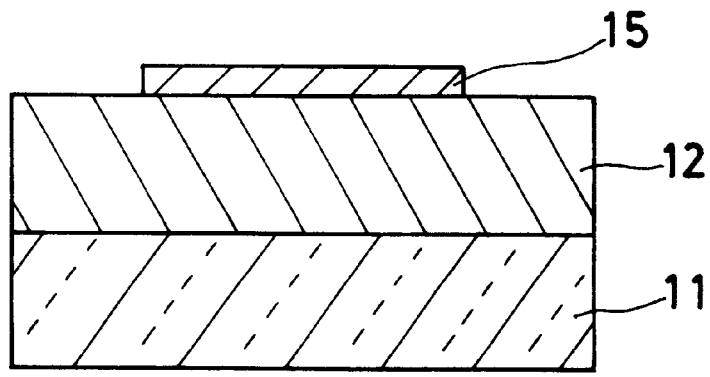
FIG. 8 is a sectional view illustrating another embodiment of the third transfer sheet according to the present invention.

It should be noted that the transfer sheets shown in FIGS. 8 and 9 can also be produced by aligning a film having a pattern-wise adhesive layer formed directly on a protective film and a film having an ink layer provided directly or indirectly through a pattern-wise release layer on a base film such that the adhesive layer and the release layer face each other, and sticking the two films to each other, instead of using the transfer substrate 23.

The third transfer sheet according to the present invention is pressed on a PDP member under heating by using a heated roll, laser light, a thermal head, a hot press or the like after the protective film provided according to need has been removed therefrom, thereby enabling the ink layer to be transferred in a predetermined pattern. Each transferred ink layer is fired at a temperature of 350° C. to 650° C. to gasify, decompose and volatilize the organic component in the ink layer, thereby enabling the inorganic powder to be bonded together densely by the fused glass frit. The third transfer sheet according to the present invention is suitable for transfer-forming a primer-forming layer, a dielectric-forming layer, an electrode-forming layer and a barrier-forming layer on a PDP glass substrate in the form of respective patterns. The third transfer sheet makes it possible to shorten the production time and to improve the yield. Moreover, it is possible to directly form each pattern-wise PDP layer having superior surface smoothness, a uniform thickness and high profile precision.

Next, fourth to thirteenth transfer sheets according to the present invention will be described. The fourth to thirteenth transfer sheets are suitable for PDP fabrication. FIGS. 12 to 21 are sectional views of the fourth to thirteenth transfer sheets, respectively. In the figures, reference numeral 11 denotes a base film, 12a a primer-forming layer, 13 a protective film provided according to need, 12b a pattern-wide electrode-forming layer, 12c a dielectric layer-forming layer, 12d a barrier-forming layer, 17 an anti-sand blasting photosensitive layer, and 18 a mask layer for sand blasting.

The fourth transfer sheet according to the present invention will be described with reference to FIG. 12.

The base film 11 is similar to that in the first transfer sheet. The dielectric layer-forming layer 12c consists essentially of an inorganic component containing at least a glass frit, and a thermoplastic resin. The inorganic component containing a glass frit and the thermoplastic resin are similar to those in the first transfer sheet. To the dielectric layer-forming layer, a plasticizer, a dispersant, a suspending agent, a defoaming agent, a release agent, a leveling agent, etc. may be added, according to need, to form a coating solution as in the case of the first transfer sheet. Thus, a dielectric layer-forming layer is formed by coating.

The pattern-wise electrode-forming layer 12b should preferably be formed by transferring an electrode pattern onto the dielectric layer-forming layer. As a method of forming a transfer film having an electrode pattern, it is preferable to use an intaglio offset printing method or a method using a roll intaglio.

A method of forming a transfer film by intaglio offset printing is shown in FIG. 22. It should be noted that a transfer substrate 23 and a release layer 24 in this figure are similar to those described above with respect to the third transfer sheet.

As shown in FIG. 22, a film having a release layer 24 provided on one side of a transfer substrate 23 is pressed by a back-up roller 21 onto an intaglio plate 22 having depressions 22a formed in the same pattern as the desired electrode pattern, and the back-up roller 21 is moved in the direction of the arrow A, thereby allowing a coating solution 12b' for forming an electrode-forming layer held in the depressions 22a of the intaglio plate 22 to transfer onto the release layer 24 to form a pattern-wise electrode-forming layer 12b, thereby constructing a transfer film. The transfer film formed in this way is pressed at the electrode-forming layer side thereof onto the above-described dielectric layer-forming layer 12c by using a back-up roller or the like, thereby enabling the pattern-wise electrode-forming layer 12b to be formed on the dielectric layer-forming layer 12c. The depth (intaglio depth) of the depressions 22a in the intaglio plate 22 should preferably be set according to the thickness of the desired electrode-forming layer, usually in the range of from 5 micrometers to 60 micrometers.

A coating solution for forming an electrode-forming layer that is suitable for the above-described electrode-forming layer forming method consists essentially of an inorganic component containing at least a glass frit, a thermoplastic resin, and an electrically conductive powder, together with a thickening agent added according to need. The details of the coating solution are similar to those described above with respect to the second transfer sheet.

To improve the coatability and other properties of the coating solution for forming an electrode-forming layer, it is possible to add a plasticizer, a dispersant, a suspending agent, a defoaming agent, a release agent, a leveling agent, etc. to the coating solution. The details of each of the ingredients are similar to those described above with respect to the second transfer sheet. These ingredients may be mixed with solvents similar to those in the case of the second transfer sheet and kneaded by a roll mill to form a paste-like coating solution. Alternatively, the mixture is kneaded by a ball mill or the like to form a slurry-like coating solution. Regarding the coating solution for forming an electrode-forming layer, the dynamic viscosity is in the range of from 500 to 7,000 poise, and the loss tangent tanδ is in the range of from 5 to 12. A dynamic viscosity exceeding 7,000 poise is undesirable because it becomes difficult to transfer the coating solution from the intaglio plate. A loss tangent tanδ exceeding 12 is undesirable because sagging is likely to occur in the pattern formed by transfer. The dynamic viscosity and the loss tangent tanδ are measured under a temperature of 23° C., a frequency of 10 Hz and a strain of 3% with a CS rheometer manufactured by Carimed.

Next, an apparatus for producing a transfer film by using a roll intaglio will be described with reference to FIG. 23. In the figure, reference character 12b denotes a pattern-wise electrode-forming layer, 33 a roll intaglio, 34 depressions, 35 a resin feeder, 36 a curable paste for forming an electrode-forming layer, 37 a curing device, 39 a release roll, 40 a coating section, 44 a feeding take-up roll, 45 feeder rolls, 47 compensator rolls, and 48 a receiving take-up roll.

A transfer film producing apparatus comprises a feeding take-up roll 44 for feeding a transfer substrate 49, feeder rolls 45, compensator rolls 47, and a receiving take-up roll 48. The coating section 40 comprises a press roll 32 that presses the transfer substrate 49, a roll intaglio 33 having depressions 34 cut in the surface thereof, a resin feeder 35 for coating a curable paste 36 (that is an uncured liquid at this time) for forming an electrode-forming layer onto the roll intaglio 33, a curing device 37 for curing and solidifying the liquid curable resin 36 filled in the depressions 34 of the roll intaglio 33, and a release roll 39.

At the coating section 40, the transfer substrate 49 is pressed by the press roll 32 so that, at a position between the press roll 32 and the release roll 39, the transfer substrate 49 comes into close contact with the surface of the roll intaglio 33 through the curable paste 36 for forming an electrode-forming layer coated by the resin feeder 35. The roll intaglio 33 is driven to rotate by a driving device (not shown) driven by an electric motor or the like in such a manner that the peripheral speed of the roll intaglio 33 is synchronous with the feed speed of the transfer substrate 49. Between the roll intaglio 33 and the transfer substrate 49 placed in close contact with it, the curable paste 36 for forming an electrode-forming layer filled in the depressions 34 of the roll intaglio 33 is cured and solidified in the state of being filled in the depressions 34 by the curing device 37, thereby being bonded to the surface of the transfer substrate 49. Thereafter, the transfer substrate 49 is separated from the roll intaglio 33 by the release roll 39, thereby producing a transfer film having a pattern-wise electrode-forming layer 12b formed on the transfer substrate 49.

The press roll 32 may be any roll that can press the transfer substrate 49 onto the surface of the roll intaglio 33. Usually, the press roll 32 has a diameter of about 50 millimeters to about 300 millimeters, and comprises a metal core covered with silicone rubber, natural rubber or the like.

The curing device 37 may be selected from suitable devices according to the type of curable resin used. However, it is preferable to use a device that emits radiation such as electromagnetic waves and charged particle beams having an energy quantum sufficient to crosslink and polymerize the curable resin. Examples of industrially available radiation include infrared rays, visible light, ultraviolet rays and electron beams. It is also possible to use electromagnetic waves such as microwaves and X-rays.

The arrangement may be such that when the curable resin is cured in the intaglio plate by ultraviolet rays or the like, the resin is prevented from setting completely by controlling the crosslink density, but the resin is cured by ultraviolet rays or the like upon pattern transfer in a state where the transfer sheet and a substrate are laminated, thereby improving the adhesion between the pattern and the substrate. In this case, ultraviolet rays may be applied to either the film surface or the substrate surface. It should be noted that reference numeral 38 in the figure denotes a reflector for efficiently directing radiation emitted from a radiation source toward the roll intaglio 33. There are provided two curing devices 37 per roll intaglio, and radiation sources $S_1$ and $S_2$ of the two curing devices 37 are positioned such that an angle $S_1OS_2$ between lines $S_1O$ and $S_2O$ where O is the center of the roll intaglio 33 is in the range of from 70° to 110°, preferably 90°.

The roll intaglio 33 has predetermined depressions 34 provided in the surface thereof by electronic engraving, etching, milling, electroforming, etc. Examples of materials usable for the roll intaglio 33 include metals, such as copper and iron, having a chrome plated surface, ceramics such as glass and quartz, and synthetic resins such as acrylic resin and silicone resin. Alternatively, a rolled sheet having a pattern of an ionizing radiation-curable resin, thermosetting resin, etc. formed on its outer surface may be used. Although there is no particular limitation on the size of the roll intaglio 33, it has usually a diameter of about 150 millimeters to about 1,000 millimeters and a line width of about 300 millimeters to about 2,000 millimeters. Regarding the size and shape of the depressions 34 formed on the roll intaglio 33, the shape of the depressions 34 is an electrode pattern in a PDP, and the depth of the depressions 34 may be in the range of from 0.1 micrometer to 1,000 micrometers.

As the transfer substrate 49, materials similar to those in the case of the above-described base film are usable. However, it is preferable to use a material that does not hinder radiation from reaching the curable resin. The thickness of the transfer substrate 49 is generally from 10 micrometers to 200 micrometers, preferably from 10 micrometers to 100 micrometers. It is preferable to provide a release layer on a surface of the transfer substrate 49 onto which the curable resin is to be transferred. The release layer may be similar to that stated above with respect to the intaglio offset printing.

The curable coating solution 36 for forming an electrode-forming layer consists essentially of an inorganic component containing at least a glass frit, a curable resin, and an electrically conductive powder.

For the inorganic component, it is possible to use glass frits, inorganic powders and inorganic pigments as stated above with respect to the inorganic component in the second transfer sheet. A glass frit as used herein should preferably have an average particle diameter in the range of from 0.3 micrometers to 5 micrometers. An inorganic powder should preferably be added in the proportion of from 0 to 10 parts by weight with respect to 100 parts by weight of the glass frit.

The curable resin is decomposed and removed upon firing after it has been cured. It is possible to use known ionizing radiation-curable resins and thermosetting resins. For the ionizing radiation-curable resins, resins as stated above with respect to the second transfer sheet may be used. The content of the curable resin in the coating solution for forming an electrode-forming layer is in the range of from 5% to 95% by weight, preferably from 10 to 50% by weight.

As the electrically conductive powder, it is possible to use powders as stated above with respect to the second transfer sheet. The content of the electrically conductive powder in the coating solution for forming an electrode-forming layer is in the range of from 30% to 95% by weight, preferably from 60% to 95% by weight.

If required, a plasticizer, a dispersant, a suspending agent, a defoaming agent, a release agent, a leveling agent, etc. may be added to the coating solution for forming an electrode-forming layer. These ingredients may be mixed with solvents similar to those in the case of the second transfer sheet and kneaded by a roll mill to form a paste-like coating solution. Alternatively, the mixture is kneaded by a ball mill or the like to form a slurry-like coating solution.

It should be noted that an electrode-forming material used in the roll intaglio 33 shown in FIG. 23 may be a thermoplastic resin as stated above with respect to the intaglio offset printing shown in FIG. 22. In this case, no curing device is needed.

The transfer film having a pattern-wise electrode-forming layer stacked thereon by using a roll intaglio is laminated on a dielectric layer-forming layer in a state wherein the degree of cure has been adjusted as stated above or with an adhesive layer interposed therebetween which can be decomposed by firing, thereby enabling an electrode-forming layer to be transferred onto the dielectric layer-forming layer.

By providing an electrode-forming layer by intaglio offset printing or roll intaglio as described above, the production time can be shortened, and the yield can be improved. Moreover, it is possible to form a pattern-wise electrode-forming layer having superior surface smoothness, a uniform thickness and high profile precision. The protective film 13 used herein is similar to that in the first transfer sheet.

Although in the foregoing description a dielectric layer-forming layer and an electrode-forming layer are successively formed on a base film, it is also possible to form an electrode-forming layer and a dielectric layer-forming layer successively on a protective film. In this case, the protective film needs to have the above-described conditions required for a base film as well. The transfer sheet obtained in this way may be stored in the state of being taken up. Alternatively, the transfer sheet may be slit to an appropriate shape and stored in the slit state. It should be noted that the protective film is provided according to need. These similarly apply in the fifth to thirteenth transfer sheets described later.

To fabricate a PDP by using the fourth transfer sheet, after the protective film 13 has been removed therefrom, the transfer sheet is pressed under heating onto a glass substrate having a primer layer according to need and then subjected to firing, thereby enabling a dielectric layer and a pattern-wise electrode layer to be formed simultaneously.

Figure 12:
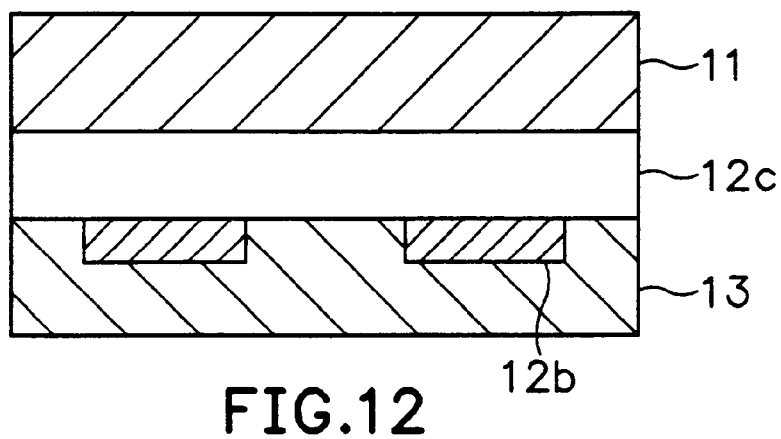
FIG. 12 is a sectional view illustrating a fourth transfer sheet according to the present invention.

Although in FIG. 12 the electrode-forming layer 12b is shown to be buried in the protective film 13, it should be noted that FIG. 12 schematically shows that when the electrode-forming layer 12b is formed on the dielectric layer-forming layer 12c, If the dielectric layer-forming layer 12c is hard, the electrode-forming layer 12b is formed as a relief. Conversely, in a case where the dielectric layer-forming layer 12c is soft, or in a case where the electrode-forming layer 12b is stacked on the protective film 13 and then the dielectric layer-forming layer 12c is formed, the electrode-forming layer 12b is buried in the dielectric layer-forming layer 12c. The stack structure according to the present invention may be expressed by either of the two methods and is not necessarily limited to the illustrated structure. The same shall apply in the following description of the fifth to thirteenth transfer sheets.

Next, a fifth transfer sheet according to the present invention will be described with reference to FIG. 13. The fifth transfer sheet has a stack structure in which a pattern-wise electrode-forming layer 12b, a primer-forming layer 12a, and a protective film 13 are successively stacked on a base film 11.

The base film 11 is similar to that of the above-described fourth transfer sheet. The pattern-wise electrode-forming layer 12b is formed on the base film 11 by a method as stated above with respect to the fourth transfer sheet.

The primer-forming layer 12a is provided to prevent disconnection of electrodes which would otherwise occur on account of eluation of the electrode layer with an alkaline component contained in a glass substrate in a PDP. The primer-forming layer 12a should preferably be formed over the pattern-wise electrode-forming layer 12b with an ink composition similar to that of the dielectric layer-forming layer stated above with respect to the fourth transfer sheet in the same way.

The protective film 13 is also provided according to need as in the case of the protective film stated above with respect to the fourth transfer sheet.

To fabricate a PDP, after the protective film 13 has been removed therefrom, the fifth transfer sheet is pressed onto a glass substrate under heating and then subjected to firing, thereby enabling a primer layer and a pattern-wise electrode layer to be formed simultaneously.

Next, a sixth transfer sheet according to the present invention will be described with reference to FIG. 14.

The sixth transfer sheet has a stack structure in which a barrier-forming layer 12d, a dielectric layer-forming layer 12c, and a protective film 13 are successively stacked on a base film 11.

The base film 11 is similar to that of the above-described fourth transfer sheet. The barrier-forming layer 12d consists essentially of an inorganic component containing at least a glass frit, and a thermoplastic resin. As the inorganic component, it is possible to use materials similar to those stated above with respect to the dielectric layer-forming layer. The proportion of the inorganic powder used in the barrier-forming layer should preferably be in the range of from 5 parts to 50 parts by weight with respect to 100 parts by weight of the glass frit.

As the thermoplastic resin, it is possible to use materials similar to those stated above with respect to the dielectric layer-forming layer. It is desirable that the proportion of the thermoplastic resin should be in the range of from 1 part to 30 parts by weight, preferably from 1 part to 15 parts by weight, with respect to 100 parts by weight of the inorganic component. If the proportion of the thermoplastic resin is less than 1 part by weight, the retention of the barrier-forming layer in the transfer sheet is unfavorably low, and the transferability degrades. If the proportion of the thermoplastic resin is more than 30 parts by weight, sand blastability degrades in sand blasting as described later, causing the operating efficiency to be deteriorated.

It is preferable to add a plasticizer to the barrier-forming layer to improve the retention of the barrier-forming layer in the transfer sheet and also transferability. As the plasticizer, it is possible to use the same materials as stated above with respect to the electrode-forming layer. It is preferable to add to the barrier-forming layer a dispersant, a suspending agent, a defoaming agent, a release agent, a leveling agent, etc. according to need, which are the same as those stated above with respect to the dielectric layer-forming layer.

The material for forming a barrier-forming layer is coated on the base film by a coating method similar to that stated above with respect to the dielectric layer-forming layer and then dried to form a barrier-forming layer. When it is difficult to obtain a predetermined thickness for the barrier-forming layer by a single coating operation, coating and drying should preferably be repeated a plurality of times.

The dielectric layer-forming layer is formed on the barrier-forming layer in the same way as in the case of the above-described dielectric layer-forming layer. The dielectric layer-forming layer and the barrier-forming layer can be made different from each other in sand blastability by setting the proportion of the thermoplastic resin contained in the dielectric layer-forming layer higher than the proportion of the thermoplastic resin contained in the barrier-forming layer. By doing so, it is possible to remove only the barrier-forming layer in the openings of a resist pattern having resistance to sand blasting and to allow the dielectric layer-forming layer underlying it to remain. It is only necessary to set the proportion of the thermoplastic resin contained in the dielectric layer-forming layer higher than the proportion of the thermoplastic resin contained in the barrier-forming layer. However, it is preferable to set the proportion of the former thermoplastic resin higher than the proportion of the latter thermoplastic resin by at least 3 parts by weight, more desirably at least 5 parts by weight, in terms of the proportion with respect to 100 parts by weight of the inorganic component. It should be noted that the thermoplastic resin in the dielectric layer-forming layer and the thermoplastic resin in the barrier-forming layer may be so selected as to differ from each other in sand blastability. In such a case, the proportions of the thermoplastic resins are not limited to the above-described proportions. The protective film 13 is stuck onto the dielectric layer-forming layer.

After the protective film 13 has been removed therefrom, the sixth transfer sheet is pressed under heating onto a glass substrate having a primer layer and an electrode layer, and then the base film 11 is removed.

Next, the plasticizer left in the barrier-forming layer is removed under the heating conditions of 150° C. to 350° C. Thereafter, a resist pattern is formed on the barrier-forming layer, and the barrier-forming layer in the openings of the resist pattern is removed by sand blasting. Sand blasting is a processing method in which abrasive fine particles mixed with compressed air are jetted out at high speed to effect etching physically. As the abrasive fine particles, brown fused alumina #800 is used and blown at a blast pressure of 1 kg/cm$^2$ to perform blasting.

After the resist pattern on the barrier-forming layer has been removed, the dielectric layer-forming layer and the barrier-forming layer are simultaneously fired under the conditions that the peak temperature is of the order of 570° C. Thus, a dielectric layer and a barrier layer are simultaneously formed on the PDP.

Next, a seventh transfer sheet according to the present invention will be described with reference to FIG. 15.

The seventh transfer sheet has a stack structure in which a dielectric layer-forming layer 12c, a pattern-wise electrode-forming layer 12b, a primer-forming layer 12a, and a protective film 13 are successively stacked on a base film 11.

The base film 11 is similar to that of the above-described fourth transfer sheet. The dielectric layer-forming layer 12c and the pattern-wise electrode-forming layer 12b are successively formed on the base film 11 as in the case of the fourth transfer sheet. The primer-forming layer 12a stated above with respect to the fifth transfer sheet is similarly stacked on the pattern-wise electrode-forming layer 12b. Further, the protective film 13 is stuck onto the primer-forming layer 12a, thereby constructing the seventh transfer sheet.

After the protective film 13 has been removed therefrom, the seventh transfer sheet is pressed onto a glass substrate under heating and then subjected to firing. Thus, in a PDP, a primer layer, a pattern-wise electrode layer and a dielectric layer can be formed simultaneously.

Next, an eighth transfer sheet according to the present invention will be described with reference to FIG. 16.

The eighth transfer sheet has a stack structure in which a barrier-forming layer 12d, a dielectric layer-forming layer 12c, a pattern-wise electrode-forming layer 12b, and a protective film 13 are successively stacked on a base film 11.

The base film 11 is similar to that of the above-described fourth transfer sheet. The barrier-forming layer 12d and the dielectric layer-forming layer 12c are successively formed on the base film 11 in the same way as stated above with respect to the sixth transfer sheet. The pattern-wise electrode-forming layer 12b is formed on the dielectric layer-forming layer 12c as in the case of the fourth transfer sheet. Further, the protective film 13 is stuck over the pattern-wise electrode-forming layer 12b, thereby constructing the eighth transfer sheet.

After the protective film 13 has been removed therefrom, the eighth transfer sheet is pressed under heating onto a glass substrate having a primer layer according to need. Then, the barrier-forming layer is subjected to patterning in the same way as stated above with respect to the sixth transfer sheet. Thereafter, firing is carried out. Thus, in a PDP, a pattern-wise electrode layer, a dielectric layer, and barriers can be formed simultaneously.

Next, a ninth transfer sheet according to the present invention will be described with reference to FIG. 17.

The ninth transfer sheet has a stack structure in which a barrier-forming layer 12d, a dielectric layer-forming layer 12c, a pattern-wise electrode-forming layer 12b, a primer-forming layer 12a, and a protective film 13 are successively stacked on a base film 11.

The base film 11 is similar to that of the above-described fourth transfer sheet. The barrier-forming layer 12d, the dielectric layer-forming layer 12c, and the pattern-wise electrode-forming layer 12b are successively formed on the base film 11 in the same way as stated above with respect to the eighth transfer sheet. The primer-forming layer 12a is formed on the pattern-wise electrode-forming layer 12b in the same way as in the case of the fifth transfer sheet. Further, the protective film 13 is stuck onto the primer-forming layer 12a, thereby constructing the ninth transfer sheet.

After the protective film 13 has been removed therefrom, the ninth transfer sheet is pressed onto a glass substrate under heating. Then, the barrier-forming layer is subjected to patterning in the same way as stated above with respect to the sixth transfer sheet. Thereafter, firing is carried out. Thus, in a PDP, a primer layer, a pattern-wise electrode layer, a dielectric layer, and barriers can be formed simultaneously.

Next, a tenth transfer sheet according to the present invention will be described with reference to FIG. 18. The tenth transfer sheet has a stack structure in which an anti-sand blasting photosensitive layer 17, a barrier-forming layer 12d, a dielectric layer-forming layer 12c, a pattern-wise electrode-forming layer 12b, and a protective film 13 are successively stacked on a base film 11.

The base film 11 is similar to that of the above-described fourth transfer sheet. The tenth transfer sheet will be described below with regard to a case where the anti-sand blasting photosensitive layer 17 is stacked on the base film 11.

The anti-sand blasting photosensitive layer 17 is formed by using a photoresist, a photosensitive black barrier-forming material, etc. As stated above, sand blasting is a processing method in which abrasive fine particles mixed with compressed air are jetted out at high speed to effect etching physically. The anti-sand blasting photosensitive layer 17 functions as a barrier pattern mask for the barrier-forming layer 12d subjected to sand blasting.

As a photoresist usable for the anti-sand blasting photosensitive layer 17, it is preferable to use a negative photoresist material that can be formed into a mask for sand blasting by weak alkali development carried out after exposure and can be removed by a strong alkali after a barrier-forming layer has been formed by sand blasting using the mask. Examples of photoresists usable for this purpose include liquid and dry film type photoresist materials. In contrast to the barrier-forming layer containing an inorganic component, the photoresist layer, which comprises only an organic component, is soft and superior in resistance to sand blasting.

The photosensitive black barrier-forming material is a coating solution consisting essentially of an inorganic component containing at least a glass frit and a black pigment, a radiation-curable resin, a monomer, and a photo-initiator as described above with respect to the electrode-forming layer. The photosensitive black barrier-forming material is formed into a layer having a crosslinked structure by curing and thus becomes superior in resistance to sand blasting. The anti-sand blasting photosensitive layer 17 can be made superior in resistance to sand blasting to the barrier-forming layer by setting the proportion of the organic component in the range of from 5 parts to 70 parts by weight, preferably from 10 parts to 40 parts by weight, with respect to 100 parts by weight of the inorganic component.

Next, the barrier-forming layer 12d, the dielectric layer-forming layer 12c, and the pattern-wise electrode-forming layer 12b are successively formed on the anti-sand blasting photosensitive layer 17 in the same way as stated above with respect to the eighth transfer sheet. Then, the protective film 13 is stuck over the dielectric layer-forming layer 12c, including the pattern-wise electrode-forming layer 12b, thereby constructing the tenth transfer sheet.

After the protective film 13 has been removed therefrom, the transfer sheet is pressed under heating onto a glass substrate with a primer-forming layer interposed therebetween according to need. Thereafter, the barrier layer pattern is exposed to light from the base film side, and a mask for forming a barrier is formed by a photolithography method. Then, after the base film 11 has been removed, the barrier-forming layer 12d is patterned by sand blasting in the same way as stated above with respect to the sixth transfer sheet, and subjected to firing after the mask has been removed, if necessary. In a PDP, a pattern-wise electrode layer, a dielectric layer, and barriers can be formed simultaneously. Performing firing in a state where the black barrier-forming layer is not removed makes it possible to form a barrier layer having a black barrier layer stacked thereon.

Next, an eleventh transfer sheet according to the present invention will be described with reference to FIG. 19. The eleventh transfer sheet has a stack structure in which a mask layer 18 for sand blasting, a barrier-forming layer 12d, a dielectric layer-forming layer 12c, a pattern-wise electrode-forming layer 12b, and a protective film 13 are successively stacked on a base film 11.

The base film 11 Is similar to that of the above-described fourth transfer sheet. To stack the mask layer 18 for sand blasting on the base film 11, it is preferable to print a liquid photoresist or a photosensitive black-barrier forming paste, as stated above with respect to the tenth transfer sheet, in the form of a barrier pattern by screen printing, for example.

Next, the barrier-forming layer 12d, the dielectric layer-forming layer 12c, and the pattern-wise electrode-forming layer 12b are successively formed on the mask layer 18 for sand blasting in the same way as in the case of the eighth transfer sheet, thereby constructing the eleventh transfer sheet.

After the protective film 13 has been removed therefrom, the transfer sheet is pressed under heating onto a glass substrate with a primer-forming layer interposed therebetween according to need. Thereafter, the base film 11 is removed, and then the barrier-forming layer 12d is patterned by sand blasting in the same way as stated above with respect to the sixth transfer sheet. Then, firing is carried out after the mask 18 has been removed if necessary. In a PDP, a pattern-wise electrode layer, a dielectric layer, and barriers can be formed simultaneously. It should be noted that if firing is carried out without removing the black barrier-forming layer, it is possible to form a barrier layer having a black barrier layer stacked thereon.

Figure 20:
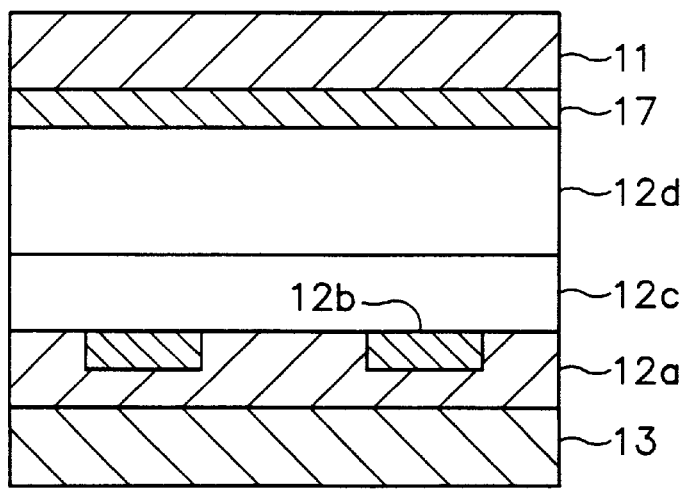
FIG. 20 is a sectional view illustrating a twelfth transfer sheet according to the present invention.

Next, a twelfth transfer sheet according to the present invention will be described with reference to FIG. 20. The twelfth transfer sheet has a stack structure in which a anti-sand blasting photosensitive layer 17, a barrier-forming layer 12d, a dielectric layer-forming layer 12c, a pattern-wise electrode-forming layer 12b, a primer-forming layer 12a, and a protective film 13 are successively stacked on a base film 11.

In this transfer sheet, the primer-forming layer 12a is provided on the pattern-wise electrode-forming layer 12b of the above-described tenth transfer sheet in the same way as stated above with respect to the fifth transfer sheet.

After the protective film 13 has been removed therefrom, the transfer sheet is pressed onto a glass substrate under heating. Thereafter, a barrier-forming mask is formed by a photolithography method in the same way as stated above with respect to the tenth transfer sheet. Then, the barrier-forming layer 12d is similarly patterned by sand blasting, and firing is similarly carried out. In a PDP, a primer layer, a pattern-wise electrode layer, a dielectric layer, and barriers can be formed simultaneously. If firing is carried out in a state where the black barrier-forming layer is not removed, it is possible to form a barrier layer having a black barrier layer stacked thereon.

Figure 21:
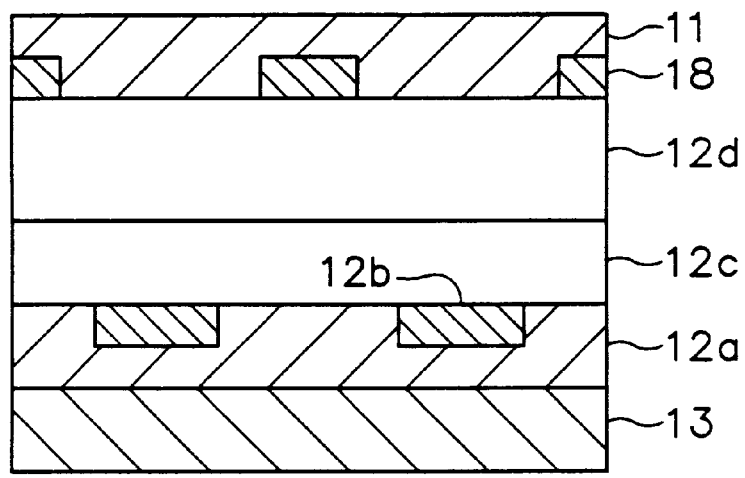
FIG. 21 is a sectional view illustrating a thirteenth transfer sheet according to the present invention.

Next, a thirteenth transfer sheet according to the present invention will be described with reference to FIG. 21. The thirteenth transfer sheet has a stack structure in which a mask layer 18 for sand blasting, a barrier-forming layer 12d, a dielectric layer-forming layer 12c, a pattern-wise electrode-forming layer 12b, a primer-forming layer 12a, and a protective film 13 are successively stacked on a base film 11.

In this transfer sheet, the primer-forming layer 12a is provided on the pattern-wise electrode-forming layer 12b of the above-described eleventh transfer sheet in the same way as stated above with respect to the fifth transfer sheet.

After the protective film 13 has been removed therefrom, the transfer sheet is pressed onto a glass substrate under heating. Thereafter, the barrier-forming layer 12d is patterned by sand blasting in the same way as stated above with respect to the eleventh transfer sheet, and firing is similarly carried out. In a PDP, a primer layer, a pattern-wise electrode layer, a dielectric layer, and barriers can be formed simultaneously. If firing is carried out in a state where the black barrier-forming layer is not removed, it is possible to form a barrier layer having a black barrier layer stacked thereon.

In the above-described fourth to thirteenth transfer sheets according to the present invention, a release layer may be provided under each layer stacked over the base film 11, if necessary, as in the case of the first transfer sheet. Further, an adhesive layer may be provided on the primer-forming layer 12, if necessary, as in the case of the first transfer sheet so that the protective film 13 is stacked over the primer-forming layer 12 with the adhesive layer interposed therebetween.

The arrangement may be such that a base film and a protective film are each formed as a transfer sheet having a stack structure including at least one of the above-described primer-forming layer, electrode-forming layer, dielectric layer-forming layer and barrier-forming layer, and the two transfer sheets are stuck to each other to form one of the fourth to thirteenth transfer sheets.

The fourth to thirteenth transfer sheets according to the present invention each enable a layer structure of a PDP to be transferred onto a PDP substrate by pressing under heating using, for example, a heated roll, laser light, a thermal head, or a hot press.

Each transferred ink layer is fired at a temperature of 350° C. to 650° C. to gasify, decompose and volatilize the organic component in the ink layer, thereby enabling the inorganic powder to be bonded together densely by the fused glass frit.

Next, a first pattern-forming method according to the present invention will be described.

FIGS. 24(a) to 25(d) are diagrams showing a sequence of process steps in the first pattern-forming method. In the figures, a method of forming a barrier layer in a PDP as a thick pattern is shown as an example of the first pattern-forming method. In the figures, reference numeral 111 denotes a base film, 112 a barrier-forming layer, 113 electrodes, 114 a glass substrate, 115 a photoresist, 116 a pattern mask, 117 a resist pattern, 118 barriers, and 119 a dielectric layer.

Figure 24A:
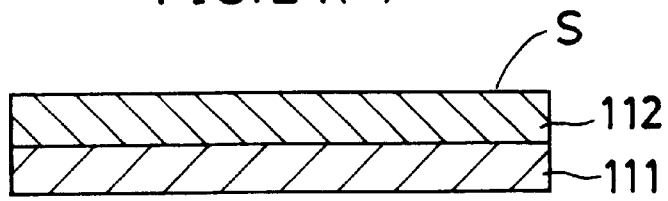
FIGS. 24(a) to 24(e) are diagrams illustrating a sequence of process steps in a first pattern-forming method according to the present invention.

A transfer sheet S shown in FIG. 24(a) will be described below. The base film Ill in the transfer sheet S should neither be attacked by a solvent in a layer-forming coating solution nor be contracted or elongated by heat treatments at the solvent-drying step and the transferring step. A base film as stated above with respect to the first transfer sheet is used as the base film 111.

The barrier-forming layer 112 consists essentially of an inorganic component containing at least a glass frit, and a thermoplastic resin. For the inorganic component containing at least a glass frit and the thermoplastic resin, materials as stated above with respect to the first transfer sheet are used. Regarding the proportions of the inorganic component and the thermoplastic resin, the thermoplastic resin is used in the proportion of from 3 parts to 50 parts by weight, preferably from 3 parts to 15 parts by weight, with respect to 100 parts by weight of the inorganic component. If the proportion of the thermoplastic resin used in the barrier-forming layer is less than 3 parts by weight, the retention of the barrier-forming layer becomes unfavorably low, giving rise to problems, particularly in terms of the handleability and shelf stability of the transfer sheet in the state of being wound up. Moreover, when the transfer sheet is slit to an appropriate shape, the inorganic component will become dust, causing hindrance to the fabrication of a PDP. If the proportion of the thermoplastic resin exceeds 50 parts by weight, sand blastability degrades in sand blasting as described later, causing the operating efficiency to be deteriorated. In addition, carbon will undesirably remain when the thick pattern is subjected to firing, causing the quality to be degraded.

Next, a high-boiling solvent added to the barrier-forming layer 112 will be described. The high-boiling solvent is added for the purpose of improving the transferability of the barrier-forming layer 112. However, because it has resistance to sand blasting, the high-boiling solvent must be removed before the sand blasting step. Further, it is necessary for the high-boiling solvent to have a boiling point (at 1 atmospheric pressure) in the range of from 150° C. to 400° C. If the boiling point is lower than 150° C., the transferability cannot be improved. If the boiling point exceeds 400° C., it takes a long time to remove the solvent by volatilization, and the pattern-forming operation becomes inefficient.

Examples of high-boiling solvents meeting the requirements include diethylene glycol monoalkyl ethers; diethylene glycol monoalkyl ether acetates, dipropylene glycol monoalkyl ethers; dipropylene glycol monoalkyl ether acetates; terpenes such as α- or β-terpineol; n-alkyl phthalates such as dimethyl phthalate, dibutyl phthalate, and di-n-octyl phthalate; phthalic acid esters such as di-2-ethylhexyl phthalate, diisodecyl phthalate, butylbenzyl phthalate, diisononyl phthalate, ethyl phthalyl ethyl glycolate, and butyl phthalyl butyl glycolate; trimellitic acid esters such as tri-2-ethylhexyl trimellitate, tri-n-alkyl trimellitate, triisononyl trimellitate, and triisodecyl trimellitate; aliphatic dibasic acid esters such as dimethyl adipate, dibutyl adipate, di-2-ethylhexyl adipate, diisodecyl adipate, dibutyl diglycol adipate, di-2-ethylhexyl azelate, dimethyl sebacate, dibutyl sebacate, di-2-ethylhexyl sebacate, di-2-ethylhexyl maleate, acetyl-tri-(2-ethylhexyl)citrate, acetyl-tri-n-butyl citrate, and acetyl tributyl citrate; glycol derivatives such as polyethylene glycol benzoate, triethylene glycol-di-(2-ethylhexoate), and polyglycol ether; glycerin derivatives such as glycerol triacetate, and glycerol diacetyl monolaurate; polyesters comprising sebatic acid, adipic acid, azelaic acid, and phthalic acid; low-molecular-weight polyethers having a molecular weight of 300 to 3,000; low-molecular-weight poly-α-styrenes having the same molecular weight as mentioned above; low-molecular-weight polystyrenes having the same molecular weight as mentioned above; orthophosphates such as trimethyl phosphate, triethyl phosphate, tributyl phosphate, tri-2-ethylhexyl phosphate, tributoxyethyl phosphate, triphenyl phosphate, tricresyl phosphate, trixylenyl phosphate, cresyl diphenyl phosphate, xylenyl diphenyl phosphate, and 2-ethylhexyl diphenyl phosphate; ricinoleic acid esters such as methyl acetyl ricinoleate; polyester epoxidized esters such as poly-1,3-butanediol adipate, and epoxidized soybean oil; and acetic acid esters such as glycerin triacetate, and 2-ethylhexyl acetate.

It is desirable to use the high-boiling solvent in the proportion of from 2 parts to 30 parts by weight, preferably from 2 parts to 25 parts by weight, with respect to 100 parts by weight of the inorganic component. If the proportion of the high-boiling solvent is less than 2 parts by weight, the transferability degrades, whereas if it is more than 25 parts by weight, it takes a long time to remove the solvent by volatilization, and the operating efficiency becomes unfavorably low.

If required, a dispersant, a suspending agent, a defoaming agent, a release agent, a leveling agent, etc. may be added to the barrier-forming layer as in the case of the first transfer sheet.

The above-described material for forming a barrier-forming layer may be dissolved or dispersed in a low-boiling solvent preferably having a boiling point in the range of from 50° C. to 150° C., for example, methanol, ethanol, isopropanol, acetone, methyl ethyl ketone, toluene, xylene, anones such as cyclohexanone, methylene chloride, 3-methoxybutyl acetate, ethylene glycol monoalkyl ethers, and ethylene glycol dialkyl ethers. The resulting solution is coated on the base film by die coating, blade coating, comma coating, roll coating, or gravure coating. The low-boiling solvent is added for the purpose of adjusting the coatability of the material for forming a barrier-forming layer of a transfer sheet. The low-boiling solvent is removed by drying after the barrier-forming layer has been coated on the base film.

After being coated, the barrier-forming layer material is dried under such heating conditions that the high-boiling solvent is left, but the low-boiling solvent is removed, thereby removing the low-boiling solvent, and thus forming a barrier-forming layer with a predetermined thickness. If it is difficult to obtain a predetermined thickness by a single coating operation, coating and drying may be repeated a plurality of times.

It is preferable to stick a protective film onto the barrier-forming layer as in the case of the first transfer sheet.

If the barrier-forming layer is stacked over the base film with a release layer interposed therebetween as in the case of the first transfer sheet, the transferability of the barrier-forming layer is further improved.

Further, an adhesive layer may be provided on the barrier-forming layer as in the case of the first transfer sheet for the purpose of improving the transferability of the barrier-forming layer. As the adhesive layer, it is preferable to use a material that burns at low temperature at the firing step and that is unlikely to leave any carbide. Specific examples of the adhesive layer include a layer formed by coating a thermoplastic resin solution mixed with a high-boiling solvent constituting the barrier-forming layer, and a layer formed by coating a pressure-sensitive adhesive. These adhesives soften upon heating and enable the barrier-forming layer to be readily bonded to a glass substrate or the surface of a dielectric layer. The adhesive should preferably be formed with an as-dried coating thickness of 0.1 micrometer to 5 micrometers.

Next, the a-step in the process of forming barriers of a PDP will be described with reference to FIGS. 24(b) to 24(d).

Figure 24B:
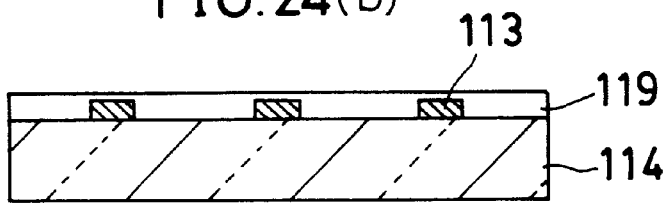
Figure 24C:
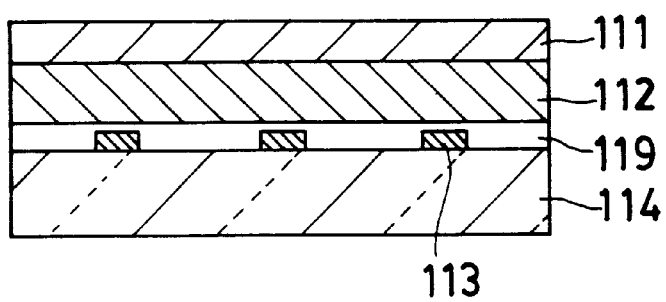

FIG. 24(b) shows a glass substrate 114 having a primer layer (not shown), electrodes 113, and a dielectric layer 119 successively stacked thereon. The transfer sheet S shown in FIG. 24(a) is laid over the glass substrate 114 as shown in FIG. 24(c), and the resulting stack structure is heated by using a heated roll, a hot press, laser, a thermal head, or the like, thereby transferring the barrier-forming layer 112. Although the barrier-forming layer 112 in the transfer sheet can be stacked directly on the dielectric layer 119 by pressing under heating, the barrier-forming layer 112 may be stacked over the dielectric layer 119 with an adhesive layer interposed therebetween as in the case of the first transfer sheet.

Figure 24D:
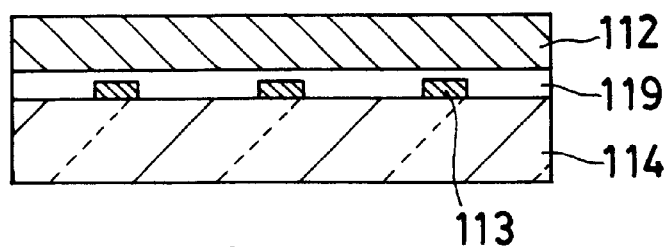
Figure 24E:
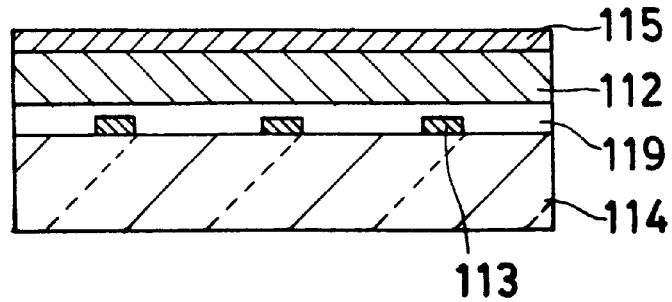

Next, as shown in FIG. 24(d), after the base film 111 has been removed, the high-boiling solvent left in the barrier-forming layer 112 is removed as the b-step. To remove the high-boiling solvent, the barrier-forming layer 112 is held at a temperature of 150° C. to 350° C. The b-step is carried out for the purpose of preventing separation of a resist pattern due to bleeding from the barrier-forming layer 112. It should be noted that decomposition of a part of the thermoplastic resin during the b-step is ignorable.

At the c-step, a resist pattern is formed on the barrier-forming layer 112 having the high-boiling solvent removed therefrom by volatilization. The c-step will be described below with reference to FIGS. 24(e), 25(a) and 25(b).

Figure 25A:
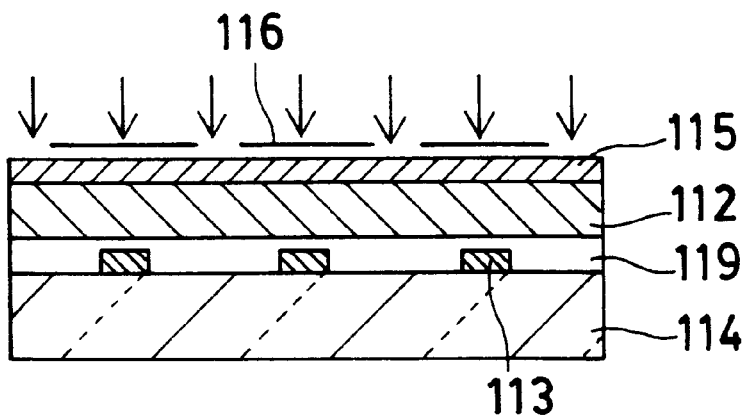
FIGS. 25(a) to 25(d) are diagrams illustrating a sequence of process steps in the first pattern-forming method according to the present invention.
Figure 25B:
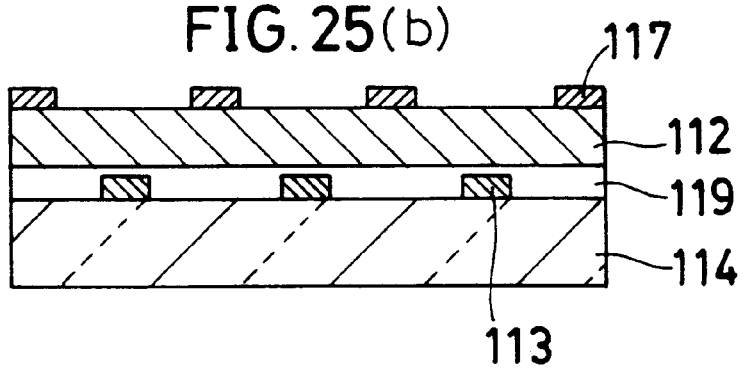

To form a resist pattern on the barrier-forming layer 112, a resist may be directly patterned by screen printing. However, to perform high-definition processing over a wide area, it is preferable to form a resist pattern by a photolithography method using a liquid or dry film-shaped photoresist. Patterning of a photoresist layer 115 is effected as follows: As shown in FIG. 25(a), exposure is carried out by irradiation (as shown by the arrows) with ultraviolet rays, an electron beam, etc. through a line-shaped mask pattern 116, for example. Next, as shown in FIG. 25(b), the photoresist layer in the unexposed portions is removed by development with a weak alkali or the like. Thus, the photoresist layer 115 is patterned.

Figure 25C:
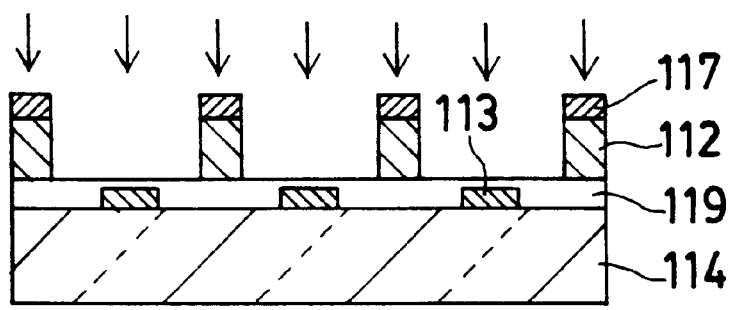
Figure 25D:
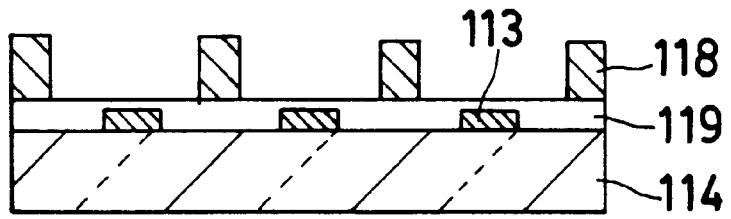

At the d-step, as shown in FIG. 25(c), the barrier-forming layer 112 is subjected to sand blasting by using the resist pattern 117 as a mask. It should be noted that the arrows in the figure represent sand blast. At the e-step, as shown in FIG. 25(d), the resist pattern 117 on the barrier-forming layer 112 is removed by an alkaline solution. After the resist pattern 117 has been removed, the barrier-forming layer 112 is subjected to firing to form a barrier layer 118 in a PDP in which the inorganic powder is bonded together densely by the fused glass frit.

Although in the foregoing method the substrate has a stack structure in which an electrode layer and a dielectric layer are successively stacked on a glass substrate by firing, the described method may be modified as follows: On a glass substrate, an electrode-forming layer and dielectric layer-forming layer as described later are successively stacked such that the content of the thermoplastic resin in the dielectric layer-forming layer is higher than the thermoplastic resin content in the barrier-forming layer so as to make the dielectric layer-forming layer more resistant to sand blasting than the barrier-forming layer. Consequently, it is possible to sand-blast only the barrier-forming layer while leaving the dielectric layer-forming layer as it is. This method enables an electrode layer, a dielectric layer, and a barrier layer to be simultaneously subjected to firing and thus facilitates the fabrication of a PDP.

Although the first pattern-forming method according to the present invention has been described with regard to a method of forming a barrier-forming layer in a PDP by way of example, it should be noted that a dielectric layer-forming layer and an electrode-forming layer can also be formed by the first pattern-forming method according to the present invention.

A dielectric layer-forming layer 119 is provided on an electrode-forming layer 113. The dielectric layer-forming layer 119 consists essentially of an inorganic component containing at least a glass frit, and a thermoplastic resin. As the inorganic component, a material similar to those stated above with respect to the barrier-forming layer can be used. The proportion of the inorganic powder used in the dielectric layer-forming layer 119 should preferably be set in the range of from 0 to 30 parts by weight with respect to 100 parts by weight of the glass frit.

As the thermoplastic resin, a material similar to those stated above with respect to the barrier-forming layer can be used. It is desirable to use the thermoplastic resin in the proportion of from 3 parts to 50 parts by weight, preferably from 5 parts to 30 parts by weight, with respect to 100 parts by weight of the inorganic component.

Moreover, a high-boiling solvent as stated above with respect to the barrier-forming layer may similarly be added to the dielectric layer-forming layer for the purpose of improving the retention of the dielectric layer-forming layer in the transfer sheet and the transferability thereof. If required, a dispersant, a suspending agent, a defoaming agent, a release agent, a leveling agent, etc. which are similar to those usable for the barrier-forming layer may be added to the dielectric layer-forming layer. These ingredients are dissolved or dispersed in a low-boiling solvent as in the case of the barrier-forming layer, and the resulting solution is coated on the base film 11 by a method similar to that described above and dried to form a dielectric layer-forming layer with a predetermined thickness.

The transfer sheet thus obtained is laid over the electrodes 113. After the dielectric layer-forming layer has been transferred under heating, the base film 111 is removed, and the high-boiling solvent left in the dielectric layer-forming layer is removed as the b-step, thereby preventing separation or the like of a resist pattern which might otherwise be caused by bleeding of the high-boiling solvent from the dielectric layer-forming layer. Next, as the c-step, a resist pattern is formed on the dielectric layer-forming layer. The resist pattern corresponds to sealing portions provided at the ends of two glass substrates in a PDP. Next, the photoresist layer in the unexposed portions is removed by development, thereby patterning the photoresist. As the d-step, the dielectric layer-forming layer is sand-blasted by using the resist pattern as a mask. Next, the resist pattern is removed, thereby forming a pattern-wise dielectric layer-forming layer. The dielectric layer-forming layer is subjected to firing to form a dielectric layer in a PDP in which the inorganic powder is bonded together densely by the fused glass frit.

The electrode-forming layer 113 consists essentially of an inorganic component containing at least a glass frit, a thermoplastic resin, a high-boiling solvent, and an electrically conductive powder.

As the inorganic component, it is possible to use a glass frit, an inorganic powder and an inorganic pigment similar to those stated above with respect to the inorganic component in the barrier-forming layer. It is preferable to use a glass frit having an average particle diameter of 0.3 micrometers to 5 micrometers. The inorganic powder should preferably be used in the proportion of from 0 to 10 parts by weight with respect to 100 parts by weight of the glass frit.

The resinous component is contained in the electrode-forming layer as a binder for the inorganic component and for the purpose of improving the transferability. It is possible to use a resin that is volatilized and decomposed upon firing and leaves no carbide in the pattern as in the case of the thermoplastic resin in the barrier-forming layer. Examples of resins usable for the electrode-forming layer are those stated above with respect to the barrier-forming layer. Examples of preferable resins are cellulosic resins such as ethyl cellulose, methyl cellulose, nitro cellulose, cellulose acetate, cellulose propionate, and cellulose butylate, polyacrylates and polymethacrylates, i.e. polymers and copolymers comprising at least one of methyl acrylate, ethyl acrylate, n-butyl acrylate, isobutyl acrylate, isopropyl acrylate, 2-ethyl hexyl acrylate, and 2-hydroxy ethyl acrylate, poly-α-styrene, polyvinyl alcohol, and polybutene resin. Polybutene resin is particularly preferable. The content of the resinous component in the electrode-forming layer is in the range of from 3% to 50% by weight, preferably from 5% to 30% by weight.

Examples of electrically conductive powders usable for the electrode-forming layer include metal powders such as gold, silver, copper, nickel and aluminum. It is preferable to use a spherical metal powder having an average particle diameter of 0.1 micrometer to 5 micrometers. Regarding the proportions of the electrically conductive powder and the glass frit, the glass frit is used in the proportion of from 2 parts to 20 parts by weight with respect to 100 parts by weight of the electrically conductive powder.

A high-boiling solvent is added to the electrode-forming layer as in the case of the barrier-forming layer for the purpose of improving the retention of the electrode-forming layer in the transfer sheet and the transferability thereof. Further, a thickening agent, a dispersant, a suspending agent, a defoaming agent, a release agent, and a leveling agent may be added to the electrode-forming layer. For these ingredients, substances similar to those stated above with respect to the barrier-forming layer may be used.

The ingredients may be mixed with solvents similar to those stated above with respect to the barrier-forming layer and kneaded by a roll mill to form a paste-like coating solution. Alternatively, the mixture is kneaded by a ball mill or the like to form a slurry-like coating solution. The coating solution is coated on the base film 111 by a method similar to that in the case of the barrier-forming layer and dried to form an electrode-forming layer with a predetermined thickness.

The transfer sheet thus obtained is laid over the glass substrate 114 or on a primer-forming layer. After the electrode-forming layer has been transferred under heating, the base film is removed. As the b-step, the high-boiling solvent left in the electrode-forming layer is removed, thereby preventing separation or the like of a resist pattern which might otherwise be caused by bleeding of the high-boiling solvent from the electrode-forming layer. Next, as the c-step, a resist pattern is formed on the electrode-forming layer. The resist pattern corresponds to an electrode pattern in a PDP. Next, the photoresist layer in the unexposed portions are removed by development, thereby patterning the photoresist. As the d-step, the electrode-forming layer is sand-blasted by using the resist pattern as a mask. Next, the resist pattern is removed, thereby forming a pattern-wise electrode-forming layer. The electrode-forming layer is subjected to firing to form an electrode layer in a PDP in which the inorganic powder is bonded together densely by the fused glass frit.

Next, a second pattern-forming method according to the present invention will be described.

Figure 26A:
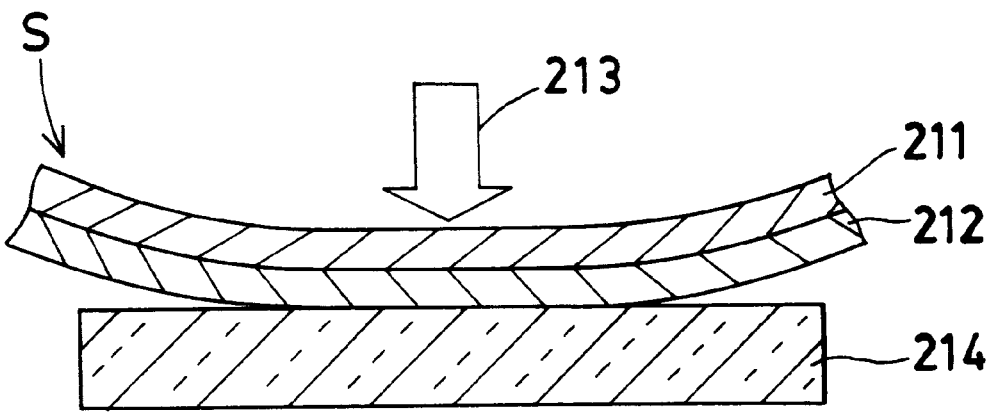
FIGS. 26(a) and 26(b) are diagrams illustrating a second pattern-forming method according to the present invention.
Figure 26B:
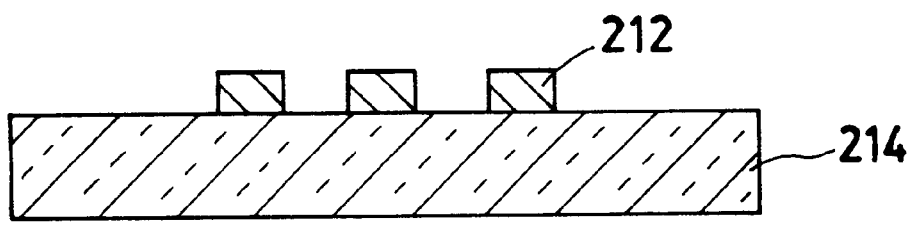

FIGS. 26(a) and 26(b) are diagrams for explaining the second pattern-forming method according to the present invention. In the figures, reference character S denotes a transfer sheet, 211 a base film, 212 an ink layer, 213 a thermal head or a laser light source, and 214 a PDP member.

The base film 211 in the transfer sheet S should neither be attacked by a solvent in an ink layer-forming coating solution nor be contracted or elongated by heat treatments at the solvent-drying step and the transferring step. The base film 211 is similar to the base film of the fourth transfer sheet.

The ink layer 212 consists essentially of an inorganic component and a hot-melt organic substance. The second pattern-forming method will be described below with regard to a case where the ink layer is an electrode-forming layer and also a case where the ink layer is a dielectric layer-forming layer.

When it is an electrode-forming layer, the ink layer consists essentially of an inorganic component and a hot-melt organic substance. The inorganic component contains at least an electrically conductive powder and, if necessary, may further contain a glass frit, an inorganic powder, and an inorganic pigment.

As the electrically conductive powder, gold, silver, copper, nickel, aluminum, etc. may be used. It is preferable to use an electrically conductive powder having an average particle diameter of 0.1 micrometer to 5 micrometers.

As the glass frit, it is possible to use materials similar to those usable for the fourth transfer sheet. It is preferable to use a glass frit having an average particle diameter of 0.3 micrometers to 5 micrometers.

Examples of inorganic powders and inorganic pigments usable for the ink layer are similar to those stated above with respect to the fourth transfer sheet.

Examples of hot-melt organic substances usable for the ink layer include thermoplastic resins and waxes. The hot-melt organic substance needs to be volatilized and decomposed upon firing without leaving any carbide in the pattern, and it is contained as a binder for the inorganic component for the purpose of improving the transferability. Examples of thermoplastic resins usable for the ink layer are similar to those stated above with respect to the fourth transfer sheet.

Examples of waxes usable for the ink layer include polyethylene wax, amide wax, Teflon powder, silicone wax, carnauba wax, acryl wax, and paraffin wax. The melting point of the wax used herein is in the range of from 30° C. to 120° C., preferably from 60° C. to 100° C. If the melting point is lower than 30° C., the retention of the ink layer on the transfer sheet becomes unfavorably low. If the melting point is higher than 120° C., the ink layer is not sufficiently fluidized upon transfer, and this gives rise to problems such as voids during transfer process.

Regarding the proportions of the inorganic component and the hot-melt organic substance, the hot-melt organic substance is used in the proportion of from 3 parts to 50 parts by weight, preferably from 5 parts to 30 parts by weight, with respect to 100 parts by weight of the inorganic component. If the content of the hot-melt organic substance in the ink layer is less than 3 parts by weight, the retention of the ink layer becomes unfavorably low, whereas if the hot-melt organic substance content is more than 50 parts by weight, carbon undesirably remains in the film after firing, causing the quality to be degraded.

If required, a plasticizer, a dispersant, a suspending agent, a defoaming agent, a release agent, a leveling agent, etc. may be added to the ink layer.

The above-described ink layer-forming material is formed into a coating solution as in the case of the ink for an electrode-forming layer in the fourth transfer sheet. The coating solution is coated on the base film 211 by die coating, blade coating, comma coating, roll coating, gravure reverse coating, gravure direct coating, slit reverse coating, etc., and then dried.

When the ink layer is an electrode-forming layer, the as-dried thickness of the layer is in the range of from 3 micrometers to 30 micrometers, preferably from 7 micrometers to 25 micrometers.

When it is a dielectric layer-forming layer, the ink layer consists essentially of an inorganic component and a hot-melt organic substance. The inorganic component contains at least a glass frit and, if necessary, may further contain an inorganic powder (aggregate) and an inorganic pigment.

For the glass frit, the inorganic powder, the inorganic pigment and the hot-melt organic substance, it is possible to use materials similar to those stated above with respect to the electrode-forming material. The inorganic powder may be used in the proportion of from 0 to 30 parts by weight with respect to 100 parts by weight of the glass frit. The proportions of the inorganic component and the hot-melt organic substance used herein may be similar to those stated above with respect to the electrode-forming material.

If required, a plasticizer, a dispersant, a suspending agent, a defoaming agent, a release agent, a leveling agent, etc. may be added to the dielectric layer-forming material as in the case of the electrode-forming material. These ingredients may be dissolved or dispersed by using a solvent similar to those stated above, and the resulting solution may be coated on the base film 211 by a method similar to those described above, thereby forming a dielectric layer-forming layer.

When the ink layer is a dielectric layer-forming layer, the as-dried thickness is in the range of from 10 micrometers to 50 micrometers, preferably from 15 micrometers to 30 micrometers.

It should be noted that a primer-forming layer or a barrier-forming layer can also be formed by using materials similar to those stated above. To form a barrier-forming layer, it is preferable to repeat the layer-forming process a multiplicity of times.

If necessary, a heat-resistant layer is preferably provided on a side of the base film 211 that is reverse to the side where the ink layer 212 is provided. The heat-resistant layer is provided to impart heat-resistant lubricating properties to the transfer sheet in a case where a thermal head is used as a transfer device 213. The heat-resistant layer may consist essentially of one or more of such substances as silicone resins, epoxy resins, melamine resins, phenol resins, fluorocarbon resins, polyimide resins, and hydroxy cellulose, as stated above with respect to the first transfer sheet. If necessary, the heat-resistant layer may be thermoset by using isocyanate.

The ink layer may be stacked over the base film with a release layer interposed therebetween for the purpose of improving the transferability of the ink layer. The release laser may be formed by using materials as stated above with respect to the first transfer sheet.

If required, a protective film may be releasably provided on the ink layer in the transfer sheet. The transfer sheet is stored in a roll form or a sheet form. In actual use, the transfer sheet is used for transfer with the protective film removed therefrom.

As the protective film, it is possible to use materials as stated above as examples of a protective film for the first transfer sheet.

In the second pattern-forming method according to the present invention, the transfer sheet S is, as shown in FIG. 26(*a*), laid over the PDP member 214 such that the ink layer 212 comes in contact with the PDP member 214, and heated in the form of a PDP constituent layer pattern by using a thermal head or laser light 213, thereby transferring the ink layer 212 onto the PDP member 214, as shown in FIG. 26(*b*).

When the PDP constituent layer pattern to be transferred is a primer layer pattern, the PDP member 214 is a glass substrate, whereas, when the layer pattern to be transferred is an electrode pattern, the PDP member 214 is a glass substrate or a glass substrate having a primer layer thereon. When the PDP constituent layer pattern to be transferred is a dielectric layer pattern, the PDP member 214 is a glass plate with electrodes or other similar glass plate. The present invention is particularly suitable for transferring an electrode pattern in a PDP member with high definition.

As the thermal head, it is preferable to use a thermal transfer type thermal head, a sublimation transfer type thermal head as used in a video printer, or an electrothermal transfer type electric heating head for an arrangement in which an electric heating layer is provided on the back of a thermal transfer sheet. It is also possible to apply laser from a light source, e.g. a semiconductor laser, a YAG laser, a $CO_2$ layer, a glass laser, a ruby laser, etc. instead of using a thermal head. In this case, the ink layer is transferred by controlling the irradiation time, the laser output, etc.

The ink layer transferred onto the PDP member is fired at a temperature of 350° C. to 650° C. to gasify, decompose and volatilize the hot-melt organic substance and the like in the ink layer, thereby enabling the inorganic powder to be bonded together densely by the fused glass frit.

The PDP fabricating method according to the present invention is suitable for forming a PDP constituent layer in a pattern-wise shape on a PDP member and particularly suitable for forming an electrode-forming layer, which requires high-definition patterning. Moreover, because a PDP constituent layer is formed by using a transfer sheet, it is possible to shorten the time required for PDP fabrication and to improve the yield. In addition, it is possible to form a pattern-wise PDP constituent layer having superior surface smoothness, a uniform thickness and high profile precision directly on a PDP member.

Next, a third pattern-forming method according to the present invention will be described.

Figure 27:
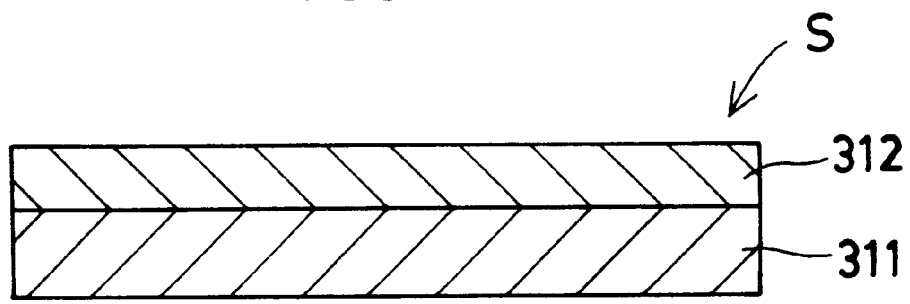
FIG. 27 is a sectional view illustrating a transfer sheet used in a third pattern-forming method according to the present invention.

FIG. 27 is a sectional view of a transfer sheet. In the figure, reference character S denotes a transfer sheet, 311 a base film, and 312 an ink layer.

The base film 311 in the transfer sheet S should neither be attacked by a solvent in a layer-forming coating solution nor be contracted or elongated by heat treatments at the solvent-drying step and the transferring step. A base film similar to that of the first transfer sheet is used for the base film 311.

Next, the ink layer 312 will be described with regard to a case where it is a dielectric layer-forming layer. The ink layer 312 consists essentially of inorganic particles containing at least a glass frit, and a resin that is removed afterward by firing. As the inorganic particles containing at least a glass frit, those stated above with respect to the second transfer sheet are usable. The ink layer 312 may contain, in addition to the glass frit, a mixture of two or more inorganic aggregates and a mixture of two or more inorganic pigments. Examples of inorganic aggregates and pigments usable for the ink layer 312 are the same as those stated above with respect to the second transfer sheet.

The resin in the ink layer 312 is a component that is removed by firing during the fabrication of a PDP or a multilayer electrode panel. Thermoplastic resins, curable resins, etc. similar to those stated above with respect to the second transfer sheet are usable as the resin in the ink layer 312.

Regarding the proportions of the inorganic particles and the resin, the resin is used in the proportion of from 3 parts to 70 parts by weight, preferably from 10 parts to 50 parts by weight, with respect to 100 parts by weight of the inorganic particles. If the resin content in the ink layer is less than 3 parts by weight, the retention of the ink layer becomes unfavorably low, giving rise to problems, particularly in terms of the shelf stability of the transfer sheet in the state of being taken up and the handleability thereof, and causing the transferability to be degraded. If the resin content is higher than 70 parts by weight, carbon undesirably remains in the film after firing, causing the quality to be degraded unfavorably.

If required, a plasticizer, a dispersant, a suspending agent, a defoaming agent, a release agent, a leveling agent, etc. may be added to the ink layer as in the case of the second transfer sheet. These ingredients are dissolved or dispersed in a solvent similar to those usable for the second transfer sheet to prepare a coating solution. The coating solution is coated on the base film by die coating, blade coating, comma coating, roll coating, gravure reverse coating, gravure direct coating, slit reverse coating, etc., and dried to form a dielectric layer-forming layer with a predetermined thickness.

If required, a protective film may be stacked on the ink layer 312 of the transfer sheet as in the case of the first transfer sheet. The protective film may be stacked over the ink layer 312 with an adhesive layer interposed therebetween as in the case of the first transfer sheet. The ink layer 312 may be stacked over the base film 311 with a release layer interposed therebetween according to need as in the first transfer sheet for the purpose of improving the transferability. Further, a heat-resistant layer similar to that in the case of the first transfer sheet may be provided, if necessary, on a side of the base film 311 that is reverse to the side where the ink layer 312 is provided. The transfer sheet may be in either a sheet form or a roll form.

Figure 28A:
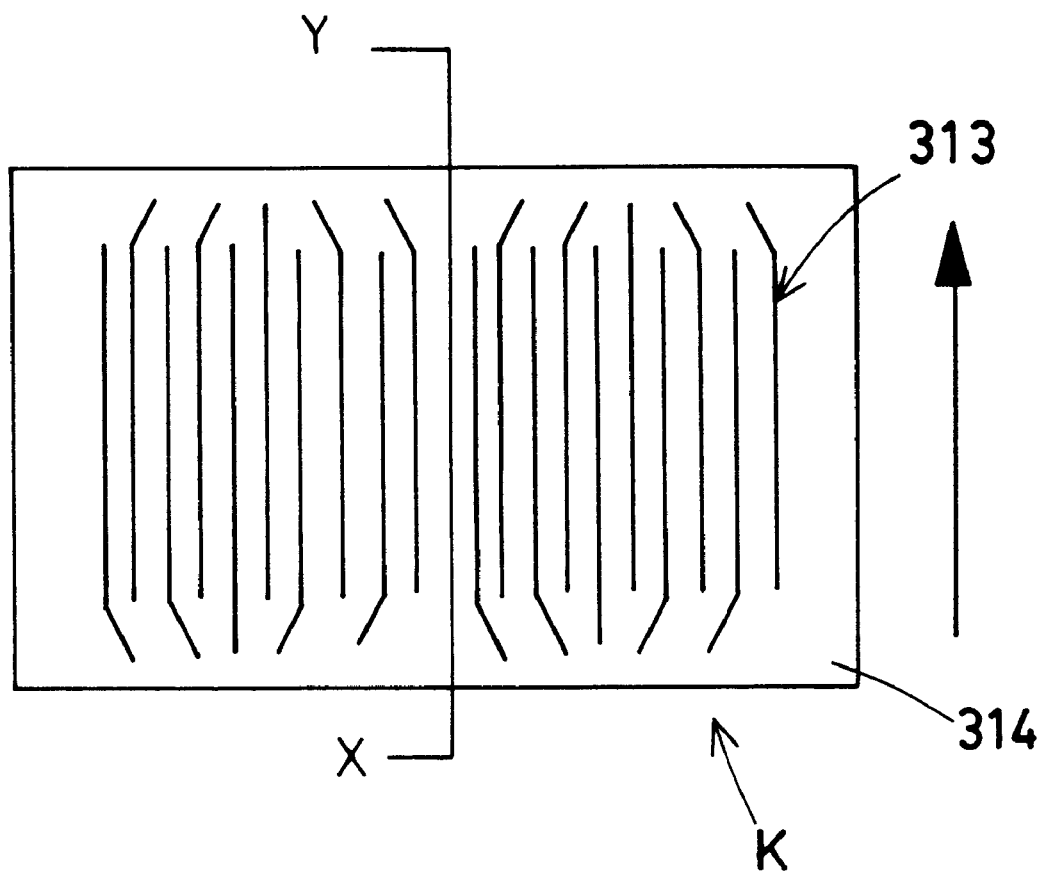
FIGS. 28(a) and 28(b) are diagrams illustrating a substrate having a raised electrode pattern.
Figure 28B:
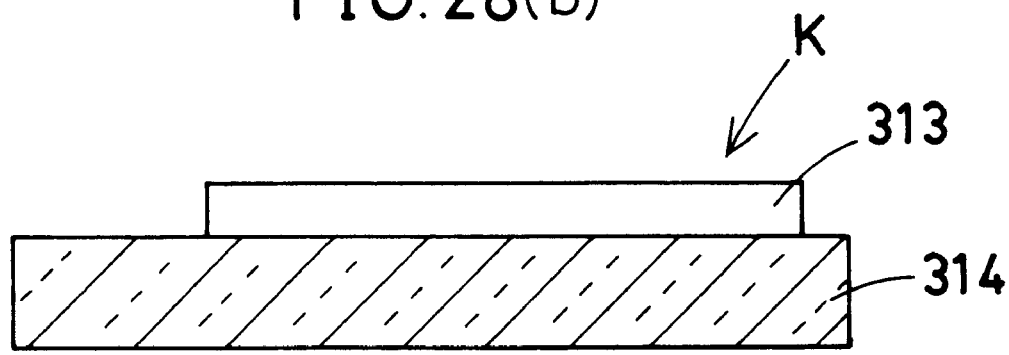

FIG. 28(a) is a plan view of a PDP substrate having an electrode pattern. FIG. 28(b) is a sectional view taken in the direction XY in FIG. 28(a). In the figures, reference character K denotes a PDP substrate having an electrode pattern, 313 an electrode layer, and 314 a glass substrate in a PDP. The arrow in FIG. 28(a) indicates the laminating direction of the transfer sheet.

The PDP shown in FIGS. 28(a) and 28(b) is an object onto which the ink layer in the transfer sheet according to the present invention is to be transferred. The PDP has an electrode layer 313 stacked on a glass substrate 314.

The electrode layer 313 is formed by using an ink consisting essentially of inorganic particles containing at least a glass frit, a resin that is removed afterward by firing, and electrically conductive particles. The electrode layer 313 may be formed by various methods. For example, the electrode layer 313 may be one of layers formed as follows:

(1) An electrode layer that is pattern-wise formed by screen printing or intaglio offset printing.
(2) An electrode layer formed by a method wherein a photosensitive electrode paste is solid coated by screen printing, die coating, etc. and then exposed in the form of an electrode pattern and developed.
(3) An electrode layer formed by a method wherein a photosensitive electrode paste is coated on a base film similar to that of the above-described transfer sheet to form a transfer sheet, and the transfer sheet is laid over a glass substrate to transfer an electrode-forming layer, which is then pattern-wise exposed and developed by a photolithography method.
(4) An electrode layer formed by using a transfer sheet having a pattern-wise electrode-forming layer formed on a base film and transferring the pattern-wise electrode-forming layer onto a glass substrate.
(5) A thin-film electrode layer formed by stacking an electrode material directly on a glass substrate by vapor deposition, sputtering, etc.

It should be noted that examples of the above-described development process are development by wet process and stripping development.

The third pattern-forming method according to the present invention may be carried out after an electrode-forming layer has been fired to form an electrode layer. Alternatively, an electrode layer and a dielectric layer may be simultaneously formed by carrying out firing after a pattern has been formed on a raised electrode-forming layer before being fired.

Figure 29:
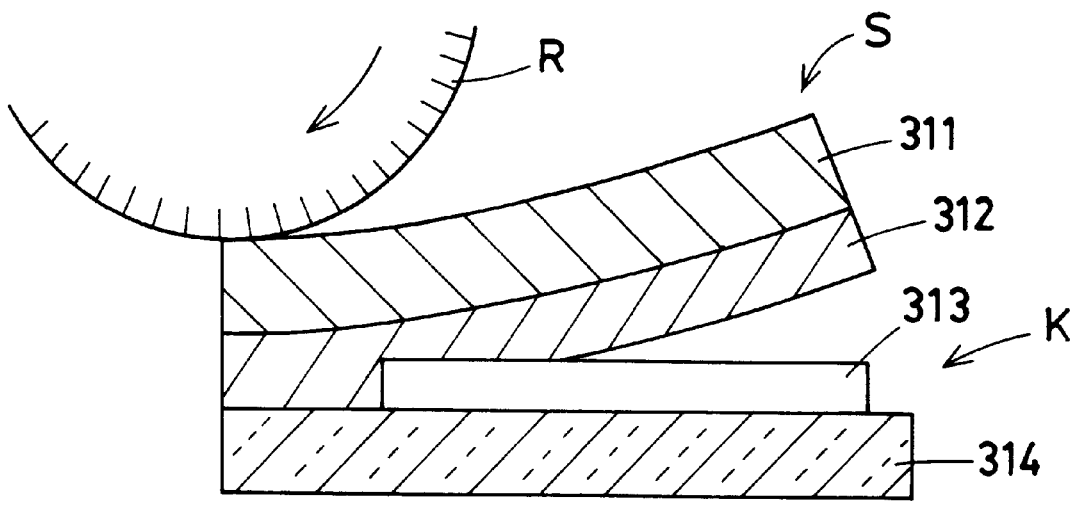
FIG. 29 is a diagram illustrating the third pattern-forming method according to the present invention.

FIG. 29 is a diagram for explaining the third pattern-forming method according to the present invention. In the figure, reference character R denotes a thermal laminator, and the same reference characters as those in FIGS. 27, 28(a) and 28(b) denote the same matters.

Figure 30:
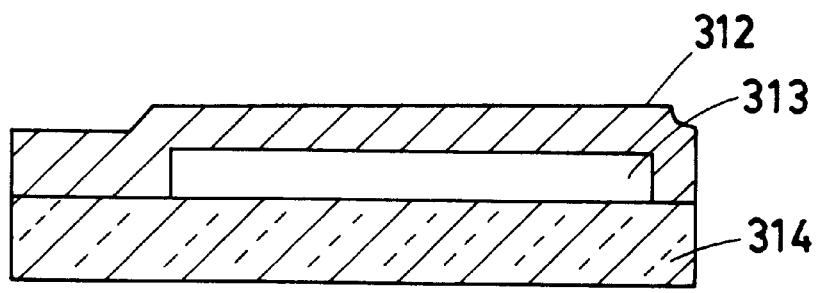
FIG. 30 is a diagram illustrating an ink layer as laminated on a raised pattern in the third pattern-forming method according to the present invention.

In the third pattern-forming method according to the present invention, as shown in FIG. 29, a transfer sheet S having an ink layer 312 on a base film 311 is laminated on a substrate K having a stripe-shaped raised pattern 313 such that the ink layer 312 comes in contact with the substrate K, thereby transferring the ink layer 312 onto the substrate K having the raised pattern 313. In this transfer process, the transfer sheet S is laminated by a thermal laminator R in the direction indicated by the arrow in FIG. 28(a), that is, in a direction parallel to the lengthwise direction of the stripes of the raised pattern 313, thereby transferring the ink layer 312. FIG. 30 shows the substrate K having the ink layer 312 transferred thereonto.

The ink layer 312 is transferred over the raised electrode pattern 313 in the state of being softened under heating by the thermal laminator R. At this time, because the transfer sheet S is laminated in a direction parallel to the lengthwise direction of the stripes of the raised electrode pattern 313, the ink layer 312 can be transferred without trapping air bubbles in the interface between the electrodes and the glass substrate in the lengthwise direction of the raised electrode pattern 313. The dielectric layer-forming layer formed by the transfer process is subjected to firing to form a dielectric layer. The third pattern-forming method makes it possible to form a dielectric layer without a transfer failure and enables the yield to be improved.

The arrangement may be such that a substrate is prepared by forming a primer layer on a glass substrate and forming electrodes on the primer layer, and a dielectric layer-forming layer is transferred onto the substrate in a direction parallel to the lengthwise direction of the stripe-shaped electrodes.

Although in the foregoing method the dielectric layer-forming layer 312 is transferred onto the glass substrate having the electrode layer 313, the pattern-forming method may be such that after a primer-forming layer and an electrode-forming layer, which have not yet been fired, have been successively formed on a glass substrate, a dielectric layer-forming layer is coated by a method of forming an ink layer over a raised pattern according to the present invention, and the primer-forming layer, the electrode-forming layer and the dielectric layer-forming layer are simultaneously fired. By this method, a PDP member can be fabricated with high efficiency.

It should be noted that to form a barrier-forming layer, the transfer sheet may be laminated in a direction parallel to the lengthwise direction of the stripes of the electrode pattern, but no particular problem will arise even if the transfer sheet is laminated in a direction perpendicular to the stripe direction.

The first transfer sheet according to the present invention will be described below by way of Examples 1 and 2.

EXAMPLE 1

Transfer Sheet for Forming a Dielectric Layer in a PDP

The following constituent materials were mixed and dispersed by using a bead mill to prepare a coating solution:

| | | |
|---|---|---|
| Glass frit {main components: $Bi_2O_3$, ZnO, and $B_2O_3$ (non-alkali); average particle diameter: 3 micrometers} | . . . | 70 parts by weight |
| $TiO_2$ | . . . | 3 parts by weight |
| $Al_2O_3$ | . . . | 7 parts by weight |
| (the above inorganic component mixture having a softening point of 570° C., Tg of 485° C. and a coefficient of thermal expansion $\alpha_{300} = 80 \times 10^{-7}/°$ C.) | | |
| n-butyl methacrylate/2-hydroxyethylhexyl methacrylate copolymer (8/2) | . . . | 10 parts by weight |
| Benzyl butyl phthalate | . . . | 7 parts by weight |
| Isopropyl alcohol | . . . | 15 parts by weight |
| Methyl ethyl ketone | . . . | 5 parts by weight |

The coating solution was coated on a polyethylene terephthalate film by comma coating and dried at 100° C. to form an ink layer with a thickness of 20±2 micrometers. Thereafter, a silicone-treated PET film (03-25-C, manufactured by Tokyo Serofan Co., Ltd.) was laminated on the ink layer to prepare a transfer sheet according to the present invention.

The obtained transfer sheet was subjected to a flexural test (JIS K5400 6.16, flexing resistance test). The transfer sheet resisted 10 millimeters, and the ink layer was not separated but favorably retained.

Next, the silicone-treated PET film was removed, and the transfer sheet was laminated on a glass substrate having electrodes under the transfer conditions that the preheated substrate temperature was 80° C. and the laminating roll temperature was 100° C., by using an auto-cutting laminator (Model ACL-9100, manufactured by Asahi Chemical Industry Co., Ltd.).

The polyethylene terephthalate film was removed, and firing was carried out at a peak temperature of 570° C. to form a dielectric layer. The thickness of the dielectric layer after the firing process was 10±1 micrometers. The dielectric layer had excellent surface smoothness.

EXAMPLE 2

Transfer Sheet for Forming a Primer Layer in a PDP)

The following constituent materials were mixed and dispersed by using a bead mill to prepare a coating solution:

The coating solution was coated on a polyethylene terephthalate film by roll coating and dried at 100° C. to form an ink layer with a thickness of 18±2 micrometers. Thereafter, a silicone-treated PET film (03-25-C, manufactured by Tokyo Serofan Co., Ltd.) was laminated on the ink layer to prepare a transfer sheet according to the present invention.

The obtained transfer sheet was subjected to a flexural test (JIS K5400 6.16, flexing resistance test). The transfer sheet resisted 10 millimeters, and the ink layer was not separated but favorably retained.

Next, the silicone-treated PET film was removed, and the transfer sheet was laminated on a glass substrate under the transfer conditions that the preheated substrate temperature was 60° C. and the laminating roll temperature was 100° C., by using an auto-cutting laminator (Model ACL-9100, manufactured by Asahi Chemical Industry Co., Ltd.).

The polyethylene terephthalate film was removed, and firing was carried out at a peak temperature of 600° C. to form a primer layer. The thickness of the primer layer after the firing process was 9±1 micrometers. The primer layer had excellent surface smoothness.

Next, the second transfer sheet according to the present invention will be described by way of Examples 3 to 5 and Comparative Example 1.

EXAMPLE 3

Transfer Sheet for Forming a Dielectric Layer

The following constituent materials were mixed and dispersed by using a bead mill to prepare a coating solution:

| | | |
|---|---|---|
| Glass frit {main components: PbO, $SiO_2$, and $B_2O_3$ (non-alkali); the glass frit having a softening point of 570° C., Tg of 480° C., a coefficient of thermal expansion $\alpha_{300} = 83 \times 10^{-7}/°$ C. and an average particle diameter of 1 micrometer} | . . . | 65 parts by weight |
| $Al_2O_3$ | . . . | 11 parts by weight |
| CuO | . . . | 4 parts by weight |
| Polymethyl methacrylate | . . . | 10 parts by weight |
| Dibutyl phthalate | . . . | 10 parts by weight |
| Isopropyl alcohol | . . . | 15 parts by weight |
| Methyl ethyl ketone | . . . | 10 parts by weight |

| | | |
|---|---|---|
| Glass frit {main components: $Bi_2O_3$, ZnO, and $B_2O_3$ (non-alkali); the glass frit having an average particle diameter of 3 micrometers and containing particles having a particle diameter not smaller than 20 micrometers in the proportion of 5% by weight} | ... | 70 parts by weight |
| $TiO_2$ (having an average particle diameter of 4 micrometers and containing particles having a particle diameter not smaller than 20 micrometers in the proportion of 5% by weight) | ... | 3 parts by weight |
| $Al_2O_3$ (having an average particle diameter of 4 micrometers and containing particles having a particle diameter not smaller than 20 micrometers in the proportion of 5% by weight) | ... | 7 parts by weight |
| (the above inorganic particle mixture having a softening point of 570° C., Tg of 485° C. and a coefficient of thermal expansion $\alpha_{300} = 80 \times 10^{-7}/°$ C.) | | |
| n-butyl methacrylate/2-hydroxyethylhexyl methacrylate copolymer (8/2) | ... | 10 parts by weight |
| Benzyl butyl phthalate | ... | 7 parts by weight |
| Propylene glycol monomethyl ether | ... | 20 parts by weight |

The coating solution was coated on a polyethylene terephthalate film by comma coating and dried at 100° C. to form an ink layer with a thickness of 20±2 micrometers. The surface of the ink layer thus formed was excellent in smoothness. A silicone-treated PET film (03-25-C, manufactured by Tokyo Serofan Co., Ltd.) was laminated on the surface of the ink layer to prepare a transfer sheet according to the present Invention.

The obtained transfer sheet was subjected to a flexural test (JIS K5400 6.16, flexing resistance test). The transfer sheet resisted 10 millimeters, and the ink layer was not separated but favorably retained.

Next, the silicone-treated PET film was removed, and the transfer sheet was laminated on a glass substrate having electrodes under the transfer conditions that the preheated substrate temperature was 80° C. and the laminating roll temperature was 100° C., by using an auto-cutting laminator (Model ACL-9100, manufactured by Asahi Chemical Industry Co., Ltd.).

The polyethylene terephthalate film was removed, and the transferability of the ink layer was confirmed by visual observation, an optical microscope and an electron microscope. It was confirmed that the ink layer had been transferred well without a transfer failure.

Next, firing was carried out at a peak temperature of 570° C. to form a dielectric layer. The thickness of the dielectric layer after the firing process was 10±1 micrometers. The dielectric layer had excellent surface smoothness.

EXAMPLE 4

Transfer Sheet for Forming a Primer Layer

The following constituent materials were mixed and dispersed by using a bead mill to prepare a coating solution:

| | | |
|---|---|---|
| Glass frit {main components: PbO, $SiO_2$, and $B_2O_3$ (non-alkali); the glass frit having a softening point of 570° C., Tg of 480° C., a coefficient of thermal expansion $\alpha_{300} = 83 \times 10^{-7}/°$ C. and an average particle diameter of 1 micrometer and containing particles having a particle diameter not smaller than 20 micrometers in the proportion of 5% by weight} | ... | 65 parts by weight |
| $Al_2O_3$ (having an average particle diameter of 1 micrometer and containing particles having a particle diameter not smaller than 20 micrometers in the proportion of 0% by weight) | ... | 11 parts by weight |
| CuO (having an average particle diameter of 1 micrometer and containing particles having a particle diameter not smaller than 20 micrometers in the proportion of 0% by weight) | ... | 4 parts by weight |
| Poly-2-ethylhexyl methacrylate | ... | 14 parts by weight |
| Dibutyl phthalate | ... | 10 parts by weight |
| Isopropyl alcohol | ... | 15 parts by weight |
| Methyl ethyl ketone | ... | 10 parts by weight |

The coating solution was coated on a polyethylene terephthalate film by roll coating and dried at 100° C. to form an ink layer with a thickness of 20±2 micrometers. The surface of the ink layer thus formed was excellent in smoothness. A silicone-treated PET film (03-25-C, manufactured by Tokyo Serofan Co., Ltd.) was laminated on the surface of the ink layer to prepare a transfer sheet according to the present invention.

The obtained transfer sheet was subjected to a flexural test (JIS K5400 6.16, flexing resistance test). The transfer sheet resisted 10 millimeters, and the ink layer was not separated but favorably retained.

Next, the silicone-treated PET film was removed, and the transfer sheet was laminated on a glass substrate under the transfer conditions that the preheated substrate temperature was 60° C. and the laminating roll temperature was 100° C., by using an auto-cutting laminator (Model ACL-9100, manufactured by Asahi Chemical Industry Co., Ltd.).

The polyethylene terephthalate film was removed, and the transferability of the ink layer was confirmed by visual observation, an optical microscope and an electron microscope. It was confirmed that the ink layer had been transferred well without trapping of air bubbles nor a transfer failure, and thus the ink layer was excellent in transferability.

Next, firing was carried out at a peak temperature of 600° C. to form a primer layer on the glass substrate. The thickness of the primer layer after the firing process was 9±1 micrometers. The primer layer had excellent surface smoothness.

EXAMPLE 5

Transfer Sheet for Forming an Electrode-Forming Layer

The following constituent materials were mixed to prepare a coating solution for forming an electrode-forming layer:

the electrode-forming layer thus formed was excellent in smoothness.

The electrode-forming transfer sheet prepared as described above was laminated at the electrode-forming layer side thereof on the primer-forming layer transfer-formed on the glass substrate in Example 4 by using a heated roll at 90° C., and then the polyethylene terephthalate film was removed.

Next, the resulting multilayer sheet was irradiated with ultraviolet rays at 700 mJ/cm$^2$ through a negative pattern mask for forming address electrodes of a PDP. Thereafter, the polyethylene terephthalate film was removed, and the electrode-forming layer was developed with a 0.5% aqueous solution of sodium carbonate to remove the unexposed portions.

The address electrodes thus obtained were confirmed by visual observation, an optical microscope and an electron microscope. It was confirmed that the address electrodes had no transfer failure and were excellent in transferability.

Next, the whole substrate was fired at 600° C. Thus, it was possible to form a primer layer having a thickness of 9 micrometers and a PDP address electrode pattern having a thickness of 6 micrometers and a width of 70 micrometers.

| | |
|---|---|
| Photosensitive resin (having the composition stated below) | ... 20 parts by weight |
| Silver powder (having an average particle diameter of 1 micrometer and containing particles having a particle diameter not smaller than 15 micrometers in the proportion of 0% by weight) | ... 70 parts by weight |
| Glass frit {main components: $Bi_2O_3$, $SiO_2$, and $B_2O_3$ (non-alkali); the glass frit having a softening point of 500° C. and an average particle diameter of 1 micrometer and containing particles having a particle diameter not smaller than 15 micrometers in the proportion of 0% by weight} | ... 5 parts by weight |
| Propylene glycol monomethyl ether | ... 20 parts by weight |
| (Composition of the photosensitive resin: | |
| Alkali-development type binder polymer (n-butyl methacrylate/2-hydroxypropyl methacrylate/methacrylic acid copolymer having 7 mol % of glycidyl acrylate added thereto; acid number: 100 mgKOH/g) | ... 100 parts by weight |
| Pentaerythritol tri/tetraacrylate | ... 60 parts by weight |
| Photo-initiator ("Irgacure 369", manufactured by Ciba Geigy) | ... 10 parts by weight) |

The coating solution was coated on a polyethylene terephthalate film by slit reverse coating to prepare an electrode-forming transfer sheet having an electrode-forming layer with an as-dried thickness of 15 micrometers. The surface of

COMPARATIVE EXAMPLE 1

The following constituent materials were mixed and dispersed by using a bead mill to prepare a coating solution:

| | |
|---|---|
| Glass frit {main components: $Bi_2O_3$, ZnO, and $B_2O_3$ (non-alkali); the glass frit having an average particle diameter of 5 micrometers and containing particles having a particle diameter not smaller than 20 micrometers in the proportion of 35% by weight} | ... 70 parts by weight |
| $TiO_2$ (having an average particle diameter of 7 micrometers and containing particles having a particle diameter not smaller than 20 micrometers in the proportion of 35% by weight) | ... 3 parts by weight |
| $Al_2O_3$ (having an average particle diameter of 7 micrometers and containing particles having a particle diameter not smaller than 20 micrometers in the proportion of 35% by weight) | ... 7 parts by weight |
| (the above inorganic particle mixture having a softening point of 570° C., Tg of 485° C. and a coefficient of | |

-continued

| | | |
|---|---|---|
| thermal expansion $\alpha_{300} = 80 \times 10^{-7}/°$ C.) | | |
| n-butyl methacrylate/2-hydroxyethylhexyl methacrylate copolymer (8/2) | . . . | 10 parts by weight |
| Benzyl butyl phthalate | . . . | 7 parts by weight |
| Isopropyl alcohol | . . . | 15 parts by weight |
| Methyl ethyl ketone | . . . | 5 parts by weight |

The coating solution was coated on a polyethylene terephthalate film by comma coating and dried at 100° C. to form an ink layer with a thickness of 20±2 micrometers. The surface of the ink layer thus formed was matted.

Next, the transfer sheet was laminated on a glass substrate having electrodes under the transfer conditions that the preheated substrate temperature was 80° C. and the laminating roll temperature was 100° C., by using an auto-cutting laminator (Model ACL-9100, manufactured by Asahi Chemical Industry Co., Ltd.). The polyethylene terephthalate film was removed, and the transferability of the ink layer was confirmed by visual observation, an optical microscope and an electron microscope. It was revealed that there were transfer failures on the surface of the transferred layer, and Comparative Example 1 could not be used as a transfer sheet.

Next, the third transfer sheet according to the present invention will be described by way of Examples 6 to 10.

EXAMPLE 6

A releasing material was prepared by using the following constituent materials:

| | | |
|---|---|---|
| Carnauba wax | . . . | 30 parts by weight |
| Isopropyl alcohol/water (1/1, weight ratio) | . . . | 70 parts by weight |

The releasing material was filled in the depressions 22a cut in the form of a primer pattern in the intaglio plate 22 shown in FIG. 10 by using a doctor. Thereafter, as shown in FIG. 10, a polyethylene terephthalate film (hereinafter referred to as "PET film") 11 was laminated on the intaglio plate 22, and the primer pattern-wise release layer 12 was transferred onto the PET film 11 by using the back-up roller 21. The intaglio plate used was a cylinder plate having depressions with a depth of 5 micrometers formed in the surface thereof by etching.

Meanwhile, the following constituent materials were mixed and dispersed by using a bead mill to prepare a coating solution:

The coating solution was coated on a PET film having the above-described primer pattern-wise release layer 12 by roll coating and dried at 100° C. to form a primer-forming layer with a thickness of 18±2 micrometers. A protective film was stuck onto the primer-forming layer to prepare a first transfer sheet according to the present invention.

Next, the protective film was removed, and the transfer sheet was laminated on a glass substrate under the transfer conditions that the preheated substrate temperature was 60° C. and the laminating roll temperature was 70° C., by using an auto-cutting laminator (Model ACL-7100, manufactured by Asahi Chemical Industry Co., Ltd.).

As the PET film was removed, it was found that the primer-forming layer had been pattern-wise transferred excellently. Firing was carried out at a peak temperature of 600° C. to form a primer layer. The thickness of the primer layer after the firing process was 9±1 micrometers. The primer layer had excellent surface smoothness.

EXAMPLE 7

A releasing material prepared in the same way as in Example 6 was filled in the depressions 22a cut in the form of an address electrode pattern in the intaglio plate 22 shown in FIG. 10. Thereafter, an electrode pattern-wise release layer 12 was transferred onto a PET film 11 in the same way as in Example 6. The intaglio plate used was a cylinder plate having depressions with a depth of 5 micrometers formed in the surface thereof by etching.

Meanwhile, the following ink materials were mixed and dispersed by using a three-roll mill to prepare a paste for forming an electrode-forming layer:

| | | |
|---|---|---|
| Glass frit {main components: PbO, $SiO_2$, and $B_2O_3$ (non-alkali); the glass frit having a softening point of 570° C., Tg of 480° C., a coefficient of thermal expansion $\alpha_{300} = 83 \times 10^{-7}/°$ C. and an average particle diameter of 1 micrometer} | . . . | 65 parts by weight |
| $Al_2O_3$ | . . . | 11 parts by weight |
| CuO | . . . | 4 parts by weight |
| Poly-n-butyl methacrylate | . . . | 10 parts by weight |
| Dibutyl phthalate | . . . | 10 parts by weight |
| Isopropyl alcohol | . . . | 15 parts by weight |
| Methyl ethyl ketone | . . . | 10 parts by weight |

| | | |
|---|---|---|
| Silver powder (spherical and having an average particle diameter of 1 micrometer) | ... | 70 parts by weight |
| Glass frit (main components: $Bi_2O_3$, $SiO_2$, and $B_2O_3$; the glass frit having a softening point of 500° C. and a coefficient of thermal expansion $\alpha_{300} = 75 \times 10^{-7}/°$ C.) | ... | 5 parts by weight |
| Organic component (Composition of the organic component: | ... | 18 parts by weight |
| Poly-n-butyl methacrylate | ... | 100 parts by weight |
| Polyester plasticizer (RS-107, manufactured by Asahi Denka Kogyo K.K.) | ... | 100 parts by weight |
| Propylene glycol monomethyl ether | ... | 15 parts by weight) |

The paste for forming an electrode-forming layer was coated on a PET film having the above-described electrode pattern-wise release layer 12 by gravure reverse coating method and dried at 100° C. to form an electrode-forming layer having a thickness of 15 micrometers. A protective film was stuck onto the electrode-forming layer to prepare a first transfer sheet according to the present invention.

Next, the protective film was removed, and the transfer sheet was laminated on a glass substrate having a primer layer under the transfer conditions that the preheated substrate temperature was 60° C. and the laminating roll temperature was 70° C., by using an auto-cutting laminator (Model ACL-7100, manufactured by Asahi Chemical Industry Co., Ltd.).

As the PET film was removed, it was found that the electrode-forming layer had been transferred well in the form of an address electrode pattern.

The laminated structure was fired at a peak temperature of 570° C. to form a pattern-wise electrode layer. The thickness of the electrode layer after the firing process was 6±1 micrometers.

EXAMPLE 8

A releasing material prepared in the same way as in Example 6 was filled in the depressions 22a cut in the form of a dielectric layer pattern in the intaglio plate 22 shown in FIG. 10. Thereafter, a dielectric pattern-wise release layer 12 was transferred onto a PET film 11 in the same way as in Example 6. The intaglio plate used was a cylinder plate having depressions with a depth of 5 micrometers formed in the surface thereof by etching.

Meanwhile, the following constituent materials were mixed and dispersed by using a bead mill to prepare a coating solution:

The coating solution was coated on a PEP film having the above dielectric layer pattern-wise release layer 12 by comma coating and dried at 100° C. to form a dielectric layer-forming layer with a thickness of 20±2 micrometers. A protective film was stuck onto the dielectric layer-forming layer to prepare a first transfer sheet according to the present invention.

After the protective film had been removed, the transfer sheet was laminated on a glass substrate having electrodes under the transfer conditions that the preheated substrate temperature was 60° C. and the laminating roll temperature was 60° C., by using an auto-cutting laminator (Model ACL-7100, manufactured by Asahi Chemical Industry Co., Ltd.).

As the PET film was removed, it was found that the dielectric layer-forming layer had been pattern-wise transferred excellently.

The laminated structure was fired at a peak temperature of 570° C. to form a dielectric layer. The thickness of the dielectric layer after the firing process was 10±1 micrometers. The surface of the dielectric layer was excellent in smoothness.

EXAMPLE 9

The following ink materials were mixed and dispersed by using a three-roll mill to prepare a paste for forming an electrode-forming layer:

| | | |
|---|---|---|
| Glass frit {main components: $Bi_2O_3$, ZnO, and $B_2O_3$ (non-alkali); average particle diameter: 3 micrometers} | ... | 70 parts by weight |
| $TiO_2$ | ... | 3 parts by weight |
| $Al_2O_3$ | ... | 7 parts by weight |
| (the above inorganic component mixture having a softening point of 570° C., Tg of 485° C. and a coefficient of thermal expansion $\alpha_{300} = 80 \times 10^{-7}/°$ C.) | | |
| n-butyl methacrylate/2-hydroxyethylhexyl methacrylate copolymer (8/2, weight ratio) | ... | 15 parts by weight |
| Benzyl butyl phthalate | ... | 10 parts by weight |
| Isopropyl alcohol | ... | 15 parts by weight |
| Methyl ethyl ketone | ... | 5 parts by weight |

| | | |
|---|---|---|
| Silver powder (spherical and having an average particle diameter of 1 micrometer) | . . . | 70 parts by weight |
| Glass frit (main components: $Bi_2O_3$, $SiO_2$, and $B_2O_3$; the glass frit having a softening point of 580° C. and a coefficient of thermal expansion $\alpha_{300}$ =75 × $10^{-7}$/° C.) | . . . | 5 parts by weight |
| Curable resin (Composition of the curable resin: | . . . | 15 parts by weight |
| Polybutyl acrylate | . . . | 100 parts by weight |
| Polyoxyethylated trimethylolpropane triacrylate | . . . | 60 parts by weight |
| Photo-initiator ("Irgacure 369", manufactured by Ciba Geigy) | . . . | 10 parts by weight) |

The paste for forming an electrode-forming layer was coated on a PET film by three-roll reverse coating method and dried at 100° C. to form an electrode-forming layer having a thickness of 15 micrometers.

Meanwhile, as shown in FIG. 11, depressions having a depth of 20 micrometers were cut in a cylinder plate in a the form of an address electrode pattern. Thereafter, the depressions were filled with an adhesive material having the following composition by using a doctor.

(Composition of the adhesive material)

| | | |
|---|---|---|
| Poly-n-butyl laurate | . . . | 20 parts by weight |
| Methyl ethyl ketone/toluene (1/1, weight ratio) | . . . | 80 parts by weight |

Thereafter, an electrode pattern-wise adhesive layer 14 was transfer-formed on the PET film having the electrode-forming layer prepared as described above, and a protective film was laminated on the adhesive layer to prepare a second transfer sheet according to the present invention.

Next, the protective film was removed, and the transfer sheet was laminated on a glass substrate having a primer layer under the transfer conditions that the preheated substrate temperature was 60° C. and the laminating roll temperature was 60° C., by using an auto-cutting laminator (Model ACL-7100, manufactured by Asahi Chemical Industry Co., Ltd.).

As the PET film was removed, it was found that the electrode-forming layer had been transferred well in the form of an address electrode pattern.

The laminated structure was fired at a peak temperature of 570° C. to form a pattern-wise electrode layer. The thickness of the electrode layer after the firing process was 6±1 micrometers.

EXAMPLE 10

As shown in FIG. 11, depressions having a depth of 20 micrometers were cut in a cylinder plate in the form of an address electrode pattern. Thereafter, the depressions were filled with an adhesive material having the following composition by using a doctor.

(Composition of the adhesive material)

| | | |
|---|---|---|
| Poly-n-butyl acrylate | . . . | 20 parts by weight |
| Methyl ethyl ketone/toluene (1/1, weight ratio) | . . . | 80 parts by weight |

Thereafter, an adhesive layer was transferred onto a protective film (PET film having releasability) in the form of an electrode pattern.

Then, the protective film was laminated at the adhesive layer side thereof on the electrode-forming layer of the electrode-forming layer transfer sheet prepared in Example 7, which consisted essentially of the base film, the electrode pattern-wise release layer and the electrode-forming layer, such that the pattern of the release layer and the pattern of the adhesive layer were coincident with each other, thereby obtaining a third transfer sheet according to the present invention.

After the protective film had been removed, the transfer sheet was laminated on a glass substrate having a primer layer under the transfer conditions that the preheated substrate temperature was 80° C. and the laminating roll temperature was 100° C., by using an auto-cutting laminator (Model ACL-7100, manufactured by Asahi Chemical Industry Co., Ltd.).

As the PET film was removed, it was found that the electrode-forming layer had been transferred well in the form of an address electrode pattern.

The laminated structure was fired at a peak temperature of 570° C. to form a pattern-wise electrode layer. The thickness of the electrode layer after the firing process was 6±1 micrometers.

The fourth to thirteenth transfer sheets according to the present invention will be described by way of Examples 11 to 22.

EXAMPLE 11

Preparation of the Fourth Transfer Sheet Shown in FIG. 12

(Formation of dielectric layer-forming layer)

The following constituent materials were mixed and dispersed by using a bead mill to prepare a coating solution:

| | | |
|---|---|---|
| Glass frit {main components: $Bi_2O_3$, ZnO, and $B_2O_3$ (non-alkali); average particle diameter: 3 micrometers} | . . . | 70 parts by weight |
| $TiO_2$ | . . . | 3 parts by weight |
| $Al_2O_3$ | . . . | 7 parts by weight |

-continued

| | | |
|---|---|---|
| (the above inorganic component mixture having a softening point of 570° C., Tg of 485° C. and a coefficient of thermal expansion $\alpha_{300} = 80 \times 10^{-7}/°$ C.) | | |
| n-butyl methacrylate/2-hydroxyethylhexyl methacrylate copolymer (8/2) | . . . | 10 parts by weight |
| Benzyl butyl phthalate | . . . | 7 parts by weight |
| Isopropyl alcohol | . . . | 15 parts by weight |
| Methyl ethyl ketone | . . . | 5 parts by weight |

The coating solution was coated on a polyethylene terephthalate film (hereinafter referred to as "PET film") by comma coating and dried at 100° C. to form a dielectric layer-forming layer with a thickness of 20±2 micrometers.

(Formation of pattern-wise electrode-forming layer)

The following ink materials were mixed and dispersed by using a three-roll mill to prepare a paste for forming an electrode-forming layer:

| | | |
|---|---|---|
| Silver powder (spherical and having an average particle diameter of 1 micrometer) | . . . | 70 parts by weight |
| Glass frit (main components: $Bi_2O_3$, $SiO_2$, and $B_2O_3$; the glass frit having a softening point of 500° C. and a coefficient of thermal expansion $\alpha_{300} = 75 \times 10^{-7}/°$ C.) | . . . | 5 parts by weight |
| Curable resin | . . . | 15 parts by weight |
| (Composition of the curable resin: | | |
| Polybutyl acrylate | . . . | 100 parts by weight |
| Polyoxyethylated trimethylolpropane triacrylate | . . . | 60 parts by weight |
| Photo-initiator ("Irgacure 369", manufactured by Ciba Geigy) | . . . | 10 parts by weight) |

The paste for forming an electrode-forming layer was filled in the depressions 22a cut in the intaglio plate 22 in the form of an electrode pattern as shown in FIG. 22, by using a doctor. Thereafter, a PET film having releasability was laminated at the releasable surface side thereof on the intaglio plate 22, and a pattern-wise electrode-forming layer 12b was transferred onto the PET film by using the back-up roller 21, thereby preparing a transfer film. The intaglio plate used was a soda-lime glass plate having depressions with a depth of 20 micrometers formed thereon by etching.

The transfer film thus obtained was laminated at the electrode-forming layer side thereof on the above-described dielectric layer-forming layer, and the PET film was removed, thereby forming an electrode-forming layer having a line width of 50 micrometers and a pitch of 200 micrometers on the dielectric layer-forming layer. Then, a polyethylene film (hereinafter referred to as "PE film") was laminated on the electrode-forming layer to prepare a fourth transfer sheet according to the present invention.

The PE film was removed, and the transfer sheet was laminated on a glass substrate having a primer layer under the transfer conditions that the preheated substrate temperature was 80° C. and the laminating roll temperature was 100° C., by using an auto-cutting laminator (Model ACL-9100, manufactured by Asahi Chemical Industry Co., Ltd.). Then, the PET film was removed.

The laminated structure was fired at a peak temperature of 570° C., thereby simultaneously forming a pattern-wise electrode layer and a dielectric layer. The thickness of the electrode layer after the firing process was 6±1 micrometers, and the thickness of the dielectric layer was 10±1 micrometer. The surface of the dielectric layer was excellent in smoothness.

EXAMPLE 12

Preparation of the Fourth Transfer Sheet Shown in FIG. 12

Materials for forming an electrode-forming layer having the composition shown in Example 11 were mixed and dispersed by using a roll mill to prepare a paste for forming an electrode-forming layer. The paste was loaded into the apparatus shown in FIG. 23. A PET film having releasability was used as a transfer substrate, and ultraviolet-light irradiation (600 mJ/cm²) was used as a radiation source, thereby obtaining a transfer film having an electrode pattern with a line width of 70 micrometers and a pitch of 220 micrometers on the PET film. The roll intaglio had such a structure that the surface of an iron core was provided with a depression pattern formed of copper, covered with chromium, and provided with a silicone layer.

The transfer film thus obtained was laminated at the electrode pattern side thereof on the dielectric layer-forming layer (having a thickness of 20±2 micrometers) formed in Example 11, thereby forming an electrode-forming layer having a line width of 70 micrometers and a pitch of 220 micrometers on the dielectric layer-forming layer. Then, a PE film was laminated on the electrode-forming layer to prepare a fourth transfer sheet according to the present invention.

The PE film was removed, and the transfer sheet was laminated on a glass substrate having a primer layer under the transfer conditions that the preheated substrate temperature was 80° C. and the laminating roll temperature was 100° C., by using an auto-cutting laminator (Model ACL-9100, manufactured by Asahi Chemical Industry Co., Ltd.).

Then, the PET film was removed, and firing was carried out at a peak temperature of 570° C., thereby simultaneously forming a pattern-wise electrode layer and a dielectric layer. The thickness of the electrode layer after the firing process was 7±1 micrometers, and the thickness of the dielectric layer was 10±1 micrometers. The surface of the dielectric layer was excellent in smoothness.

EXAMPLE 13

Figure 13:
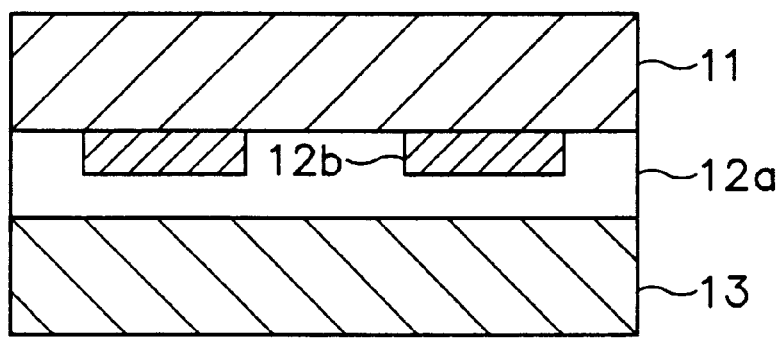
FIG. 13 is a sectional view illustrating a fifth transfer sheet according to the present invention.

Preparation of the Fifth Transfer Sheet Shown in FIG. 13

(Formation of pattern-wise electrode-forming layer)

Materials for forming an electrode-forming layer having the composition shown in Example 11 were mixed and dispersed by using a roll mill to prepare a paste for forming an electrode-forming layer. The paste was printed on a PET film by using an intaglio plate similar to that in Example 11, thereby forming a pattern-wise electrode-forming layer having a line width of 50 micrometers, a pitch of 200 micrometers and a thickness of 10±1 micrometers.

(Formation of primer-forming layer)

The following constituent materials were mixed and dispersed by using a bead mill to prepare a coating solution:

| | |
|---|---|
| Glass frit {main components: PbO, SiO$_2$, and B$_2$O$_3$ (non-alkali); the glass frit having a softening point of 570° C., Tg of 480° C., a coefficient of thermal expansion $\alpha_{300}$ = 83 × 10$^{-7}$/° C. and an average particle diameter of 1 micrometer} | 65 parts by weight |
| Al$_2$O$_3$ | 11 parts by weight |
| CuO | 4 parts by weight |
| Polymethyl methacrylate | 10 parts by weight |
| Dibutyl phthalate | 10 parts by weight |
| Isopropyl alcohol | 15 parts by weight |
| Methyl ethyl ketone | 10 parts by weight |

The coating solution was coated on the pattern-wise electrode-forming layer formed as described above by roll coating and dried at 100° C. to form a primer-forming layer with a thickness of 18±2 micrometers. Thereafter, a PE film was laminated on the primer-forming layer to prepare a fifth transfer sheet according to the present invention.

Then, the PE film was removed, and the transfer sheet was laminated on a glass substrate under the transfer conditions that the preheated substrate temperature was 60° C. and the laminating roll temperature was 100° C., by using an auto-cutting laminator (Model ACL-9100, manufactured by Asahi Chemical Industry Co., Ltd.).

The PET film was removed, and firing was carried out at a peak temperature of 600° C., thereby simultaneously forming a primer layer and a pattern-wise electrode layer. The thickness of the primer layer after the firing process was 9±1 micrometers, and the thickness of the pattern-wise electrode layer was 6±1 micrometers.

EXAMPLE 14

Figure 14:
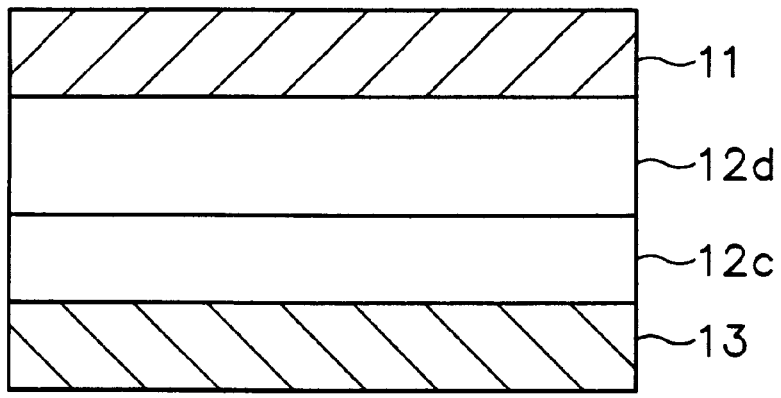
FIG. 14 is a sectional view illustrating a sixth transfer sheet according to the present invention.

Preparation of the Sixth Transfer Sheet Shown in FIG. 14

(Formation of barrier-forming layer)

The following constituent materials were mixed and dispersed in a bead mill using ceramic beads to prepare a coating solution:

| | |
|---|---|
| Glass frit (MB-008, manufactured by Matsunami Glass Kogyo K.K.) | 65 parts by weight |
| α-alumina RA-40 (manufactured by Iwatani Kagaku Kogyo K.K.) | 10 parts by weight |
| Dipyroxide Black #9510 (manufactured by Dainichi Seika Kogyo K.K.) | 10 parts by weight |
| Ethyl cellulose | 4 parts by weight |
| Bis(2-ethylhexyl) phthalate | 4 parts by weight |
| Dimethyl phthalate | 8.5 parts by weight |
| Propylene glycol monomethyl ether | 5 parts by weight |
| Isopropyl alcohol | 20 parts by weight |

The coating solution was coated by die coating on a PET film treated to be releasable and dried at 120° C. to form a barrier-forming layer having a thickness of 180 micrometers.

(Formation of dielectric layer-forming layer)

The following constituent materials were mixed and dispersed by using a bead mill to prepare a coating solution:

| | | |
|---|---|---|
| Glass frit {main components: $Bi_2O_3$, ZnO, and $B_2O_3$ (non-alkali); average particle diameter: 3 micrometers} | ... | 70 parts by weight |
| $TiO_2$ | ... | 3 parts by weight |
| $Al_2O_3$ | ... | 7 parts by weight |
| (the above inorganic component mixture having a softening point of 570° C., Tg of 485° C. and a coefficient of thermal expansion $\alpha_{300} = 80 \times 10^{-7}/°$ C.) | | |
| n-butyl methacrylate/2-hydroxyethylhexyl methacrylate copolymer (8/2) | ... | 10 parts by weight |
| Benzyl butyl phthalate | ... | 7 parts by weight |
| Propylene glycol monomethyl ether | ... | 20 parts by weight |

The coating solution was coated on the barrier-forming layer obtained as described above and dried at 100° C. to form a dielectric layer-forming layer with a thickness of 20±2 micrometers. Further, a PE film was laminated on the dielectric layer-forming layer to prepare a sixth transfer sheet according to the present invention.

The PE film was removed from the transfer sheet for PDP fabrication prepared as described above, and the transfer sheet was laminated on a PDP member having a primer layer and an electrode layer on a glass substrate under the transfer conditions that the preheated substrate temperature was 60° C. and the laminating roll temperature was 120° C., by an auto-cutting laminator (Model ACL-900, manufactured by Asahi Chemical Industry Co., Ltd.) using a heated roll.

After the PET film had been removed, the PDP member thus prepared was held in an oven at 200° C. for 20 minutes to remove the plasticizer. Thereafter, a negative dry film resist (NCP225, manufactured by Nippon Synthetic Chemical Industry Co., Ltd.; 25 micrometers) having a protective film was laminated on the barrier-forming layer by using a heated roll at 120° C.

Next, a line pattern mask having a line width of 80 micrometers and a pitch of 220 micrometers was disposed over the resist layer having a protective film while alignment was carried out. After the resist layer had been irradiated with ultraviolet rays (364 nanometers; intensity: 200 $\mu W/cm^2$; dose: 120 $mJ/cm^2$), the protective film was removed from the photoresist layer, and spray development was carried out by using a 1 wt % aqueous solution of sodium carbonate at a temperature of 30° C. Thus, a resist pattern corresponding to the line pattern mask was obtained.

Then, with the resist pattern used as a mask, the barrier-forming layer in the openings of the resist pattern was subjected to sand blasting by using a sand blasting machine. After the sand blasting, the dielectric layer-forming layer was observed. It was found that the dielectric layer-forming layer was only slightly etched by the sand blasting process and had the desired thickness, and none of the electrodes were exposed.

Then, the resist pattern was removed by spraying with a 2 wt % aqueous solution of sodium hydroxide at a temperature of 30° C. After rinsing, the PDP member was dried in an oven at 80° C. for 15 minutes. Finally, the PDP member was fired at a peak temperature of 570° C., thereby simultaneously forming a dielectric layer and a barrier layer.

The dielectric layer thus obtained had a thickness of 20 micrometers, and the barrier layer had a line width of 50 micrometers and a height of 120 micrometers. The height of the barrier layer was uniform, and the surface of the barrier layer was excellent in smoothness. No defect was recognized in any part of the barrier layer.

EXAMPLE 15

Figure 15:
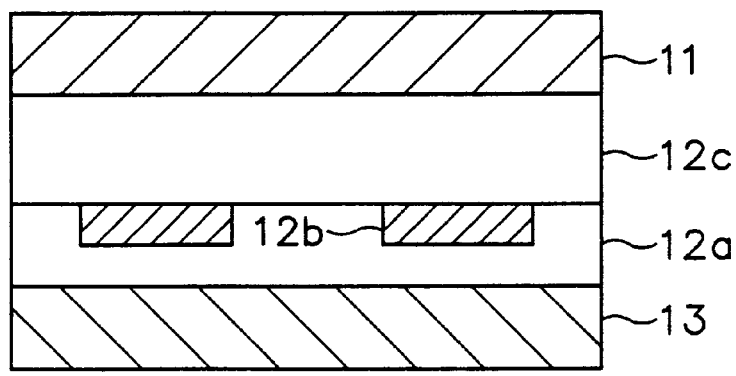
FIG. 15 is a sectional view illustrating a seventh transfer sheet according to the present invention.

Preparation of the Seventh Transfer Sheet Shown in FIG. 15

A primer-forming layer (thickness: 18±2 micrometers) was formed in the same way as in Example 13 over the dielectric layer-forming layer (thickness: 20±2 micrometers) and the pattern-wise electrode-forming layer (thickness: 10 micrometers) formed in Example 11, and a PE film was stuck onto the primer-forming layer to prepare a seventh transfer sheet according to the present invention.

Then, the PE film was removed, and the transfer sheet was laminated on a glass substrate under the transfer conditions that the preheated substrate temperature was 80° C. and the laminating roll temperature was 100° C., by using an auto-cutting laminator (Model ACL-9100, manufactured by Asahi Chemical Industry Co., Ltd.).

The PET film was removed, and firing was carried out at a peak temperature of 570° C., thereby forming a primer layer, a pattern-wise electrode layer and a dielectric layer. The thickness of the primer layer after the firing process was 9±1 micrometers; the thickness of the electrode layer was 6±1 micrometers; and the thickness of the dielectric layer was 10±1 micrometers. The surface of the dielectric layer was excellent in smoothness.

EXAMPLE 16

Figure 16:
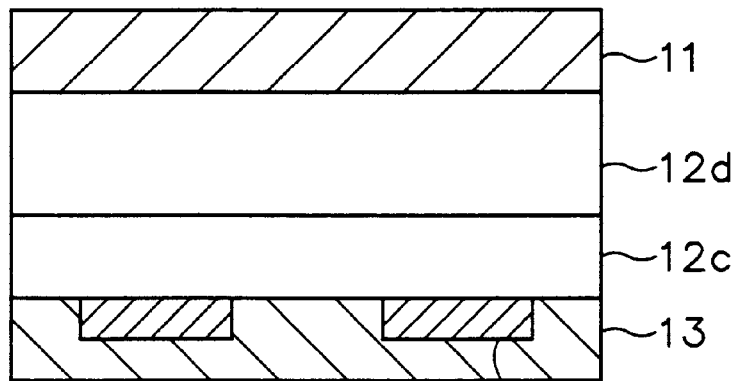
FIG. 16 is a sectional view illustrating an eighth transfer sheet according to the present invention.

Preparation of the Eighth Transfer Sheet Shown in FIG. 16

A pattern-wise electrode layer (thickness: 10 micrometers) was formed in the way as in Example 11 over the barrier-forming layer (thickness: 180 micrometers) and the dielectric layer-forming layer (thickness: 20±2 micrometers) formed in the preparation of the transfer sheet in Example 14, and a PE film was stuck onto the electrode-forming layer to prepare an eighth transfer sheet according to the present invention.

Then, the PE film was removed, and the transfer sheet was laminated on a PDP member comprising a glass substrate having a primer layer under the transfer conditions that the preheated substrate temperature was 80° C. and the laminating roll temperature was 100° C., by using an auto-cutting laminator (Model ACL-9100, manufactured by Asahi Chemical Industry Co., Ltd.).

The PET film was removed, and the barrier-forming layer was patterned in the same way as in Example 14. Thereafter, firing was carried out at a peak temperature of 570° C., thereby forming a pattern-wise electrode layer, a dielectric layer and a barrier layer. The thickness of the electrode layer after the firing process was 6±1 micrometers, and the thickness of the dielectric layer was 10+1 micrometers. The barrier layer had a line width of 50 micrometers and a height of 120 micrometers. The height of the barrier layer thus obtained was uniform, and the surface of the barrier layer was excellent in smoothness. Moreover, no defect was recognized in any part of the barrier layer.

EXAMPLE 17

Figure 17:
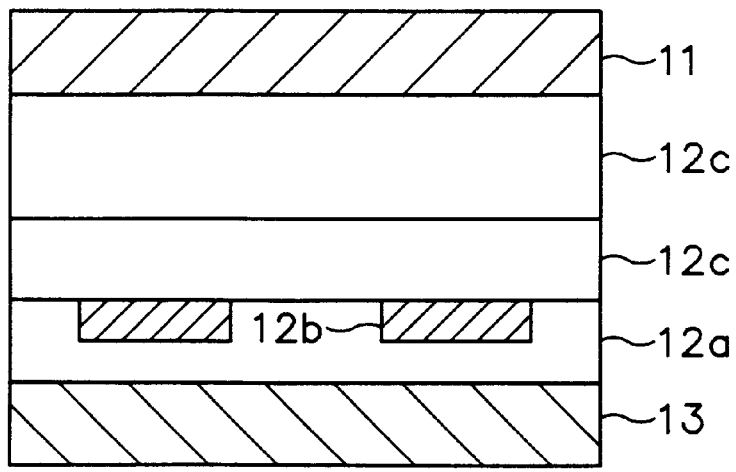
FIG. 17 is a sectional view illustrating a ninth transfer sheet according to the present invention.

Preparation of the Ninth Transfer Sheet Shown in FIG. 17

A primer-forming layer (thickness: 18±2 micrometers) was formed in the same way as in Example 13 over the barrier-forming layer (thickness: 180 micrometers), the dielectric layer-forming layer (thickness: 20±2 micrometers) and the pattern-wise electrode-forming layer (thickness: 10 micrometers) formed in Example 16, and a PE film was stuck onto the primer-forming layer to prepare a ninth transfer sheet according to the present invention.

Then, the PE film was removed, and the transfer sheet was laminated on a glass substrate as a PDP member under the transfer conditions that the preheated substrate temperature was 80° C. and the laminating roll temperature was 100° C., by using an auto-cutting laminator (Model ACL-9100, manufactured by Asahi Chemical Industry Co., Ltd.).

The PET film was removed, and the barrier-forming layer was patterned in the same way as in Example 14. Thereafter, firing was carried out at a peak temperature of 570° C., thereby forming a primer layer, a pattern-wise electrode layer, a dielectric layer and a barrier layer. The thickness of the primer layer after the firing process was 9±1 micrometers; the thickness of the electrode layer was 6±1 micrometers; and the thickness of the dielectric layer was 10±1 micrometers. The barrier layer had a line width of 50 micrometers and a height of 120 micrometers. The height of the barrier layer thus obtained was uniform, and the surface of the barrier layer was excellent in smoothness. Moreover, no defect was recognized in any part of the barrier layer.

EXAMPLE 18

Figure 18:
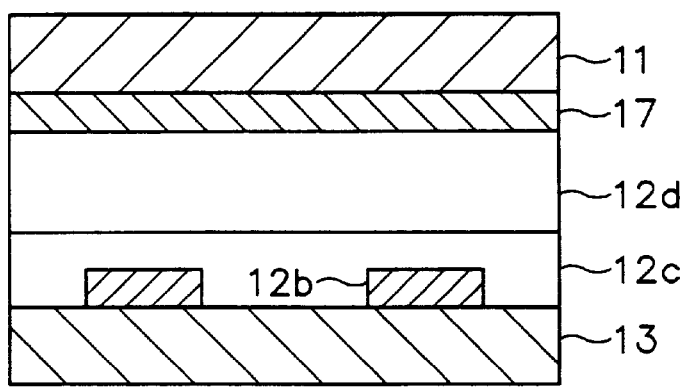
FIG. 18 is a sectional view illustrating a tenth transfer sheet according to the present invention.

Preparation of the Tenth Transfer Sheet Shown in FIG. 18

(Formation of pattern-wise electrode-forming layer)

Materials for forming an electrode-forming layer having the composition shown in Example 11 were mixed and dispersed by using a roll mill to prepare a paste for forming an electrode-forming layer. The paste was printed on a PET film by using an intaglio plate similar to that in Example 11, thereby forming a pattern-wise electrode-forming layer having a line width of 50 micrometers, a pitch of 200 micrometers and a thickness of 10±1 micrometers.

A dielectric layer-forming layer was formed on the electrode-forming layer as in the case of the dielectric layer-forming layer described in Example 14.

(Formation of barrier-forming layer)

The following constituent materials were mixed and dispersed in a bead mill using ceramic beads to prepare a coating solution:

The coating solution was coated on the dielectric layer-forming layer by die coating and dried at 120° C. to form a barrier-forming layer having a thickness of 180 micrometers.

Further, a PET film having a negative dry film resist (NCP225, manufactured by Nippon Synthetic Chemical Industry Co., Ltd.; 25 micrometers) stacked thereon was laminated at the resist side thereof on the barrier-forming layer by using a heated roll at 120° C., thereby preparing a tenth transfer sheet according to the present invention in which the photoresist layer, the barrier-forming layer (thickness: 180 micrometers), the dielectric layer-forming layer (thickness: 20±2 micrometers), the pattern-wise electrode-forming layer (thickness: 10 micrometers) and the PET film were successively stacked on the PET film.

The PET film on the pattern-wise electrode-forming layer side thereof was removed, and the transfer sheet was laminated on a PDP member having a primer layer on a glass substrate under the transfer conditions that the preheated substrate temperature was 60° C. and the laminating roll temperature was 120° C., by an auto-cutting laminator (Model ACL-900, manufactured by Asahi Chemical Industry Co., Ltd.) using a heated roll.

A resist pattern was obtained on the PDP member thus obtained in the same way as in Example 14. Then, the barrier-forming layer was similarly subjected to sand blasting.

After the resist pattern had been similarly removed, the PDP member was fired at a peak temperature of 570° C., thereby simultaneously forming an electrode layer, a dielectric layer and a barrier layer. The thickness of the electrode layer was 6±1 micrometers, and the thickness of the dielectric layer was 20 micrometers. The barrier layer had a line width of 50 micrometers and a height of 120 micrometers. The height of the barrier layer was uniform, and the surface of the barrier layer was excellent in smoothness. Moreover, no defect was recognized in any part of the barrier layer.

EXAMPLE 19

Preparation of the Tenth Transfer Sheet Shown in FIG. 18

The following constituent materials were kneaded and dispersed by using a three-roll mill to prepare a coating solution:

| | |
|---|---|
| Glass frit (MB-008, manufactured by Matsunami Glass Kogyo K.K.) | 65 parts by weight |
| α-alumina RA-40 (manufactured by Iwatani Kagaku Kogyo K.K.) | 10 parts by weight |
| Dipyroxide Black #9510 (manufactured by Dainichi Seika Kogyo K.K.) | 10 parts by weight |
| Ethyl cellulose | 3 parts by weight |
| Propylene glycol monomethyl ether | 5 parts by weight |
| Isopropyl alcohol | 20 parts by weight |

| | |
|---|---|
| Glass frit (MB-010, manufactured by Matsunami Glass Kogyo K.K.) | 65 parts by weight |
| α-alumina RA-40 (manufactured by Iwatani Kagaku Kogyo K.K.) | 10 parts by weight |
| Dipyroxide Black #9510 (manufactured by Dainichi Seika Kogyo K.K.) | 10 parts by weight |
| Propylene glycol monomethyl ether | 20 parts by weight |
| Photosensitive resin (Composition of the photosensitive resin: | 20 parts by weight |
| Methyl methacrylate/methacrylate acid copolymer having an acid number of 100 mgKOH/g) | 100 parts by weight |
| Polyoxyethylated trimethylolpropane triacrylate | 70 parts by weight |
| Photo-initiator ("Irgacure 907", manufactured by Ciba Geigy) | 10 parts by weight) |

The coating solution was coated on the barrier-forming layer in the laminated structure prepared in Example 18, which consisted essentially of the PET film, the pattern-wise electrode-forming layer, the dielectric layer-forming layer and the barrier-forming layer by comma coating and dried at 100° C. to form a photosensitive black barrier-forming layer having a thickness of 30 micrometers. Further, a PET film was stuck onto the barrier-forming layer to prepare a tenth transfer sheet according to the present invention.

The transfer sheet had a stack structure in which the photosensitive black barrier-forming layer (thickness: 30 micrometers), the barrier-forming layer (thickness: 180 micrometers), the dielectric layer-forming layer (thickness: 20±2 micrometers), the pattern-wise electrode-forming layer (thickness: 10 micrometers) and the PET film were successively stacked on the PET film.

The PET film on the pattern-wise electrode-forming layer side of the transfer sheet was removed, and the transfer sheet was laminated on a PDP having a primer layer on a glass substrate under the transfer conditions that the preheated substrate temperature was 60° C. and the laminating roll temperature was 120° C., by an auto-cutting laminator (Model ACL-900, manufactured by Asahi Chemical Industry Co., Ltd.) using a heated roll.

Then, a line pattern mask having a line width of 80 micrometers and a pitch of 220 micrometers was disposed over the photosensitive black barrier-forming layer with the PET film interposed therebetween while alignment was carried out. Then, the photosensitive black barrier-forming layer was irradiated with ultraviolet rays (365 nanometers; dose: 500 mJ/cm$^2$). Thereafter, spray development was carried out by using a 1 wt % aqueous solution of sodium carbonate, thereby obtaining a pattern of photosensitive black barrier-forming layer corresponding to the line pattern mask. With this pattern used as a mask, the barrier-forming layer was subjected to sand blasting. After the sand blasting, the photosensitive black barrier layer and the dielectric layer-forming layer were observed. No adverse effect of the sand blasting was recognized in these layers.

Then, the PDP member thus obtained was fired at a peak temperature of 570° C., thereby simultaneously forming an electrode layer, a dielectric layer and a barrier layer. The electrode layer thus obtained had a thickness of 6±1 micrometers, and the dielectric layer had a thickness of 20 micrometers. The barrier layer had a line width of 60 micrometers and a height of 130 micrometers. The barrier layer included black barriers having a height of 15 micrometers. The height of the barrier layer was uniform, and the surface of the barrier layer was excellent in smoothness. No defect was recognized in any part of the barrier layer.

EXAMPLE 20

Figure 19:
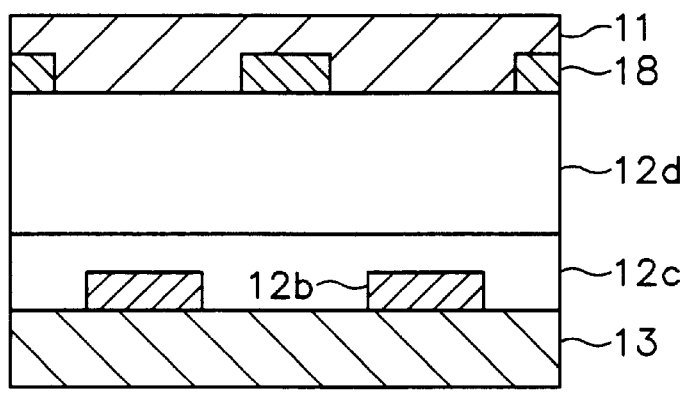
FIG. 19 is a sectional view illustrating an eleventh transfer sheet according to the present invention.

Preparation of the Eleventh Transfer Sheet Shown in FIG. 19

The following constituent materials were mixed to prepare a coating solution:

| | |
|---|---|
| Glass frit (MB-008, manufactured by Matsunami Glass Kogyo K.K.) | 60 parts by weight |
| α-alumina RA-40 (manufactured by Iwatani Kagaku Kogyo K.K.) | 10 parts by weight |
| Dipyroxide Black #9510 (manufactured by Dainichi Seika Kogyo K.K.) | 10 parts by weight |
| Polybutene (200N, manufactured by Nippon Oils & Fats Co., Ltd.) | 25 parts by weight |
| Polybutene (5N, manufactured by Nippon Oils & Fats Co., Ltd.) | 10 parts by weight |

The coating solution was printed in the form of a barrier pattern having a line width of 80 micrometers and a pitch of 220 micrometers on the barrier-forming layer in the laminated structure prepared in Example 18, which consisted essentially of the PET film. The pattern-wise electrode-forming layer, the dielectric layer-forming layer and the barrier-forming layer, by intaglio offset printing as shown in FIG. 22, and dried at 100° C. to form a mask 18 for sand blasting having a thickness of 20 micrometers. Then, a PET film 11 was stuck over the mask 18 to prepare an eleventh transfer sheet according to the present invention.

The PET film on the pattern-wise electrode-forming layer side of the transfer sheet was removed, and the transfer sheet was laminated on a PDP having a primer layer on a glass substrate under the transfer conditions that the preheated substrate temperature was 60° C. and the laminating roll temperature was 120° C., by an auto-cutting laminator (Model ACL-900, manufactured by Asahi Chemical Industry Co., Ltd.) using a heated roll.

Then, the PET film was removed, and the barrier-forming layer was sand-blasted through the mask for sand blasting. After the sand blasting, the mask for sand blasting and the dielectric layer-forming layer were observed. No adverse effect of the sand blasting was recognized in the mask and the layer.

Then, the PDP member thus obtained was fired at a peak temperature of 570° C., thereby simultaneously forming an electrode layer, a dielectric layer and a barrier layer. The electrode layer thus obtained had a thickness of 6±1 micrometers, and the dielectric layer had a thickness of 20 micrometers. The barrier layer had a line width of 60 micrometers and a height of 130 micrometers. The barrier layer included black barriers having a height of 15 micrometers formed by the mask for sand blasting. The height of the barrier layer was uniform, and the surface of the barrier layer was excellent in smoothness. No defect was recognized in any part of the barrier layer.

EXAMPLE 21

Preparation of the Twelfth Transfer Sheet

After the PET film had been removed from the pattern-wise electrode-forming layer side thereof, the tenth transfer sheet prepared in Example 18 was coated by roll coating with the paste for forming a primer-forming layer described in Example 13. The coated paste was dried at 100° C. to form a primer-forming layer having a thickness of 18±2 micrometers. Then, a PE film was laminated on the primer-forming layer to prepare a twelfth transfer sheet according to the present invention.

After the PE film had been removed from the transfer sheet for PDP fabrication prepared as described above, the transfer sheet was laminated on a glass substrate as a PDP member under the transfer conditions that the preheated substrate temperature was 60° C. and the laminating roll temperature was 120° C., by an auto-cutting laminator (Model ACL-900, manufactured by Asahi Chemical Industry Co., Ltd.) using a heated roll.

With the obtained PDP member used, the barrier-forming layer was patterned in the same way as in Example 18. Thereafter, the PDP member was fired at a peak temperature of 570° C., thereby simultaneously forming a primer layer, an electrode layer, a dielectric layer, and a barrier layer.

The thickness of the thus obtained primer layer wad 9±1 micrometers. The thickness of the electrode layer was 6±1 micrometers, and the thickness of the dielectric layer was 20 micrometers. The barrier layer had a line width of 50 micrometers and a height of 120 micrometers. The height of the barrier layer was uniform, and the surface of the barrier layer was excellent in smoothness. No defect was recognized in any part of the barrier layer.

EXAMPLE 22

Preparation of the Thirteenth Transfer Sheet

After the PET film had been removed from the pattern-wise electrode-forming layer side thereof, the eleventh transfer sheet prepared in Example 20 was coated by roll coating with the paste for forming a primer-forming layer described in Example 13. The coated paste was dried at 100° C. to form a primer-forming layer having a thickness of 18±2 micrometers. Then, a PE film was laminated on the primer-forming layer to prepare a thirteenth transfer sheet according to the present invention.

After the PE film had been removed therefrom, the transfer sheet was laminated on a glass substrate as a PDP member under the transfer conditions that the preheated substrate temperature was 60° C. and the laminating roll temperature was 120° C., by an auto-cutting laminator (Model ACL-900, manufactured by Asahi Chemical Industry Co., Ltd.) using a heated roll.

With the obtained PDP member used, the barrier-forming layer was patterned in the same way as in Example 20. Thereafter, the PDP member was fired at a peak temperature of 570° C., thereby simultaneously forming a primer layer, an electrode layer, a dielectric layer, and a barrier layer.

The thickness of the thus obtained primer layer wad 9±1 micrometers. The thickness of the electrode layer was 6±1 micrometers, and the thickness of the dielectric layer was 20 micrometers. The barrier layer had a line width of 60 micrometers and a height of 130 micrometers. The barrier layer included black barriers having a height of 15 micrometers. The height of the barrier layer was uniform, and the surface of the barrier layer was excellent in smoothness. No defect was recognized in any part of the barrier layer.

The first pattern-forming method according to the present invention will be described below by way of Examples 23 to 25.

EXAMPLE 23

Preparation of Transfer Sheet for Barrier-Forming Layer

The following constituent materials were mixed and dispersed in a bead mill using ceramic beads to prepare a coating solution:

| | |
|---|---|
| Glass frit (MB-008, manufactured by Matsunami Glass Kogyo K.K.) | 65 parts by weight |
| α-alumina RA-40 (manufactured by Iwatani Kagaku Kogyo K.K.) | 10 parts by weight |
| Dipyroxide Black #9510 (manufactured by Dainichi Seika Kogyo K.K.) | 10 parts by weight |
| n-butyl methacrylate/2-hydroxyethylhexyl methacrylate copolymer (8/2) | 4 parts by weight |
| Bis-2-ethylhexyl phthalate (boiling point: 390° C.) | 5 parts by weight |
| Dibutyl phthalate (boiling point: 282° C.) | 3 parts by weight |
| Isopropyl alcohol (boiling point: 82° C.) | 10 parts by weight |
| Methyl ethyl ketone (boiling point: 80° C.) | 5 parts by weight |

The coating solution was coated by die coating on a polyethylene terephthalate film (T-type, manufactured by Toray Industries, Inc.) and dried at 120° C. to form a barrier-forming layer having a thickness of 180 micrometers, thereby preparing a transfer sheet. The transfer sheet was slit to the width of a PDP and taken up in a roll form. At this time, there was almost no dust due to separation of the inorganic powder or other material from the transfer sheet.

(Formation of barrier layer)

A PDP member having a primer layer, an electrode layer and a dielectric layer successively formed on a glass substrate was prepared.

The PDP member and the transfer sheet prepared as described above were laid on one another and laminated by a heated roll at 100° C. Thereafter, the base film was removed from the transfer sheet with the barrier-forming layer left, thereby reaching the state as shown in FIG. 24(d).

Then, the PDP member having the barrier-forming layer laminated thereon was held in an oven at 300° C. for 40 minutes. Finally, the PDP member was fired at a peak temperature of 550° C., thereby forming a barrier layer of a PDP.

The barrier layer thus obtained had a line width of 50 micrometers and a height of 120 micrometers. The height of the barrier layer was uniform, and the surface of the barrier layer was excellent in smoothness. No defect was recognized in any part of the barrier layer.

EXAMPLE 24

Preparation of Transfer Sheet

The following constituent materials were mixed and dispersed in a bead mill using ceramic beads to prepare a

| | |
|---|---|
| Glass frit (MB-008, manufactured by Matsunami Glass Kogyo K.K.) | 65 parts by weight |
| α-alumina RA-40 (manufactured by Iwatani Kagaku Kogyo K.K.) | 10 parts by weight |
| Dipyroxide Black #9510 (manufactured by Dainichi Seika Kogyo K.K.) | 10 parts by weight |
| Ethyl cellulose | 4 parts by weight |
| Bis-2-ethylhexyl phthalate (boiling point: 390° C.) | 4 parts by weight |
| Dimethyl phthalate (boiling point: 282° C.) | 8 parts by weight |
| Propylene glycol monomethyl ether (boiling point: 120° C.) | 30 parts by weight | minutes to remove the high-boiling solvent. Thereafter, a negative dry film resist (NCP225, manufactured by Nippon Synthetic Chemical Industry Co., Ltd.) having a protective film was laminated on the barrier-forming layer by using a heated roll at 120° C.

As shown in FIG. 25(a), a line pattern mask having a line width of 80 micrometers and a pitch of 220 micrometers was disposed over the photoresist layer 115 while alignment was carried out. After the photoresist layer 115 had been irradiated with ultraviolet rays (364 nanometers; intensity: 200 $\mu W/cm^2$; dose: 120 $mJ/cm^2$), the protective film was removed from the photoresist layer, and spray development was carried out by using a 1 wt % aqueous solution of sodium carbonate at a temperature of 30° C. Thus, a resist pattern 117 corresponding to the line pattern mask was obtained as shown in FIG. 25(b).

Then, with the resist pattern used as a mask, the barrier-forming layer was subjected to sand blasting at a blast pressure of 1 $kg/cm^2$ using brown fused alumina #800 as an abrasive.

After the sand blasting process, the resist pattern 117 was removed by spraying with a 2 wt % aqueous solution of sodium hydroxide at a temperature of 30° C. After rinsing, the PDP member was dried in an oven at 80° C. for 15

The coating solution was coated by die coating on a polyethylene terephthalate film (T-type, manufactured by Toray Industries, Inc.) and dried at 120° C. to form a barrier-forming layer having a thickness of 180 micrometers, thereby preparing a transfer sheet.

Then, a barrier layer 118 was formed using the above transfer sheet in the same way as in Example 23 except that the PDP member subjected to the transfer process was held in an oven at 200° C. for 20 minutes to remove the high-boiling solvent.

The barrier layer thus obtained had a line width of 50 micrometers and a height of 120 micrometers. The height of the barrier layer was uniform, and the surface of the barrier layer was excellent in smoothness. No defect was recognized in any part of the barrier layer.

EXAMPLE 25

Preparation of Transfer Sheet for Electrode-Forming Layer

The following constituent materials were mixed and dispersed in a bead mill using ceramic beads to prepare a coating solution:

| | |
|---|---|
| Silver powder (average particle diameter: 2 micrometers) | 95 parts by weight |
| Glass frit (bismuth base) | 5 parts by weight |
| Thermoplastic resin (n-butyl methacrylate/2-hydroxyethylhexyl methacrylate = 70/30; average molecular weight: 100,000) | 10 parts by weight |
| Bis-2-ethylhexyl phthalate (boiling point: 390° C.) | 4 parts by weight |

-continued

| | |
|---|---|
| Dibutyl phthalate (boiling point: 282° C.) | 4 parts by weight |
| n-methyl-2-pyrrolidone | 10 parts by weight |

The coating solution was coated by die coating on a polyethylene terephthalate film (50 micrometers) and dried at 120° C. to form an electrode-forming layer having a thickness of 20 micrometers, thereby preparing a transfer sheet.

The transfer sheet was slit to the width of a PDP and taken up in a roll form. At this time, there was no dust due to separation of the inorganic powder or other material from the transfer sheet.

(Formation of electrode-forming layer)

The transfer sheet prepared as described above was laid over a glass substrate preheated at 70° C. and laminated under the transfer conditions that the laminating roll temperature was 100° C. and the pressure was 4 kg/cm$^2$. Thereafter, the base film was removed. Then, the glass substrate having the electrode-forming layer laminated thereon was held in an oven at 300° C. for 40 minutes to remove the high-boiling solvent.

Thereafter, a negative dry film resist (NCP225, manufactured by Nippon Synthetic Chemical Industry Co., Ltd.) having a protective film was laminated on the electrode-forming layer by using a heated roll at 120° C. After a predetermined electrode pattern had been exposed by irradiation with ultraviolet rays (364 nanometers; intensity: 200 $\mu$W/cm$^2$; dose: 120 mJ/cm$^2$), the protective film was removed from the photoresist layer, and spray development was carried out by using a 1 wt % aqueous solution of sodium carbonate at a temperature of 30° C.

Then, with the resist pattern used as a mask, sand blasting was carried out under the conditions that the blast pressure was 1.5 kg/cm$^2$ and the blast rate was 40 g/min. using calcium carbonate (#600) as a blast powder, that is, an abrasive. These sand blasting conditions make it possible to prevent the glass substrate from being undesirably formed into ground glass by sand blasting.

After the sand blasting process, the resist pattern was removed by spraying with a 2 wt % aqueous solution of sodium hydroxide at a temperature of 30° C. After rinsing, the glass substrate was dried in an oven at 80° C. for 15 minutes. Finally, the glass substrate was fired at a peak temperature of 550° C., thereby forming an electrode layer of a PDP.

Thus, an electrode layer was obtained in the form of a silver electrode pattern having a trapezoidal sectional configuration in which the base was 80 micrometers long, the upper side was 75 micrometers long, and the height was 5 micrometers. All the top and side portions of the trapezoidal electrode pattern were flat. Thus, the electrode pattern was excellent in configuration. Moreover, the electrode pattern was superior in the adhesion to the glass substrate and thus had high reliability.

The second pattern-forming method according to the present invention will be described below by way of Examples 26 to 28.

EXAMPLE 26

The following ink materials were mixed and dispersed by using a three-roll mill to prepare a paste for forming an electrode-forming layer:

| | |
|---|---|
| Silver powder (spherical and having an average particle diameter of 1 micrometer) | 70 parts by weight |
| Glass frit (main components: Bi$_2$O$_3$, SiO$_2$, and B$_2$O$_3$; the glass frit having a softening point of 500° C. and a coefficient of thermal expansion $\alpha_{300}$ = 75 × 10$^{-7}$/° C.) | 5 parts by weight |
| Curable resin | 15 parts by weight |
| (Composition of the curable resin: | |
| Polybutyl acrylate | 100 parts by weight |
| Polyoxyethylated trimethylolpropane triacrylate | 60 parts by weight |
| Photo-initiator ("Irgacure 369", manufactured by Ciba Geigy) | 10 parts by weight |
| Toluene | 20 parts by weight) |

The paste for forming an electrode-forming layer was coated on a PET film by comma coating and dried at 100° C. to form an electrode-forming layer having a thickness of 20 micrometers, thereby preparing a transfer sheet for electrode-forming layer.

The transfer sheet for electrode-forming layer was laid over a glass substrate with a primer layer and heated in the form of an address electrode pattern by using a thermal head from the back of the transfer sheet under the printing conditions of, for example, 0.15 mJ/dot and 10 mm/s in print speed. Thereafter, the transfer sheet was delaminated. Thus, an electrode-forming layer in the form of an address electrode pattern was transferred onto the primer layer on the glass substrate.

The glass substrate having the electrode-forming layer formed on the primer layer thereof was fired at a peak temperature of 570° C. After the firing process, an electrode layer having a thickness of 6±1 micrometers and a width of 70 micrometers was obtained.

EXAMPLE 27

An electrode-forming layer in the form of an address electrode pattern was transferred onto a glass substrate with a primer layer in the same way as in Example 26 except that a YAG laser (1,065 nanometers; output: 300 mL/cm$^2$) was used in place of the thermal head as a transfer device in Example 26.

The glass substrate having the electrode-forming layer formed on the primer layer thereof was fired at a peak temperature of 570° C. After the firing process, an electrode layer having a thickness of 6±1 micrometers and a width of 70 micrometers was obtained.

EXAMPLE 28

An electrode-forming layer in the form of an address electrode pattern was transferred onto a glass substrate with a primer layer in the same way as in Example 26 except that the composition of the ink in Example 26 was changed to the following:

| | |
|---|---|
| Silver powder (spherical and having an average particle diameter of 1 micrometer) | 70 parts by weight |
| Glass frit (main components: $Bi_2O_3$, $SiO_2$, and $B_2O_3$; the glass frit having a softening point of 500° C. and a coefficient of thermal expansion $\alpha_{300} = 75 \times 10^{-7}/°$ C.) | 5 parts by weight |
| Carnauba wax | 15 parts by weight |
| Benzyl butyl phthalate | 5 parts by weight |
| Toluene | 15 parts by weight |
| Methyl ethyl ketone | 5 parts by weight |

The glass substrate having the electrode-forming layer formed on the primer layer thereof was fired at a peak temperature of 570° C. After the firing process, an electrode layer having a thickness of 6±1 micrometers and a width of 70 micrometers was obtained.

The third pattern-forming method according to the present invention will be described below by way of Example 29 and Comparative Example 2.

EXAMPLE 29

(Formation of primer-forming layer)

The following constituent materials were mixed and dispersed by using a bead mill to prepare a coating solution:

| | |
|---|---|
| Glass frit {main components: PbO, $SiO_2$, and $B_2O_3$ (non-alkali); the glass frit having a softening point of 570° C., Tg of 480° C., a coefficient of thermal expansion $\alpha_{300} = 83 \times 10^{-7}/°$ C. and an average particle diameter of 1 micrometer and containing particles having a particle diameter not smaller than 20 micrometers in the proportion of 5% by weight} | 65 parts by weight |
| $Al_2O_3$ (having an average particle diameter of 4 micrometers and containing particles having a particle diameter not smaller than 20 micrometers in the proportion of 5% by weight) | 11 parts by weight |
| CuO (having an average particle diameter of 3 micrometers and containing particles having a particle diameter not smaller than 20 micrometers in the proportion of 5% by weight) | 4 parts by weight |
| Poly-n-butyl methacrylate | 14 parts by weight |
| Dibutyl phthalate | 10 parts by weight |
| Isopropyl alcohol | 15 parts by weight |
| Methyl ethyl ketone | 10 parts by weight |

The coating solution was coated on a PET film by roll coating and dried at 100° C. to form an ink layer having a thickness of 20±2 micrometers. The surface of the ink layer formed was excellent in smoothness. A polyethylene film was laminated on the surface of the ink layer to prepare a transfer sheet.

The polyethylene film was removed, and the transfer sheet was laminated on a glass substrate under the transfer conditions that the preheated substrate temperature was 60° C. and the laminating roll temperature was 100° C., by using an auto-cutting laminator (Model ACL-9100, manufactured by Asahi Chemical Industry Co., Ltd.), thereby forming a primer-forming layer.

(Formation of electrode-forming layer)

The following constituent materials were mixed to prepare a coating solution for forming an electrode-forming layer:

| | |
|---|---|
| Photosensitive resin (having the composition stated below) | 20 parts by weight |
| Silver powder (having an average particle diameter of 1 micrometer and containing particles having a particle diameter not smaller than 15 micrometers in the proportion of 5% by weight) | 70 parts by weight |
| Glass frit {main components: $Bi_2O_3$, $SiO_2$, and $B_2O_3$ (non-alkali); the glass frit having a softening point of 600° C., an average particle diameter of 1 micrometer and containing particles having a particle diameter not smaller than 15 micrometers in the proportion of 1% by weight} | 5 parts by weight |
| Propylene glycol monomethyl ether | 20 parts by weight |
| (Composition of the photosensitive resin: | |
| Alkali-development type binder polymer (methyl methacrylate/methacrylic acid copolymer having 7 mol% of glycidyl acrylate added thereto; acid number: 100 mgKOH/g) | 100 parts by weight |
| Polyoxyethylated trimethylolpropane triacrylate | 60 parts by weight |
| Photo-initiator ("Irgacure 369", manufactured by Ciba Geigy) | 5 parts by weight |

The coating solution was coated on a PET film by slit reverse coating to prepare an electrode-forming transfer sheet having an electrode-forming layer with an as-dried thickness of 15 micrometers.

The electrode-forming transfer sheet prepared as described above was laminated at the electrode-forming layer side thereof on the primer-forming layer obtained as described above by using a heated roll at 90° C. The resulting multilayer sheet was irradiated with ultraviolet rays at 100 mJ/cm² from the PET film side through a negative pattern mask for forming address electrodes of a PDP. Thereafter, the PET film was removed, and the electrode-forming layer was developed with a 0.5% aqueous solution of sodium carbonate to remove the unexposed portions.

Next, the whole substrate was fired at 600° C. to form a primer layer having a thickness of 9 micrometers and a stripe-shaped address electrode pattern having a thickness of 6 micrometers and a width of 70 micrometers.

(Method of forming ink layer on raised pattern)

The following constituent materials were mixed and dispersed by using a bead mill to prepare a coating solution:

The coating solution was coated on a PET film by comma coating and dried at 100° C. to form an ink layer with a thickness of 20±2 micrometers. Then, a polyethylene film was stacked on the ink layer.

Then, the polyethylene film was removed, and the transfer sheet for forming a dielectric layer was laminated on the PDP substrate prepared as described above in the direction of the arrow shown in FIG. 28(a) under the transfer conditions that the preheated substrate temperature was 80° C. and the laminating roll temperature was 100° C., by using an auto-cutting laminator (Model ACL-9100, manufactured by Asahi Chemical Industry Co., Ltd.) as shown in FIG. 29, thereby transferring a dielectric layer-forming layer 312 as shown in FIG. 30.

Then, firing was carried out at a peak temperature of 570° C. The thickness of the dielectric layer after the firing process was 10±1 micrometers. A uniform dielectric layer was formed without a transfer failure.

COMPARATIVE EXAMPLE 2

A dielectric layer-forming layer was formed by transfer in the same way as in Example 29 except that the transfer sheet

| | |
|---|---|
| Glass frit {main components; $Bi_2O_3$, ZnO, and $B_2O_3$ (non-alkali); the glass frit having an average particle diameter of 3 micrometers and containing particles having a particle diameter not smaller than 20 micrometers in the proportion of 5% by weight} | 70 parts by weight |
| $TiO_2$ (having an average particle diameter of 4 micrometers and containing particles having a particle diameter not smaller than 20 micrometers in the proportion of 5% by weight) | 3 parts by weight |
| $Al_2O_3$ (having an average particle diameter of 4 micrometers and containing particles having a particle diameter not smaller than 20 micrometers in the proportion of 5% by weight) | 7 parts by weight |
| (the above inorganic particle mixture having a softening point of 570° C., Tg of 485° C. and a coefficient of thermal expansion $\alpha_{300} = 80 \times 10^{-7}/°$ C.) | |
| n-butyl methacrylate/2-hydroxyethylhexyl methacrylate copolymer (8/2) | 10 parts by weight |
| Benzyl butyl phthalate | 7 parts by weight |
| Isopropyl alcohol | 15 parts by weight |
| Methyl ethyl ketone | 5 parts by weight | for forming a dielectric layer was laminated in a direction perpendicularly intersecting the direction of the arrow shown in FIG. 28(a). Unevenness due to mixing of air bubbles appeared in the external appearance of the transferred dielectric layer-forming layer.

Firing was carried out at a peak temperature of 570° C. in the same way as in Example 29. The thickness of the dielectric layer after the firing process ranged from 5 micrometers to 10 micrometers. The external appearance of the dielectric layer after the firing process also had unevenness.

What is claimed is:

1. A plasma display substrate having a transfer sheet, said transfer sheet comprising an ink layer provided on a base film, said ink layer consisting essentially of an inorganic component containing at least a glass frit having a thermal expansion coefficient $\alpha_{300}$ of $60 \times 10^{-7}/°$ C. to $100 \times 10^{-7}/°$ C. and a thermoplastic resin, wherein said ink layer contains 3 to 50 weight parts of thermoplastic resin with respect to 100 weight parts of the inorganic component, and said transfer sheet having an ink layer is detached from said base film after being laminated on a glass substrate from the ink layer side and is fired.

2. A plasma display substrate according to claim 1, wherein said ink layer further contains a plasticizer.

3. A plasma display substrate according to claim 1, wherein said base film and said ink layer are laminated on each other via a detachment layer.

4. A plasma display substrate according to claim 1, wherein a heat-resistant layer is placed on a surface of said base film opposite to the side where the ink layer is provided.

5. A plasma display substrate according to claim 1, wherein said ink layer is an underlayer or an ink layer for forming a dielectric layer.

6. A plasma display substrate having a transfer sheet, said transfer sheet comprising an ink layer provided on a base film, said ink layer consisting essentially of an inorganic component containing at least a glass frit having a thermal expansion coefficient $\alpha_{300}$ of $60 \times 10^{-7}/°$ C. to $100 \times 10^{-7}/°$ C. and a thermoplastic resin, wherein said ink layer contains 3 to 50 weight parts of thermoplastic resin with respect to 100 weight parts of the inorganic component, said transfer sheet comprises a protective film detachably laminated on said ink layer, said transfer sheet is laminated on the glass substrate from the ink layer side after said protective film has been detached, and said base film is detached and said transfer sheet is fired.

7. A plasma display substrate according to claim 6, wherein said ink layer on the transfer sheet and said protective film are laminated on each other via an adhesive layer and said protective film is detachable.

8. A plasma display substrate according to claim 4, wherein said heat-resistant layer comprises one or more of the following:

silicone resin, epoxy resin, melamine resin, phenol resin, fluorocarbon resin, polyimide resin, or hydroxy cellulose.

9. A plasma display substrate according to claim 4, wherein said heat-resistant layer is thermoset.

10. A plasma display substrate according to claim 4, wherein said heat-resistant layer is thermoset by using isocyanate.

* * * * *